(12) United States Patent
Kamiguchi et al.

(10) Patent No.: US 6,495,275 B2
(45) Date of Patent: *Dec. 17, 2002

(54) MULTI-LAYERED THIN-FILM FUNCTIONAL DEVICE AND MAGNETORESISTANCE EFFECT ELEMENT

(75) Inventors: Yuzo Kamiguchi, Yokohama (JP); Akiko Saito, Kawasaki (JP); Katsuhiko Koui, Kawasaki (JP); Masatoshi Yoshikawa, Kawasaki (JP); Hiromi Yuasa, Yokohama (JP); Hideaki Fukuzawa, Sagamihara (JP); Susumu Hashimoto, Ebina (JP); Hitoshi Iwasaki, Yokosuka (JP); Hiroaki Yoda, Kawasaki (JP); Masashi Sahashi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/927,379

(22) Filed: Aug. 13, 2001

(65) Prior Publication Data

US 2002/0009616 A1 Jan. 24, 2002

Related U.S. Application Data

(62) Division of application No. 09/273,496, filed on Mar. 22, 1999, now Pat. No. 6,303,218.

(30) Foreign Application Priority Data

Mar. 20, 1998 (JP) .................................. 10-72822
Jun. 30, 1998 (JP) .................................. 10-185481

(51) Int. Cl.[7] .......................... G11B 5/127; G11B 5/39
(52) U.S. Cl. ..................... 428/692; 428/702; 360/313; 427/131; 427/548

(58) Field of Search ............................ 428/332, 336, 428/692, 694 T, 694 TM, 694 TS, 900, 212, 668, 702; 360/113, 313; 427/488, 492, 493, 131, 569, 548

(56) References Cited

U.S. PATENT DOCUMENTS 5,958,611 A  9/1999  Ohta ........................ 478/692

FOREIGN PATENT DOCUMENTS

| JP | 10-3620 | 1/1998 |
| JP | 10-261209 | 9/1998 |
| JP | 11-8424 | 1/1999 |

OTHER PUBLICATIONS

U.S. patent application Ser. No. 09/332,440, filed Jun. 14, 1999.

U.S. patent application Ser. No. 08/916,396, filed Aug. 22, 1997.

W.F. Egelhoff et al., "Oxygen as a surfactant in the growth of giant magnetoresistance spin valves",. J. Appl. Phys 82(12), pp. 6142–6151, (Dec. 15, 1997).

(List continued on next page.)

Primary Examiner—Stevan A. Resan
Assistant Examiner—Kevin Bernatz
(74) Attorney, Agent, or Firm—Foley & Lardner

(57) ABSTRACT

A magnetoresistance effect element includes a free layer, a pinned layer and a non-magnetic intermediate layer interposed between the free layer and the pinned layer. Additionally, a metal barrier layer is provided adjacent to the first magnetic layer. An electron reflecting layer located adjacent to the metal barrier layer contains at least one selected from oxides, nitrides, carbides, fluorides, chlorides, sulfides and borides.

9 Claims, 30 Drawing Sheets

OTHER PUBLICATIONS

H.J.M. Swagten et al., "Enhanced giant magnetoresistance in spin valves sandwiched between insulating NiO", *Physical Review* B vol. 53, No. 14, pp. 9108–9114, (Apr. 1, 1996–11).

H.J.M. Swagten et al., "Specular Reflection in Spin Valves Bounded by NiO layers", *IEEE Transactions on Magnetics* vol. 34, No. 4, pp. 948–953, (Jul. 1998).

Y. Kamiguchi et al., "Giant magnetoresistance and soft magnetic properties of $Co_{90}Fe_{10}$/cu spin–valve structures", *J. Appl. Phys.* 79(8), pp. 6399–6401, (Apr. 15, 1996).

MULTI-LAYERED THIN-FILM FUNCTIONAL DEVICE AND MAGNETORESISTANCE EFFECT ELEMENT

This is a Divisional Application of Application No. 09/273,496, filed Mar. 22, 1999, now U.S. Pat. No. 6,303,218.

BACKGROUND OF THE INVENTION

This invention relates to a multi-layered thin-film functional device having stacked thin films and magnetoresistance effect element used in a magnetic sensor. In the field of the functional devices such as magnetoresistance effect elements used for magnetic sensors, electronic elements, and so on, there is a powerful stream toward micro-fabrication and high performance. Along with the improvements in vacuum technologies and film-stacking technologies, stacked thin films have come to be often used as functional devices. Conventional technologies of these multi-layered thin-film functional devices are explained below taking a magnetoresistance effect element using a ferromagnetic thin film.

Magnetic resistance effect is the phenomenon that electric resistance changes when a magnetic field is applied to a magnetic body, and it is used in magnetic sensors, magnetic head, or the like. Ferromagnetic thin films of Ni—Fe alloys, for example, are employed in magnetoresistance effect elements (MR elements) for reading external magnetic field signals, utilizing their anisotropic magnetoresistance effects (AMR), i.e., the phenomenon that the electric resistance changes depending upon the positional relation between the current flowing in a magnetic body and the magnetic orientation.

Also remarked recently are magnetoresistance effect films made by alternately stacking ferromagnetic layers and non-magnetic layers in cycles of several nm to several decades of nm. In these multi-layered thin films, electric resistance changes depending upon whether the magnetic orientations of ferromagnetic layers opposed to each other via a non-magnetic layer are parallel or not. This phenomenon is called giant magnetoresistance (GMR), and researches are under progress toward the application of this nature, similarly to the anisotropic magnetoresistance effect, in magnetoresistance effect elements (GMR elements) for reading external magnetic signals.

Additionally, large hopes are placed on the giant magnetoresistance effect because it promises a larger change in resistance than the anisotropic magnetoresistance effect also when the film is thin. There are different types of film structures exhibiting giant magnetoresistance effects. Among them, a film structure of one type represented by Fe/Cr artificial lattice films (Phys. Rev. Lett. 61(1988)2472) and Co/Cu artificial lattice films (J. mag. mag. mater. 94(1991)L1), for example, has an anti-ferromagnetic coupling type magnetic interaction between ferromagnetic layers, and changes in resistance are obtained in response to an external magnetic field to change relative directions of magnetic moments between the ferromagnetic. In a film structure of another type represented by CO/Cu/NiFe artificial lattice films (J. Phys. Soc. Jpn. 60(1991)2827), two or more different ferromagnetic layers are used in a multi-layered film made up of a ferromagnetic layer and a non-magnetic layer, and a difference in coercive force of these ferromagnetic layers to change relative directions of magnetic moments between the magnetic layers and thereby obtain changes in resistance in response to an external magnetic field.

Also proposed is a spin valve structure (for example, NiFe/Cu/NiFe/FeMn film (J. Appl. Phys. 69(1991)4774)) having a sandwich film stacking a ferromagnetic layer, non-magnetic layer and ferromagnetic layer and having a weak magnetic interaction among the magnetic layers, in which the resistance can be readily switched by providing an anti-ferromagnetic layer in contact with one of the ferromagnetic layer so that the exchange anisotropy fixes the magnetic moment of the ferromagnetic layer and by changing the magnetic moment of the other ferromagnetic layer in response to an external magnetic field.

As reviewed above, multi-layered thin-film devices made by stacking very thin layers as thin as 100 nm, approximately, have come to be used as magnetoresistance effect elements and other active elements. In these multi-layered thin-film functional devices, characteristics of active elements often vary due to the inter-diffusion of atoms at boundaries between thin-film layers, and thermal stability of their characteristics is an important issue for their practical use.

SUMMARY OF THE INVENTION

It is therefore an object of the invention to provide a multi-layered thin-film functional device having an functional layer made by stacking a plurality of thin films, which is improved in thermal stability and long-term reliability by suppressing inter-diffusion of atoms among the thin-film layers in the functional layer.

Another object of the invention is to provide a magnetoresistance effect element which is improved by thermal stability and long-term reliability by suppressing inter-diffusion of atoms at a ferromagnetic layer and a non-magnetic layer in the magnetoresistance effect element.

Another object of the invention is to provide a magnetoresistance effect element having excellent magnetoresistance effect characteristics and other various magnetic characteristics and having excellent thermal resistance by well maintaining the function of an electron reflecting layer made to exist in a spin valve film, effectively preventing adverse influences to magnetic characteristics based thereon, and preventing defective fabrication of the layer itself; provide a method for manufacturing such magnetoresistance effect elements with a good reproducibility; and provide a magnetoresistance effect element stably operable as a magnetic head, for example.

According to the one aspect of the invention, a multi-layered thin-film functional device including a base crystal layer, a crystal growth controlling layer formed on said base crystal layer, and a functional layer made up of a plurality of thin-film layers formed on said crystal growth controlling layer, said crystal growth controlling layer containing a compound of at least one element selected from O, N, C, F, B and S, said base crystal layer having a thickness not thicker than 15 nm, and the roughness of the boundary between said crystal growth controlling layer and said functional layer being not larger than 1.5 nm is provided.

According to the another aspect of the invention, a magnetoresistance effect element having a magnetoresistance effect film which includes a crystal growth controlling layer as one of films therein, characterized in that a roughness along a boundary between films overlying said crystal growth controlling layer is smaller than a roughness along a boundary between films underlying said crystal growth controlling layer is also provided.

The inventors found that the thermal instability was caused by the inter-diffusion of the atoms and that the such a diffusion is enhanced by the bulkiness of the grain size of the layers of the functional device. FIG. 24 schematically shows the bulkiness of the grains. According to the invention, such a bulkiness is prevented by employing the crystal growth controlling layer.

According to the another aspect of the invention, a magnetoresistance effect element comprising a first magnetic layer (free layer) susceptible in magnetization to an external magnetic field, a second magnetic layer (pinned layer) substantially pinned in magnetization, and a non-magnetic intermediate layer interposed between said first magnetic layer and said second magnetic layer, characterized in further comprising a metal barrier layer provided adjacent to said first magnetic layer, and a fourth layer (electron reflecting layer) located adjacent to said metal barrier layer and containing at least one selected from oxides, nitrides, carbides, fluorides, chlorides, sulfides and borides is also provided.

According to the another aspect of the invention, a magnetoresistance effect element comprising a first magnetic layer susceptible in magnetization to an external magnetic field, a second magnetic layer substantially pinned in magnetization, and a non-magnetic intermediate layer interposed between said first magnetic layer and said second magnetic layer, said second magnetic layer including a third layer (electron reflecting layer) containing at least one selected from oxides, nitrides, carbides, fluorides, chlorides, sulfides and borides is also provided.

According to the another aspect of the invention, a magnetoresistance effect element comprising a second magnetic layer substantially pinned in magnetization, a non-magnetic intermediate layer formed on top surface of said second magnetic layer, a first magnetic layer formed on top surface of said non-magnetic layer and susceptible in magnetization to an external magnetic field, and a third layer formed on top surface of said first magnetic layer and containing at least one selected from oxides, nitrides, carbides, fluorides, chlorides, sulfides and borides is also provided.

According to the another aspect of the invention, a magnetoresistance effect element comprising a magnetic metal base layer, a metal barrier layer formed on said magnetic metal base layer, a first magnetic layer made on said metal barrier layer and susceptible in magnetization to an external magnetic field, a non-magnetic intermediate layer made on said first magnetic layer, and a second magnetic layer made on said non-magnetic intermediate layer and substantially pinned in magnetization is also provided.

According to the another aspect of the invention, a method for manufacturing a magnetoresistance effect element which includes a first magnetic layer susceptible in magnetization to an external magnetic field, a second magnetic layer substantially pinned in magnetization, and a non-magnetic intermediate layer interposed between said first magnetic layer and said second magnetic layer, and a electron reflecting layer located closer to at least one of said first and second magnetic layers or inside one of said first and second magnetic layers and including a metal compound, comprising the steps of making said electron reflecting layer while irradiating at least one of radicals, ozone and light.

According to the another aspect of the invention, a fabricating machine for manufacturing a magnetoresistance effect element which includes a first magnetic layer susceptible in magnetization to an external magnetic field, a second magnetic layer substantially pinned in magnetization, and a non-magnetic intermediate layer interposed between said first magnetic layer and said second magnetic layer, and a electron reflecting layer located closer to at least one of said first and second magnetic layers or inside one of said first and second magnetic layers and including a metal compound, comprising the means for making said electron reflecting layer while irradiating at least one of radicals, ozone and light.

Electric resistance of a multi-layered film of two different kinds of metals varies with the inter-diffusion of atoms at the boundary. The inter-diffusion of atoms at the boundary between a magnetic layer and a non-magnetic layer also causes a decrease in magnetic volume of the magnetic layer and hence decreases the magnitude of the magnetization. On the other hand, in elements utilizing the giant magnetoresistance effect, spin-dependent scattering of electrons along the boundary between a ferromagnetic layer and a non-magnetic layer is essentially important for the magnetoresistance effect. In these GMR elements, inter-diffusion of atoms at the boundary between the ferromagnetic layer and the non-magnetic layer directly affects the magnetoresistance changing ratio, and the magnetoresistance changing ratio is significantly decreased by inter-diffusion of atoms.

As discussed above, multi-layered thin-film functional devices stacking very thin layers as thin as approximately 100 nm involve the problem that characteristics of the active element are liable to vary due to inter-diffusion of atoms at the boundary between the thin-film layers. Especially in GMR elements, inter-diffusion of atoms at the boundary of a ferromagnetic layer and a non-magnetic layer largely decrease the magnetoresistance changing ratio.

The multi-layered thin-film functional device and the magnetoresistance effect element according to the invention alleviate inter-diffusion of atoms between thin-film layers in the functional layer such as magnetoresistance effect film, therefore greatly improve the thermal stability, and increase the long-term reliability. Especially the magnetoresistance effect film can realize thermal stability excellent in MR changing ratio.

Additionally, the invention can maintain the function of a diffusion preventing electron reflection layer provided in a multi-layered film such as spin valve film and can thereby remove adverse affection to the magnetic characteristics. Therefore, the invention can provide a magnetoresistance effect element having good magnetoresistance effect characteristics and other various magnetic characteristics, and excellent in thermal resistance.

Furthermore, according to the invention, since uniform and dense diffusion preventing electron reflection layers with smooth boundaries and large mirror reflection effects can be made with a good reproducibility, the invention can provide a manufacturing method capable of stably manufacturing high-performance magnetoresistance effect elements excellent in thermal.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

In FIG. 53, Numeral 136B denotes an ozone source 135B, an ozone irradiating chamber 136B and an ozone guide tube 137B;

DETAILED DESCRIPTION OF THE PREFERRED EMBODIMENTS

Embodiments of the invention are explained below.

Figure 1:
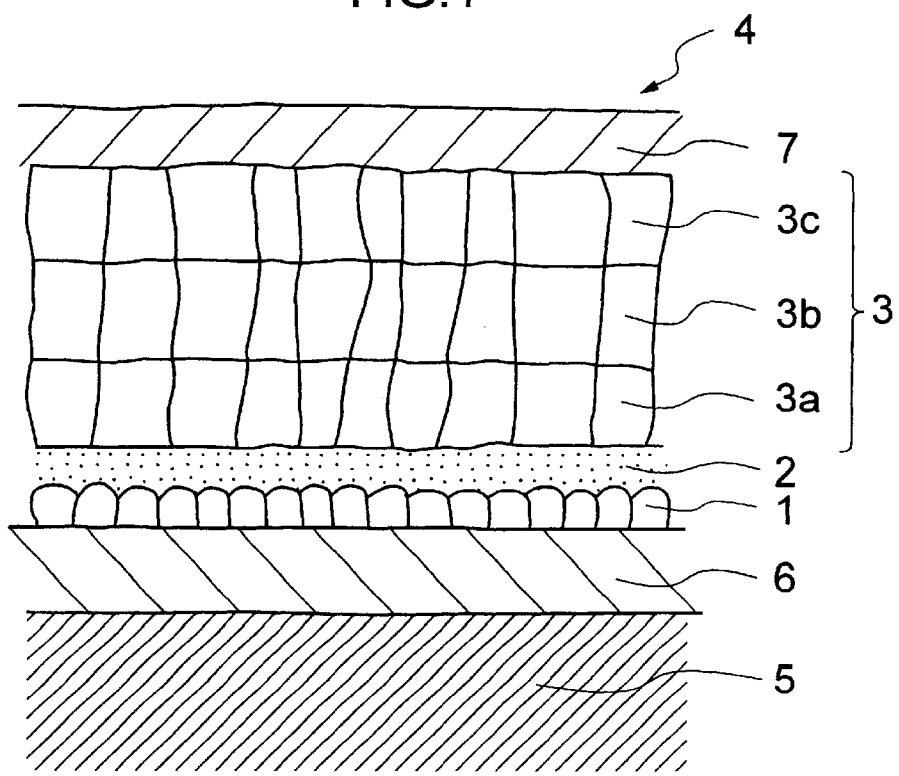
FIG. 1 is a diagram schematically showing the basic construction of a multi-layered thin-film functional device according to the invention.

FIG. 1 is a diagram schematically showing the basic construction of a multi-layered thin-film functional device according to the invention. In FIG. 1, reference numeral 1 denotes a base crystal layer. Made on the base crystal layer 1 via a crystal growth control layer 2 is an functional layer 3 made up of a plurality of stacked functional thin films 3a, 3b, 3c, . . . . These are basic elements of a multi-layered thin-film functional device 4. There is no particular limitation regarding the number of functional thin films 3a, 3b, 3c, . . . , and effects of the invention are ensured provided that the functional layer 3 is made up of at least two layers which possibly degrades in characteristics due to inter-diffusion of atoms at the boundary between thin-film layers.

The base crystal layer 1 may has either a single-layered structure or a multi-layered structure including two or more layers. When the base crystal layer 1 is multi-layered, the layers are preferably lattice-matched, and more preferably have an identical crystalline structure. The base crystal layer 1 has the role of controlling the crystal grain size, crystalline orientation, etc. of the functional layer 3, and its material is selected appropriately depending upon the functional layer 3. When the orientation control of the functional layer 3 relies on the base crystal layer 1, a material in lattice matching with the functional layer 3 (especially the first functional thin film 3a in contact with the crystal growth controlling layer 2) is preferably selected as the material of the base crystal layer 1.

The base crystal layer 1 has a thickness (total thickness in case of a multi-layered film) not thicker than 15 nm. As explained before, the crystal grain size if the base crystal layer 1 must be maintained small for controlling the crystal grain size of the functional layer 3. If the crystal grain size of the base crystal layer 1 is large, the crystal grains become bulky as stacking of the functional layer 3 progresses, and it may invite inter-diffusion of atoms between layers. Therefore, for the purpose of maintaining uniform and relatively small crystal grain size during initial growth of the base crystal layer 1, the thickness of the base crystal layer 1 is determined as 15 nm. Thickness of the base crystal layer 1 is more preferably not thicker than 10 nm. From the viewpoint of ensuring the function of the base crystal layer 1, its thickness is preferably 0.2 nm or more.

Mean crystal grain size of the base crystal layer 1 is preferably 30 nm or less. In order to prevent formation of bulky crystal grains of the functional layer 3, it is important to ensure relatively small crystal grain size of the base crystal layer 1, and better thermal stability was obtained by an experiment when the mean crystal grain size of the base crystal layer 1 is 30 nm or less. The mean crystal grain size of the base crystal layer 1 is more preferably 10 nm or less.

The base crystal layer 1 is preferably made on a smooth surface. When the base crystal layer 1 is directly made on the substrate 5, used as the substrate 5 is a smooth substrate represented by glass, Si, GaAs, $Al_2O_3$, MgO, $SrTiO_3$, thermal oxide Si ($Si/SiO_2$, Sic, TiC or sintered materials of $Al_2O_3$—TiC.

Alternatively, a buffer layer 6 may be made to improve the smoothness and to make the base crystal layer 1 on the buffer layer 6. It is important to grow the base crystal layer 1 as the start layer for crystal growth of the crystal structure. Therefore, if an amorphous layer is used as the buffer layer 6, or the buffer layer 6 is made to be in lattice mismatching, it is preferably a crystal layer of Ta, Ti, Cr, or the like, exhibiting good wettability. By making the base crystal layer 1 on the buffer layer 6 made of an amorphous layer or a smooth crystal layer out of lattice-matching and having a good wettability, the base crystal layer 1 less variable, uniform crystal grain size can be obtained. Usable as the buffer layer 6 are W, Mo, Zr, Nb and V for example, in addition to Ta, Ti and Cr.

The crystal growth controlling layer 2 formed on the base crystal layer 1 is made of a compound of at least one of elements forming the base crystal layer 1, at least one element selected from transitional metals such as Ti, V, Cr, Mn, Fe, Co, Ni, Cu, Zr, Nb, Mo, Ru, Rh, Pd, Ag, Hf, Ta, W, Re, Os, Ir, Pt and Au, and at least one element selected from O, N, C, F, B and S.

By using the crystal growth controlling layer 2 in which those compounds make an appropriate network on the base crystal layer 1, the crystal growth of the base crystal layer 1 can be once stopped, and information on the crystal growth of the base crystal layer 1 (in formation on its crystal grain size, crystallographic orientation, etc.) can be given to the functional layer 3. In the case where the crystal growth controlling layer 2 cannot transmit information on the crystal growth, etc. of the base crystal layer 1 to the functional layer 3 merely by stopping the crystal growth of the base crystal layer 1, or cannot stop the crystal growth of the base crystal layer 1, it cannot be prevented that crystal grains in the functional layer 3 become bulky (caused by the movements of crystal grain boundaries) and, accordingly, that inter-diffusion of atoms occurs at the boundaries.

The crystal growth controlling layer 2 preferably contains at least one element selected from O, N, C, F, B and S by 4 atomic % or more. If the content of at least one element selected from O, N, C, F, B and S is less than 4 atomic %, then the crystal growth controlling layer 2 might lose part of its function. If the crystal growth controlling layer contains a transition metal, its content is preferably 30 atomic % or more. If the content of the transition metal less than 30 atomic %, the crystal growth controlling layer 2 might here again lose part of its function. The above-mentioned contents of respective elements are based on component analysis of 1 nm spot size. This is because the crystal growth controlling layer 2 is thin.

Figure 2:
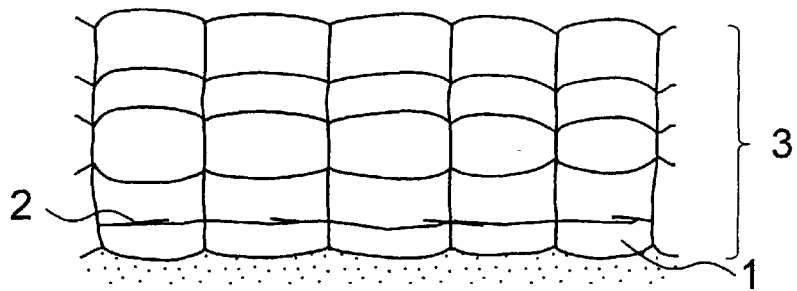
FIG. 2 schematically shows the bulkiness of the grain size in both the base crystal layer 1 and the functional layer.

Thickness of the crystal growth controlling layer 2 is preferably within the range from 0.2 to 2 nm. If the thickness of the crystal growth controlling layer 2 is less than 0.2 nm, it cannot reliably stop the crystal growth of the base crystal layer 1, and the base crystal layer 1 will become liable to be affected by crystal growth of the functional layer 3, which will cause bulkiness of the grain size in both the base crystal layer 1 and the functional layer. FIG. 2 schematically shows this aspect.

However, the range of the optimum thickness slightly moves depending upon its material, and it is preferably selected from the range between 0.2 nm and 3 nm. Especially when a crystallographic crystal growth controlling layer is used, this range is preferable.

Figure 3:
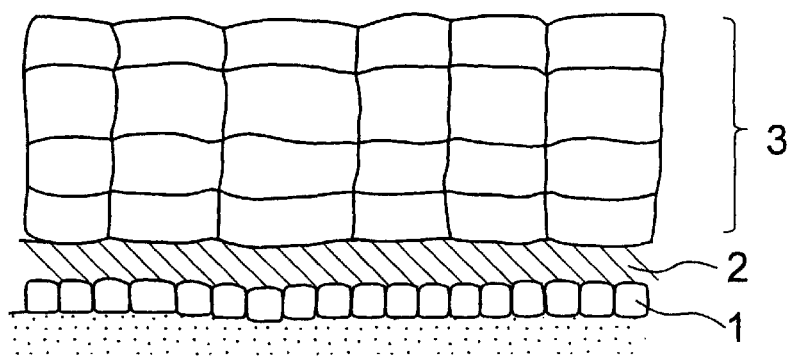
FIG. 3 schematically shows the bulkiness of the grain size.

If the thickness of the crystal growth controlling layer 2 exceeds 2 nm, it cannot hold information on crystal grains of the base crystal layer 1 nor transmit it to the functional layer 3. Here again, this invites bulkiness of crystal grains. FIG. 3 schematically shows this aspect.

Although the optimum range of the thickness of the crystal growth controlling layer 2 depends on the base crystal layer 1 and the functional layer 3 (especially, its first functional thin film 3a), it preferably has a thickness between 0.5 nm and 1.5 nm.

Briefly explained is the relationship between thickness of the crystal growth controlling layer 2 and thermal stability of the characteristics of the multi-layered thin-film functional device 4, taking a magnetoresistance effect element as an example. The magnetoresistance effect thin film as the functional layer 3 was made by using a spin valve film with a Co—Fe alloy (3 nm)/Cu(3 nm)/Co—Fe alloy (3 nm)/Ir—Mn alloy (5.5 nm) structure, which is made on the laminated structure including an amorphous CoZrNb buffer layer 6 (5 nm)/$Ni_{80}Fe_{20}$ base crystal layer 1 (2 nm)/the crystal growth controlling layer 2 (whose thickness is t nm) containing Fe oxide, and by further making a 5 nm thick Ta protective coat on the spin valve film.

Figure 4:
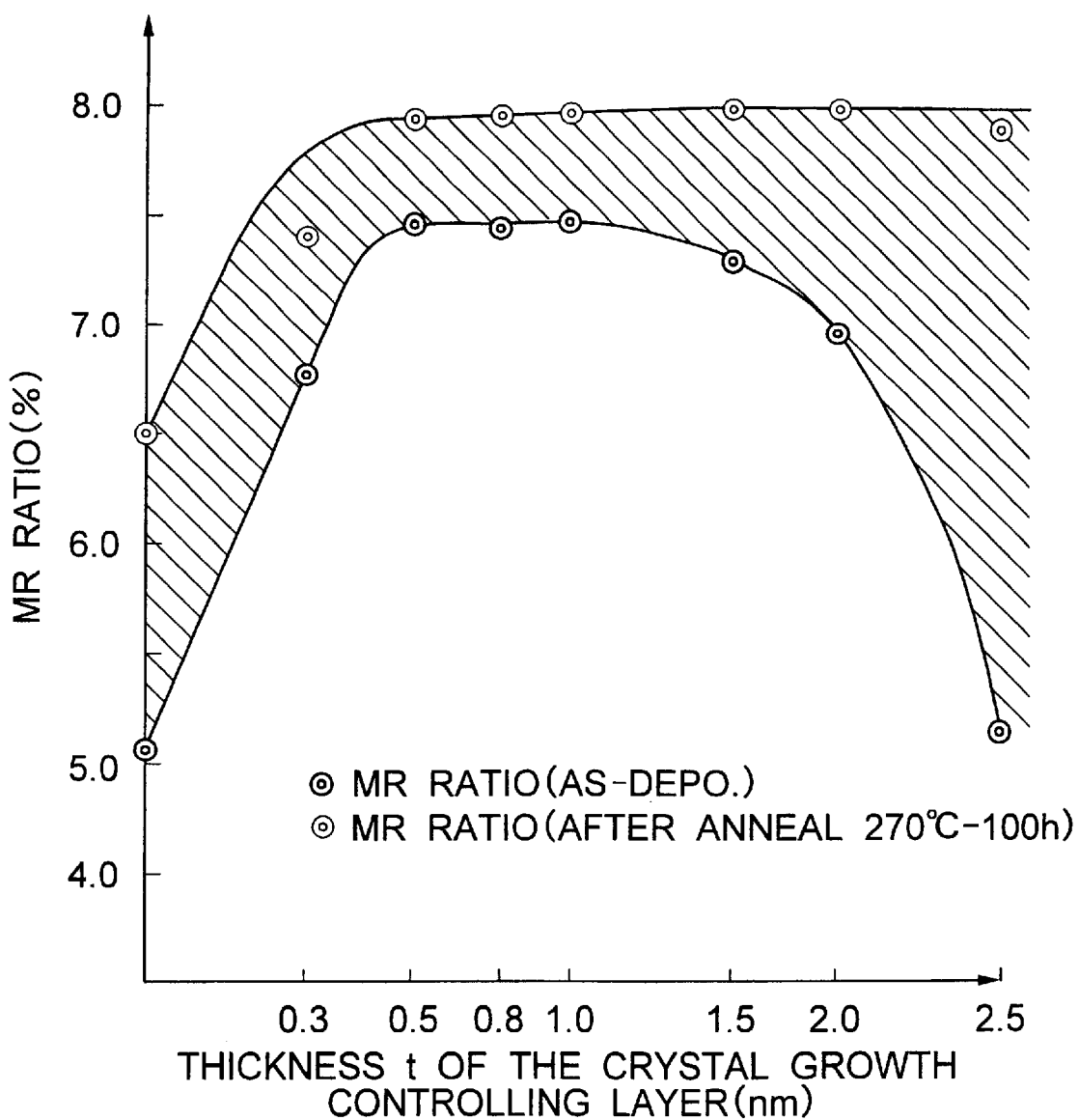
FIG. 4 shows a relation between thickness t (nm) of the crystal growth controlling layer 2 and MR ratio before and after annealing.

FIG. 4 shows a relation between thickness t (nm) of the crystal growth controlling layer 2 and MR ratio before and after annealing. Here is confirmed that, when the crystal growth controlling layer 2 is as thin as less than 0.2 nm or as thick as more than 2 nm, characteristics are largely deteriorated (the MR ratio is decreased) by annealing. It is also confirmed that thickness of the crystal growth controlling layer 2 is preferably selected especially within the range from 0.5 to 1.5 nm.

However, the range of the optimum thickness slightly moves depending upon its material, and it is preferably selected from the range between 0.5 nm and 3 nm. Especially when a crystallographic crystal growth controlling layer is used, this range is preferable.

Roughness of the boundary between the crystal growth controlling layer 2 and the functional layer 3 (more specifically, its first functional thin film 3a) is reduced to 1.5 nm or less. By making the boundary roughness between the crystal growth controlling layer 2 and the functional layer 2 as small as 1.5 nm or less, that is, by smoothening the boundary between the crystal growth controlling layer 2 and the functional layer 3, information on crystal growth of the base crystal layer 1 (crystal grains size, crystallographic orientation, etc.) can be effectively transmitted to the functional layer 3.

In the case of making a multi-layered film by stacking a plurality of layers in substantial lattice matching, provided their thicknesses being around 100 nm or less, unevenness along boundaries between stacked layers progressively increases as the layers are stacked. This tendency is prominent in multi-layered films in which individual layers have a crystal structure and their thicknesses are around 1 to 30 nm, respectively. Further, it appears prominently especially when the films are made by sputtering.

Regarding multi-layered films exhibiting giant magnetoresistance effect (GMR), the Inventors found that increased film unevenness referred to above largely affects the magnetic characteristics, causes inter-diffusion of atoms at the stacking boundaries, and hence invites serious deterioration of the device characteristics, and that smoothing the unevenness by interposing a crystal growth controlling layer is greatly effective for preventing deterioration. That is, by inserting a crystal growth controlling layer in one of boundaries of stacked films to remove unevenness of its underlying stacked films, its overlying stacked films are reduced in film unevenness, and deterioration in magnetic characteristics and inter-diffusion of atoms at boundaries between stacked films (above the crystal growth controlling layer) can be prevented. In this manner, by smoothing film unevenness by insertion of a crystal growth controlling layer, it is ensured to prevent deterioration of the magnetic characteristics and to realize a multi-layered thin-film functional device structure with a higher thermal stability against atomic diffusion. To effectively compensate roughness of the boundary with the underlying layer and improve the smoothness, the crystal growth controlling layer preferably contains a compound which contains at least one element selected from O, N, C, F, B and S, smaller in atomic radius than upper and lower layers thereof.

In order to reduce the boundary roughness between the crystal growth controlling layer 2 and the functional layer 3, it is certainly important to make the base crystal layer 1 on a smooth surface. However, the boundary roughness between the crystal growth controlling layer and the functional layer 3 can be reduced also when the crystal growth controlling layer, itself, buries the unevenness on the surface of the base crystal layer 1. In this manner, by burying the unevenness along the surface of the base crystal layer 1 with the crystal growth layer 2 itself, the boundary roughness between the crystal growth controlling layer 2 and the functional layer 3 can be reduced smaller than the boundary roughness between the base crystal layer 1 and the crystal growth controlling layer 2.

The above-explained function of the crystal growth controlling layer 2 is more effectively attained by making the crystal growth controlling layer 2 as a layer containing a compound of at least one element selected from O, N, C, F, B and S smaller in atomic radius than component elements of the upper and lower layers 1 and 3 (a layer with a lower density than the upper and lower layers 1 and 3). By reducing the boundary roughness between the crystal growth controlling layer and consequently reducing the unevenness on boundaries between stacked films within the functional layer 3, inter-diffusion of atoms can be prevented more effectively.

Figure 5:
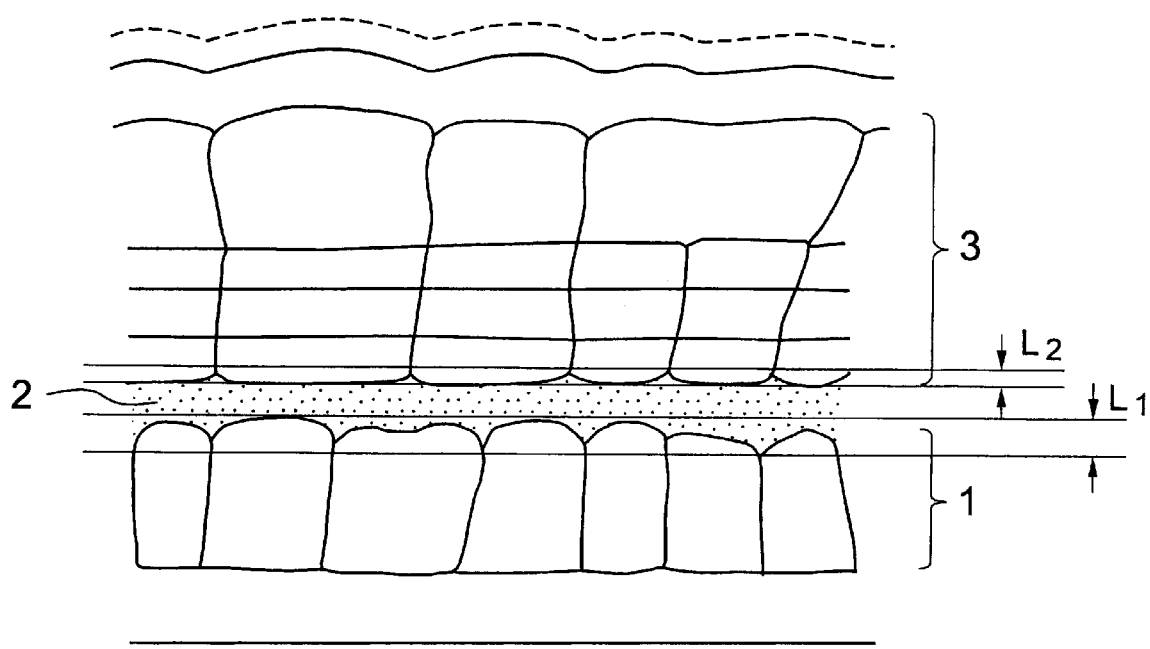
FIG. 5 schematically shows the definition of the terms "boundary roughness" used in the specification.

The terms "boundary roughness" used in the specification pertains to difference between the maximum height and the minimum height at each boundary as shown in FIG. 5. Here, L1 represents the boundary roughness between the base crystal layer 1 and the crystal growth controlling layer 2 whereas L2 represents the boundary roughness between the crystal growth controlling layer 2 and the functional layer 3. The definition is different from "mean roughness Ra" which will be explained later.

Here is briefly explained how the boundary roughness between the crystal growth controlling layer 2 and the functional layer 3 affects the thermal stability in characteristics of the multi-layered thin-film functional device 4, taking a magnetoresistance effect element as an example. the following three kinds of spin valve structures were made in the magnetoresistance effect film as the functional layer 3.

Type A: Co—Fe (3 nm)/Cu (3 nm)/Co—Fe (2 nm)/Ir—Mn (5.5 nm);

Type B: Co—Fe (3 nm)/Cu (3 nm)/Co—Fe (2 nm)/Ir—Mn (8 nm); and

Type C: Co—Fe (1 nm)/Cu (2.5 nm)/Co—Fe (2 nm)/Ir—Mn (12 nm). These multi-layered structures were made on the base crystal layer 1 having formed the crystal growth controlling layer 2. Detailed film structures as shown in Table 1. Table 1 shows deterioration ratios in MR ratio of these various types of samples of the magnetoresistance effect element before and after annealing.

As apparent from Table 1, excellent heat resistance is obtained when the boundary roughness between the crystal growth controlling layer 2 and the functional layer 3 is 1.5 nm or less. The boundary roughness between crystal growth controlling layer 2 and the functional layer 3 reduced as small as 1.5 nm can be obtained effectively by the crystal growth controlling layer 2 burying the unevenness along the surface of the base crystal layer 1, that is, by reducing the boundary roughness between the crystal growth controlling layer 2 and the functional layer 3 smaller than the boundary roughness between the base crystal layer 1 and the crystal growth controlling layer 2.

The functional layer 3 made on the crystal growth controlling layer 2 is selected appropriately to meet the purpose of the multi-layered thin-film functional device 4. For example, if the multi-layered thin-film functional device 4 is used as a magnetoresistance effect element, then a multi-layered film having a magnetoresistance effect function, such as spin valve film or artificial lattice film, is employed as the functional layer 3. If the multi-layered thin-film functional device 4 is used to function as a wiring, then a multi-layered film of various metals or alloys is used as the functional layer 3. In FIG. 1, reference numeral 7 denotes a protective coat which may be made, where appropriate.

In the case where the crystal growth controlling layer 2 is made on the base crystal layer 1 and the functional layer 3 is made thereon, grain size, crystallographic orientation, etc. of the base crystal layer 1 large effect the crystal growth of the functional layer, as already explained above. However, if the first functional thin film 3a in the multi-layered functional layer 3 in direct contact with the crystal growth controlling layer 2 is excessively thick, there arises the possibility that the nature of the base crystal layer 1 is not reflected sufficiently in the crystal growth of the functional layer 3, and control of the crystal growth of the functional layer 3 through control of the base crystal layer 1 is not realized sufficiently.

Taking it into consideration, the first functional thin film 3a of the functional layer 3 is preferably a crystal layer not thicker than 30 nm. Under the condition, the crystal growth of the first functional thin film 3a in the functional layer 3 can be controlled effectively by the base crystal layer 1, and hence, the growth control of the entire functional layer 3 in contact therewith can be controlled well. That is, when the crystal growth controlling layer 2 holds information on crystal growth of the base crystal layer 1 with a relatively small crystal grain size, the first functional thin film 3a grown on the crystal growth controlling layer 2 can realize a relative small crystal grain size. This effect is especially enhanced when the base crystal layer 1 and the functional layer (particularly, the first functional thin film 3a) are lattice-matching systems. Furthermore, the base crystal layer 1 and the first functional thin film 3a of the functional layer 3 are preferably identical in crystalline structure and crystallographic orientation. The first functional thin film 3a is more preferably as thin as 10 nm or less.

As explained above, by interposing the crystal growth controlling layer 2 between the base crystal layer 1 and the functional layer 3, while setting the thickness of the base crystal layer 1 to 15 nm or less, and reducing the boundary roughness between the crystal growth controlling layer 2 and the functional layer 3 to 1.5 nm or less, it is possible to once stop the crystal growth of the base crystal layer 1 to maintain crystal grains in the base crystal layer 1 as small as 30 nm or less, for example, in terms of mean crystal grain size, and to efficiently transmit information on the crystal growth of the base crystal layer 1, for example, to the functional layer 3.

Therefore, movements of grain boundaries of the functional layer 3 are constrained by the boundary with the crystal growth controlling layer 2, and bulkiness of the crystal grains in the functional layer 3 is prevented responsively. In this manner, prevention of bulky crystal grains from being made in the functional layer 3 leads to prevention of boundaries liable to invite atomic diffusion, reduction of inter-diffusion of atoms at these boundaries, and significant improvement of the thermal stability of the multi-layered thin-film functional device 4. That is, a multi-layered thin-film functional device 4 excellent in long-term reliability can be realized.

Next explained is a concrete structure of the multi-layered thin-film device 4 in which the functional layer 3 has a magnetoresistance effect function.

As a concrete example of the functional layer 3 having a magnetoresistance effect function, here is taken a magnetoresistance effect film made by alternately stacking a ferromagnetic material and a non-magnetic material, that is, having a structure of "ferromagnetic layer/(non-magnetic layer/ferromagnetic layer)$_n$: where 1<n)".

Usable as the ferromagnetic material in the magnetoresistance effect film are: single-body metals such as Co, Ni, Fe, alloys and inter-metallic compounds such as Co—Fe alloy, Ni—Fe alloy, Co—Ni alloy, Co—Ni—Fe alloy, and Ni—Mn—Sb. They can be adjusted in lattice constant to optimize lattice matching with the non-magnetic layer, or adjusted in coercive force, soft magnetic characteristics, magnetic distortion, and so on, by adding appropriate elements by 20 atomic % or less.

Usable as the non-magnetic material are: for example, non-magnetic metals such as Au, Ag, Cu, Pd, Pt, Ru, Ir, Rh, Hf and Zr, and non-magnetic alloys made from these metals by adding appropriate elements by 50 atomic %. If ferromagnetic layers and non-magnetic layers do not get into good lattice matching, electron scattering will increase due to lattice distortion at their boundaries, and MR ratio will decrease. Therefore, it is effective to adjust the lattice constant of the ferromagnetic layers to optimize the lattice matching with the non-magnetic layers by adding elements by an amount not more than 20 atomic %.

Exemplary structures of the functional layer 3 including a ferromagnetic material and a non-magnetic material stacked alternately are: for example, artificial lattice films made by stacking them at an artificial period producing anti-ferromagnetic inter-layer coupling between the ferromagnetic layers, magnetoresistance effect films utilizing a difference in coercive force between two kinds of ferromagnetic layers, and magnetoresistance effect films including anti-ferromagnetic layers in contact with ferromagnetic layers and having a spin valve structure fixing magnetization of the ferromagnetic layers in contact with the anti-ferromagnetic layers by exchange biasing (magnetic direction does not change in an external magnetic field smaller than the exchange biasing magnetic field).

Usable as magnetoresistance effect films having anti-ferromagnetic inter-layer coupling between ferromagnetic layers are: Co/Cu/Co artificial lattice films, Ni—Fe/Cu/Ni—Fe artificial lattice films, and Fe/Cr/Fe artificial lattice films, for example. Usable as magnetoresistance effect films utilizing a difference in coercive force are: Ni—Co—Fe/Cu/Ni—Fe artificial lattice films and Co—Fe/Cu/Ni—Fe, for example. Usable as magnetoresistance effect films are: Ni—Fe/Cu/Ni—Fe/Ni—Fe, Ni—Fe/Co/Cu/Co/Ni—Fe/Ni—Fe, and Co—Fe/Cu/Co—Fe/Ir—Mn, for example.

In the multi-layered thin-film functional device 4 according to the invention, the crystal growth controlling layer 2 as thick as approximately 0.2 to 2 nm is formed on the base crystal layer 1 as thick as 15 nm or less (preferably as thick as 0.2 nm or more), and the functional layer 3 having the above-explained magnetoresistance effect function is formed on the crystal growth controlling layer 2, as explained before.

The base crystal layer 1 can be made on the buffer layer 6. In this case, the buffer layer may be made of a metal with a high wettability, such as Ta, Ti and Cr, an amorphous metal such as CoZrNb, CoZrTa and CoB, or an amorphous oxide such as $SiO_x$ and $Al_2O_3$, for example.

The base crystal layer 1 is preferably selected from a material lattice-matching with the first thin film 3a of the functional layer 3. For example, when a Co/Cu/Co artificial lattice film or a magnetoresistance effect film, such as Ni—Co—Fe/Cu/Ni—Fe, Ni—Fe/Cu/Ni—Fe/Fe—Mn or Co—Fe/Cu/Co—Fe/Ir—Mn, as the functional layer, since the first thin film 3a of the functional layer 3 has a fcc (face-centered cubic) structure, the base crystal layer 1 is preferably made of a material with a composition having a fcc structure and lattice-matching therewith among Fe, Ni—Fe alloys, Ni—Co—Fe alloys, and so forth.

In the case where a magnetoresistance effect film such as Fe/Cr/Fe artificial lattice film is used as the functional layer 3, since the first thin film 3a of the functional layer 3 has a bcc (body-centered cubic) structure, the base crystal layer 1 is preferably made of a material with a composition having a bcc structure and lattice-matching therewith among Fe, Ni—Fe alloys, Ni—Co—Fe alloys, and so forth. Provided that the base crystal layer 1 gets in lattice matching with the first thin film 3a of the functional layer 3, the material used as the base crystal layer 1 may have any of a bcc structure or the opposite structure when the first thin film 3a has a fcc structure.

The crystal growth controlling layer 2 contains a compound of at least one of component elements of the base crystal layer 1 and one or more kinds of elements selected from O, N, C, F, B and S. If the base crystal layer 1 is made of Ni, an example of the crystal growth controlling layer 2 is made of Ni and a Ni oxide. When the base crystal layer 1 is made of a Ni—Fe alloy, an example of the crystal growth controlling layer 2 is made up of a Ni—Fe alloy, Ni oxide and Fe oxide, containing the Fe oxide by 20 atomic % or more. When the base crystal layer 1 is made of a Co—Ni alloy, the crystal growth controlling layer 2 may be made of a Co—Ni alloy, Ni oxide and Co oxide, containing the Co oxide by 20 atomic %. When the base crystal layer 1 is made of a Ni—Co—Fe alloy, the crystal growth controlling layer 2 may contain a Fe oxide, Co oxide and CoB compound as its major components.

The multi-layered thin-film functional device 4 whose functional layer 3 has a magnetoresistance effect function, namely the magnetoresistance effect element, can reduce atomic diffusion (the diffusion along the grain boundaries) at boundaries by prevention of bulky crystal grains in the functional layer 3. More specifically, it is possible to reduce atomic diffusion (the diffusion along the grain boundaries) at boundaries within the magnetoresistance effect film as the functional layer 3, that is, inter-diffusion of atoms at boundaries between ferromagnetic layers and non-magnetic layers. Therefore, it is possible to prevent a decrease in MR ratio caused by atomic diffusion, or the like, at boundaries between ferromagnetic layers and non-magnetic layers and to provide a magnetoresistance effect element having high thermal stability and long-term reliability.

Next explained is a concrete construction of the multi-layered thin-film functional device 4 whose functional layer functions as a wiring. In this case, used as the functional layer 3 is, for example, a multi-layered film stacking two or more layers containing at least one non-magnetic metal selected from Ag, Cu, Al, Cr, Zr and Nb by 50 atomic % or more (a multi-layered film of different kinds of metal films). By preventing atomic diffusion between thin stacked films in the wiring layer, a decrease in electric resistance, for example, can be prevented.

In the magnetoresistance effect element according to the invention, a crystal growth controlling layer may be inserted anywhere in the magnetoresistance effect film to reduce unevenness along a boundary of a stacked film upper than the crystal growth controlling layer smaller than unevenness along a boundary of a lower stacked film. The crystal growth controlling layer may be made either in a single position or in some positions. Position of the crystal growth controlling layer may be anywhere of boundaries of stacked films in the magnetoresistance effect film, and an effective inserting position can be chosen appropriately, depending upon the structure and material of the film. For example, in case of making on a substrate, via a certain stacked film or a pin valve structure configured with first magnetic layer (magnetization-free layer)/non-magnetic layer/second magnetic layer (magnetization-pinned layer)/anti-ferromagnetic layer, inverted spin valve structure configured with anti-ferromagnetic layer/first magnetic layer (magnetization-pinned layer)/non-magnetic layer/second magnetic layer (magnetization-free layer) (for example, CoFe/Cu/CoFe/IrMn or IrMn/CoFe/Cu/CoFe), the crystal growth controlling layer (K layer) may be inserted in the magnetization-free layer (for example, CoFe/K-layer/CoFe/CuCoFe/IrMn or IrMn/CoFe/Cu/CoFe/K-layer/CoFe) or may be pinned in a magnetization-pinned layer (for example, CoFe/Cu/CoFe/K-layer/CoFe/IrMn or IrMn/CoFe/K-layer/CoFe/Cu/CoFe), for example. If the unevenness of the base of the magnetoresistance effect film is large, there may occur deterioration of the magnetic characteristics, such as deterioration of soft magnetic characteristics of the magnetization-free layer or deterioration of magnetization fixture by the anti-ferromagnetic layer, or unevenness along the boundary of the stacked film in the magnetoresistance effect film itself increases to induce inter-diffusion of atoms at the boundary. The structure having the crystal growth controlling layer inserted in the first magnetic layer is particularly efficient when the base has a large unevenness, and smoothing by insertion of the crystal growth controlling layer significantly improves the magnetic characteristics, and prevents inter-diffusion of atoms. Furthermore, although the magnetoresistance effect film progressively increases its own boundary unevenness while it is stacked, the unevenness along the boundary of the stacked film is again smoothed by employing the structure having the crystal growth controlling layer inserted in the second magnetic layer, and this ensures improvement of the magnetic characteristics and improvement of the thermal stability against atomic diffusion.

Next explained are concrete examples of the invention explained above and results of their evaluation. Throughout the specification, the preferable compositions for the alloys are as follows:

In the case of Co—Fe alloys, the composition of Co is preferably in the range of 80–99 atomic %, and more preferably about 90 atomic %.

In the case of Ni—Fe alloys, the composition of Ni is preferably in the range of 70–95 atomic %, and more preferably in the range of 80–90 atomic %.

In the case of Ir—Mn alloys, the composition of Ir is preferably in the range of 15–25 atomic %, and more preferably about 22 atomic %.

In the case of Pt—Mn alloys, the composition of Pt is preferably in the range of 40–60 atomic %, and more preferably about 50 atomic %.

In the case of Fe—Mn alloys, the composition of Fe is preferably in the range of 40–60 atomic %, and more preferably about 50 atomic %.

In the case of Ni—Fe—Co alloys, the composition of Co is preferably about 3 atomic %.

In the case of Co—Zr—Nb alloys, the composition of Co is preferably in the range of 80–95 atomic %, and the composition of Zr is preferably in the range of 5–10 atomic %.

EXAMPLE 1

First made was a 5 nm thick Ta buffer layer on a thermal oxide Si substrate, and a Ni—Fe—Co base layer of a thickness around 2 nm thereon. In contact with it, a crystal growth controlling layer containing a Ni—Fe—Co alloy, Fe oxide and Co oxide as its major components was made up to a thickness around 0.8 nm. Further formed on the crystal growth controlling layer is a Co/(Cu/Co) 16 artificial lattice Thicknesses of Co and Cu were 2 nm and 2.1 nm, respectively.

COMPARATIVE SAMPLE 1

Similarly to Example 1, a 5 nm thick Ta buffer layer was made on a thermal oxide Si substrate, and a Ni—Fe—Co base layer of a thickness around 2 nm was made thereon. After that, an artificial lattice of Co/(Cu/Co)16 was made. Thicknesses of Co and Cu were 2 nm and 2.1 nm, respectively.

Figure 6:
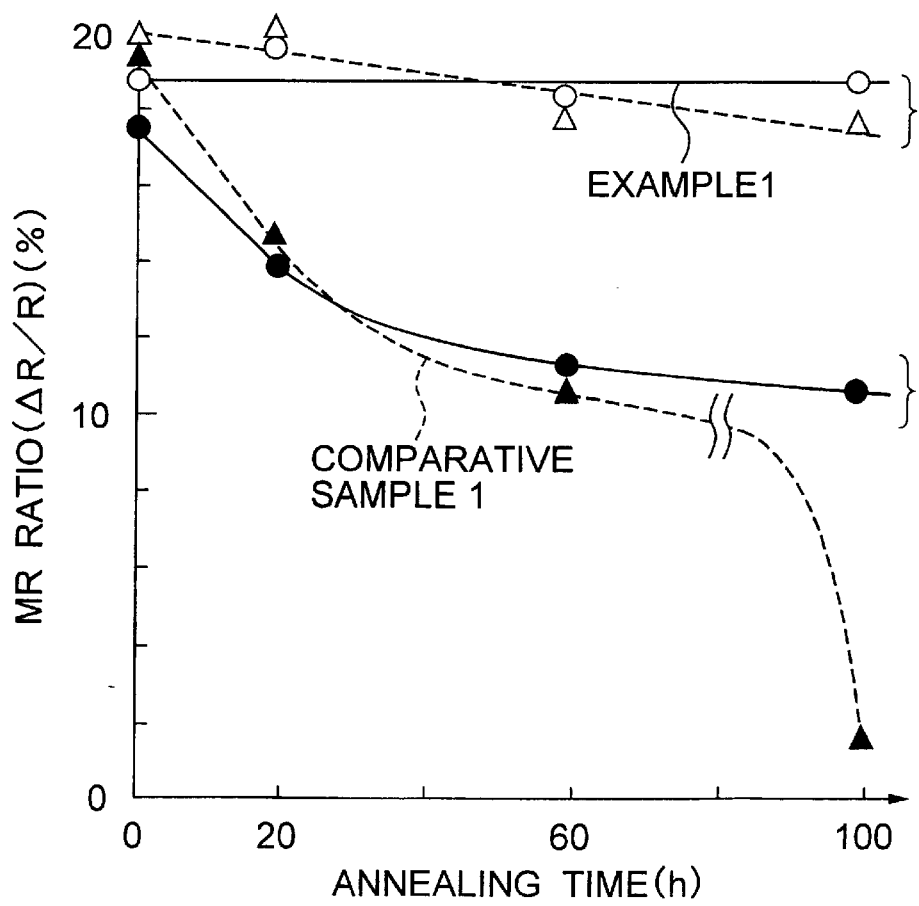
FIG. 6 shows MR ratios of the artificial lattice films as Example 1 and Comparative sample 1 (two samples for each)

The artificial lattice films made as Example 1 and Comparative sample 1 were annealed individually in a vacuum of approximately $1 \times 10^{-6}$ Torr at 240 degrees in centigrade for 20 hours, 60 hours and 100 hours. FIG. 6 shows MR ratios of the artificial lattice films as Example 1 and Comparative sample 1 (two samples for each). It is confirmed from FIG. 6 that Example 1 exhibits better thermal stability than Comparative sample 1.

EXAMPLE 2

A 10 nm thick Ta layer is made as a buffer layer on a thermal oxide Si substrate, and a Ni—Fe base layer of a thickness around 2 nm was made subsequently. In contact with it, a crystal growth controlling layer containing a Ni—Fe alloy and a Fe oxide as its major components was made up to a thickness around 0.6 nm. Further formed on the crystal growth controlling layer was a spin valve film of Ni—Fe (4 nm)/Co (1 nm)/Cu (2.5 nm)/Co (1 nm)/Ni—Fe (4 nm)/Ni—Fe (16 nm) on the crystal growth controlling layer. Additionally, a Ta protective coat of a thickness around 5 nm was made thereon. It was confirmed by observation through cross-sectional TEM (transmission electron microscopy) that very flat films were obtained.

COMPARATIVE SAMPLE 2

Similarly to Example 2, a 10 nm thick Ta layer was made as a buffer layer on a thermal oxide Si substrate, and a Ni—Fe base layer of a thickness around 2 nm was made thereon. Subsequently formed on the crystal growth controlling layer was a spin valve film of Ni—Fe (6 nm)/Co (1 nm)/Cu (2.5 nm)/Co (1 nm)/Ni—Fe (4 nm)/Ni—Fe (16 nm). Additionally, a Ta protective coat of a thickness around 5 nm was made thereon. It was confirmed by observation through cross section TEM that unevenness of the Ni—Fe/Ni—Fe boundary was very (beyond 1.5 nm in the film thickness direction).

Figure 7:
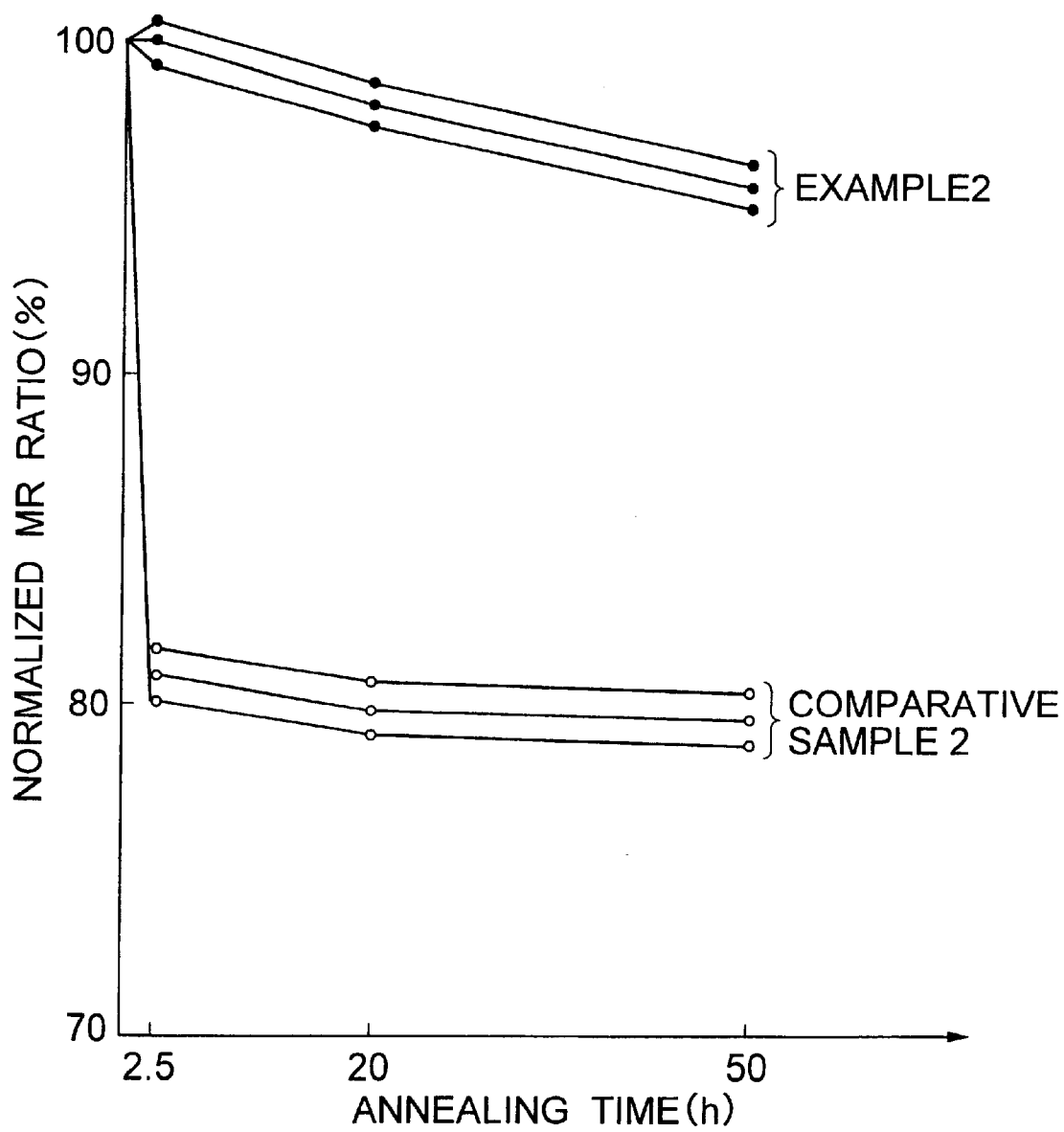
FIG. 7 shows MR ratios of the spin valve films as Example 2 and Comparative sample 2 (three samples for each)

The spin valve films made as Example 2 and Comparative sample 2 were annealed individually in a vacuum of approximately $1~10^{-6}$ Torr at 240 degrees n centigrade for 50 hours. FIG. 7 shows MR ratios of the spin valve films as Example 2 and Comparative sample 2 (three samples for each). It is confirmed from FIG. 6 that Example 2 exhibits better thermal stability than Comparative sample 2.

EXAMPLES 3 to 7 AND COMPARATIVE SAMPLES 3 To 4

An $Al_2O_x$ insulating layer as thick as several micro meters was made on an AlTiC substrate (made of a sintered materials of $Al_2O_3$—TiC), and a 5 nm thick amorphous Co—Zr—Nb layer was made thereon as a buffer layer. Subsequently, a NiFe base layer was made. Thickness of the NiFe base layer was 1 nm (Example 3), 2 nm (Example 4), 5 nm (Example 5), 10 nm (Example 6), 15 nm (Example 7), 20 nm (Comparative sample 3) and 30 nm (Comparative sample 4). In contact therewith, a crystal growth controlling layer as thick as 0.5 nm, containing Ni—Fe, Ni oxide and Fe oxide, was made. Further formed on the crystal growth controlling layer was a spin valve film with Co—Fe (3 nm)/Cu (3 nm)/Co—Fe (2 nm)/Ir—Mn (1.5 nm), and a Ta protective coat with a thickness around 5 nm was made thereon.

EXAMPLE 8

A spin valve film identical in structure with that of Example 4, except that the crystal growth controlling layer was as thick as approximately 0.8 nm, was made.

COMPARATIVE SAMPLE 5

An $AlO_x$ insulating layer as thick as several micrometers was made on an AlTiC substrate, and a 5 nm thick amorphous Co—Zr—Nb layer was made thereon as a buffer layer. Subsequently, a NiFe base layer as thick as approximately 2 nm was made. Consecutively made was a spin valve film with Co—Fe (3 nm)/Cu (3 nm)/Co—Fe (2 nm)/Ir—Mn (5.5 nm), and a Ta protective coat with a thickness around 5 nm was made thereon.

As a result of observation by cross-sectional TEM (transmission electron microscopy), continuous growth of grains from Ni—Fe to upper Co—Fe was observed in the spin valve film as Sample 5, and it was confirmed that unevenness of the boundary, Ir—Mn/Ta boundary and film surface was large (beyond 1.5 nm in the film thickness direction). Additionally, as a result of AFM (inter-atomic force microscopy) observation, it was confirmed that unevenness on the film surface was approximately 2.2 to 2.5 nm in $R_{max}$. Columnar crystal grain size of the spin valve film as Sample 5 was approximately 15 to 50 nm.

In contrast, in the spin valve film as Example 4 or Example 8, growth of grains was discontinuous between upper and lower portions of the crystal growth controlling layer. In both Example 4 and Example 8, the Co—Fe/Cu boundary on the crystal growth controlling layer was very smooth, and the boundary roughness in the thickness direction of the film was confirmed to be not larger than 1 nm (approximately 0.5 nm). Unevenness on the film surface was confirmed to be approximately 1.3 nm in $R_{max}$ through AFM observation. In Example 4, crystal grain size of the base crystal layer was approximately 2 to 10 nm, and columnar crystal grain size of the spin valve film was about 10 to 20 nm.

COMPARATIVE SAMPLE 6

An $AlO_x$ insulating layer having a thickness of several micrometers, a sendust shield (FeAlSi) and a magnetic gap film ($AlO_x$) as thick as approximately 100 nm was made sequentially on an AlTiC substrate. Further formed thereon were, in sequence, a 5 nm thick amorphous Co—Zr—Nb layer and a NiFe base layer of a thickness around 2 nm. In contact therewith, a crystal growth controlling layer containing Ni—Fe, Ni oxide and Fe oxide was made as thick as approximately 0.1 nm. Further formed on the crystal growth controlling layer was a spin valve film with Co—Fe (3 nm)/Cu(3 nm)/Co—Fe(2 nm)/Ir—Mn(5.5 nm), and a Ta protective coat with a thickness around 5 nm was made thereon. As a result of observation by cross section TEM, unevenness of the Co—Fe/Ir—Mn boundary was large in the spin valve film as Sample 6 (2 nm or more in the thickness direction of the film).

EXAMPLE 9

An $AlO_x$ insulating layer as thick as several micrometers, a sendust shield (FeAlSi) and a magnetic gap film ($AlO_x$) as thick as approximately 100 nm was made sequentially on an AlTiC substrate. Further formed thereon were, in sequence, a 5 nm thick amorphous Co—Zr—Nb layer as a buffer layer and a NiFe base layer of a thickness around 2 nm. In contact therewith, a crystal growth controlling layer containing Ni—Fe, Ni oxide and Fe oxide was made as thick as approximately 1.4 nm. Further formed on the crystal growth controlling layer was a spin valve film with Co—Fe (3 nm)/Cu(3 nm)/Co—Fe(2 nm)/Ir—Mn(5.5 nm), and a Ta protective coat with a thickness around 5 nm was made thereon.

As a result of observation by cross-sectional TEM, unevenness of the Co—Fe/Ir—Mn boundary was reduced (1 nm or less in the thickness direction of the film) in the spin valve film of Example 9 as compared with the comparative sample 6 because the thickness of the crystal growth controlling layer was as thick as 1.4 nm.

EXAMPLE 10

An $AlO_x$ insulating layer as thick as several micrometers a sendust shield (FeAlSi) and a magnetic gap film ($AlO_x$) as thick as approximately 100 nm was made sequentially on an AlTiC substrate. Further formed thereon were, in sequence, a 5 nm thick Ta layer and a 5 nm thick amorphous Co—Zr—Nb layer as a buffer layer, and a NiFe base layer of a thickness around 2 nm. In contact therewith, a crystal growth controlling layer containing Ni—Fe, Ni oxide and Fe oxide was made as thick as approximately 0.8 nm. Further formed on the crystal growth controlling layer was a spin valve film with Co—Fe (3 nm)/Cu (3 nm)/Co—Fe (2 nm)/Ir—Mn (5.5 nm), and a Ta protective coat with a thickness around 5 nm was made thereon.

As a result of observation by cross-sectional TEM, unevenness of the Co—Fe/Ir—Mn boundary was reduced (1 nm or less in the thickness direction of the film) in the spin valve film of Example 10 probably because smoothness of the film was improved, as compared with the comparative sample 6, since the 5 nm thick Ta layer and the 5 nm thick amorphous Co—Zr—Nb layer were made as the buffer layer, and thickness of the crystal growth controlling layer was increased as thick as 0.8 nm.

Figure 8:
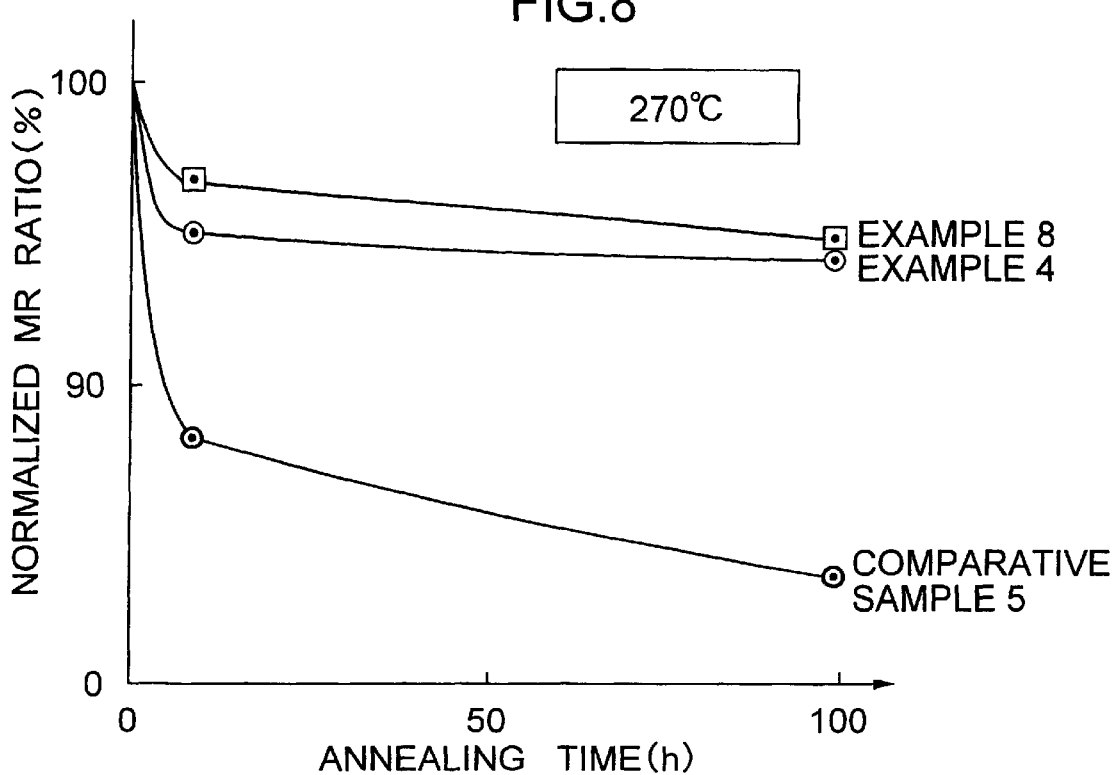
FIG. 8 shows dependency of MR ratios of the spin valve films of Examples 3, 8 and Comparative sample 5 upon annealing time.

The spin valve films made as Examples 3 to 10 and Comparative samples 3 to 6 were annealed individually in a vacuum of approximately $1 \times 10^{-6}$ Torr at 240 degrees in centigrade for 100 hours. FIG. 8 shows dependency of MR ratios of the spin valve films of Examples 3, 8 and Comparative sample 5 upon annealing time. MR ratios are shown in normalized value, determining MR ratios after the pinned-annealing approximately one hour later than the film was made (initial MR ratios) as 1. Examples 4 and 8 were confirmed to be less deteriorated in characteristics by annealing and have better thermal stability than Comparative sample 5.

Figure 9:
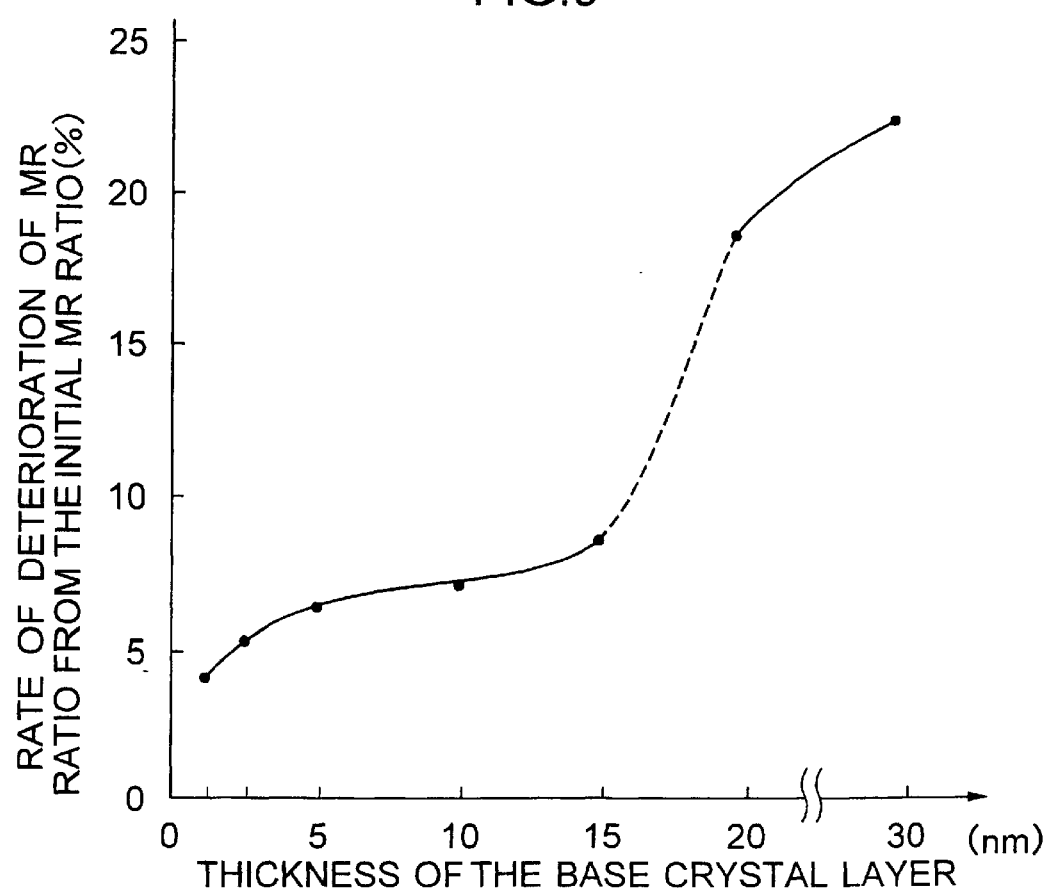
FIG. 9 shows relationship between rate of deterioration of MR ratio from the initial MR ratio and thickness of the base crystal layer when the film was annealed at 270 degrees in centigrade for 100 hours.
Figure 10:
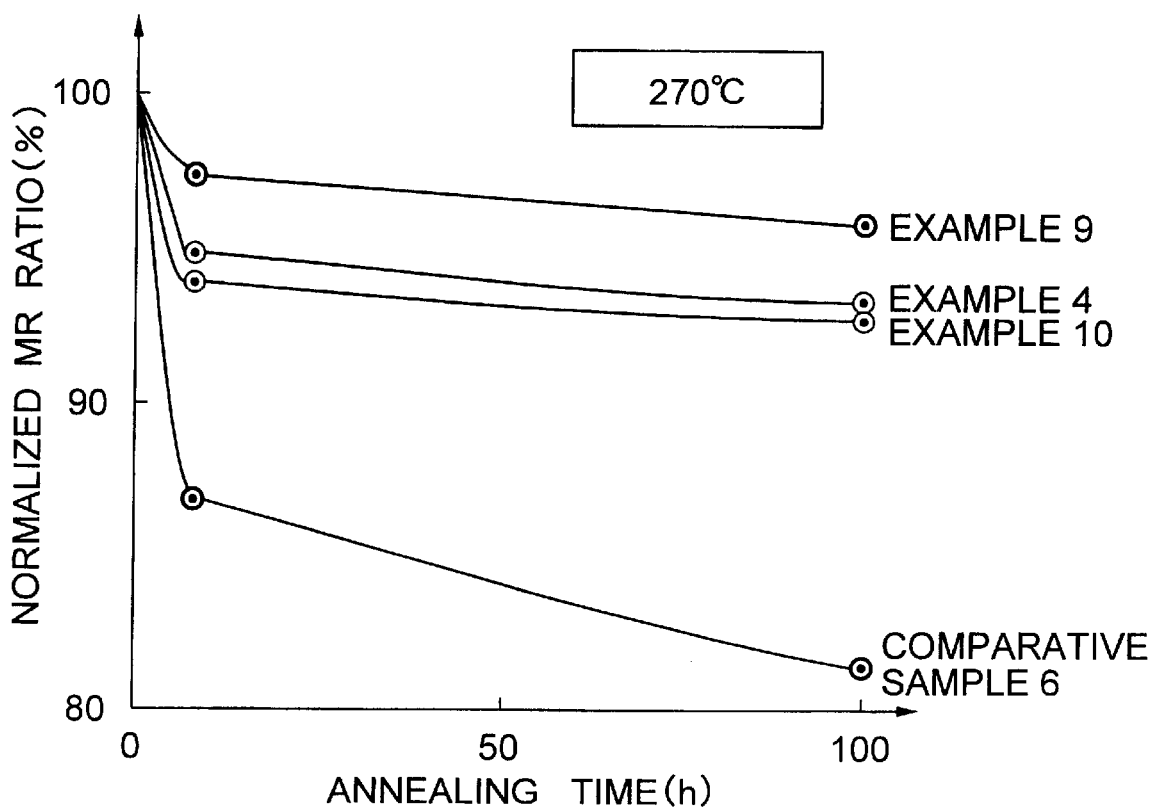
FIG. 10 shows changes in MR characteristics by annealing of the spin valve films of Comparative sample 6 with large unevenness along the film boundary and Examples 4, 9 and 10 with small unevenness along the film boundary.
Figure 11:
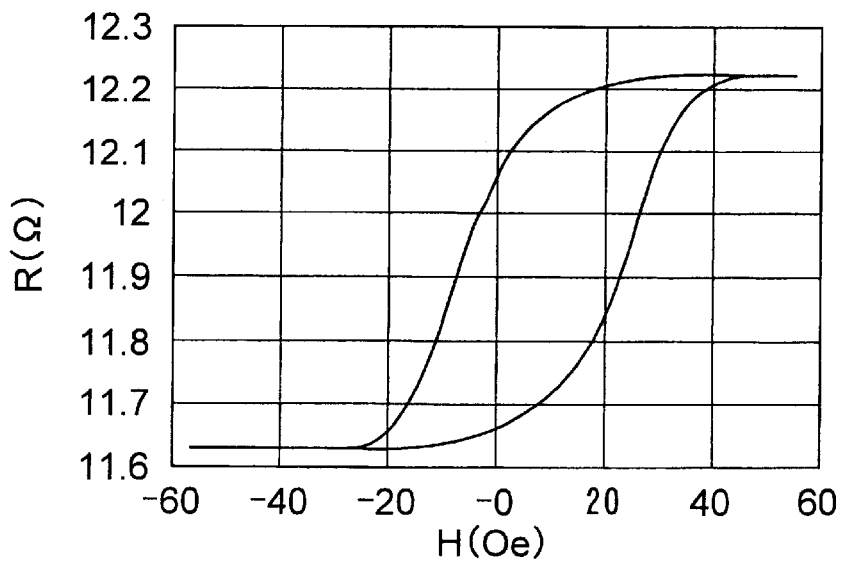
FIGS. 11, 12 and 13 shows the RH loop of Examples 4, 10 and Comparative sample 6, respectively.
Figure 12:
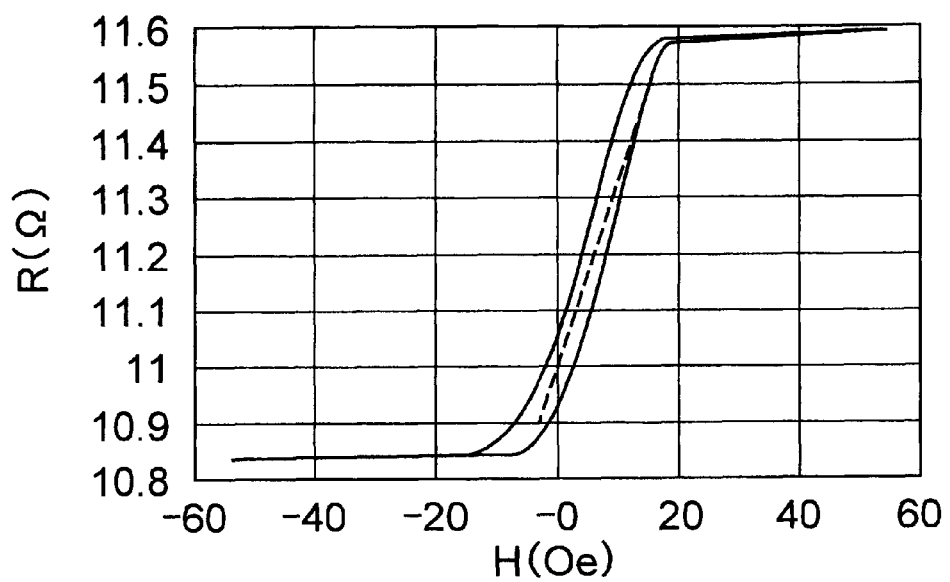
Figure 13:
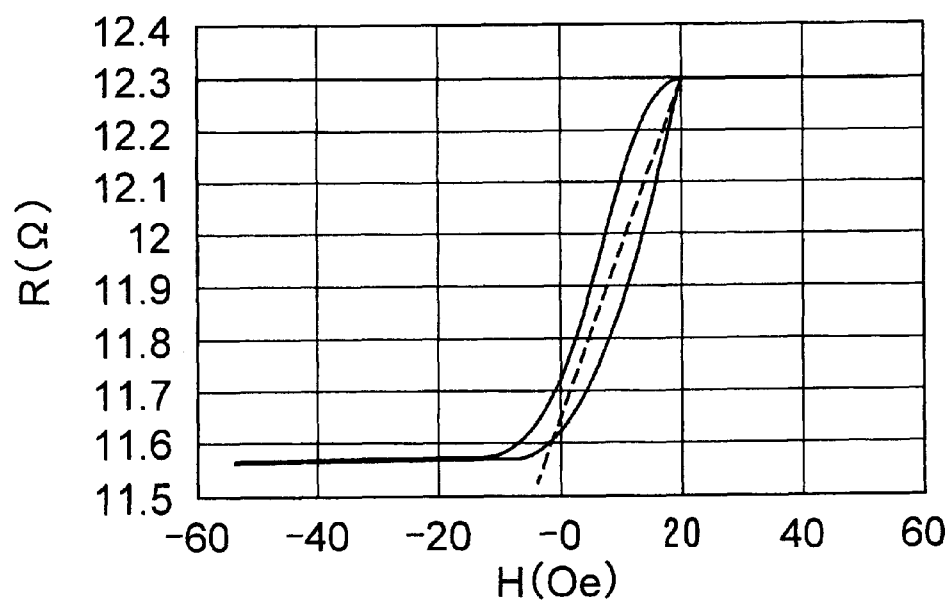

FIG. 9 shows relationship between rate of deterioration of MR ratio from the initial MR ratio and thickness of the base crystal layer when the film was annealed at 270 degrees in centigrade for 100 hours. It is apparent from FIG. 9, that deterioration in characteristics of MR ratio rapidly increases when thickness of the base crystal layer exceeds 15 nm. FIG. 10 shows changes in MR characteristics by annealing of the spin valve films of Comparative sample 6 with large unevenness along the film boundary and Examples 4, 9 and 10 with small unevenness along the film boundary. Annealing was conducted at 270 degrees in centigrade for 100 hours. It is noted that Examples 4, 9 and 10 exhibit less characteristic deterioration and have better thermal stability. As to RH loop (MR characteristics) after annealing at 270 degrees in centigrade for 100 hours as well, the spin valve films of Examples 4 and 10 are confirmed to exhibit smaller magnetic coercive force and better MR characteristics than Comparative sample 6. FIGS. 11, 12 and 13 shows the RH loop of Examples 4, 10 and Comparative sample 6, respectively.

EXAMPLE 11

Sequentially formed on a thermal Si substrate were a 10 nm thick amorphous Co—Zr—Nb layer and a Ni—Fe base layer with a thickness around 10 nm. In contact therewith, a crystal growth controlling layer containing Ni—Fe, Ni oxide and Fe oxide was made as thick as approximately 1.5 nm. Further formed on the crystal growth controlling layer was a spin valve film with Co—Fe (10 nm)/Cu (10 nm)/Co—Fe (10 nm)/Ir—Mn (10 nm), and a Ta protective coat with a thickness around 10 nm was made thereon.

COMPARATIVE SAMPLE 7

Sequentially formed on a thermal Si substrate were a 10 nm thick amorphous Co—Zr—Nb layer and a Ni—Fe base layer with a thickness around 10 nm. Further formed was a spin valve film with Co—Fe (10 nm)/Cu (10 nm)/Co—Fe (10 nm)/Ir—Mn (10 nm), and a Ta protective coat with a thickness around 10 nm was made thereon.

Figure 14:
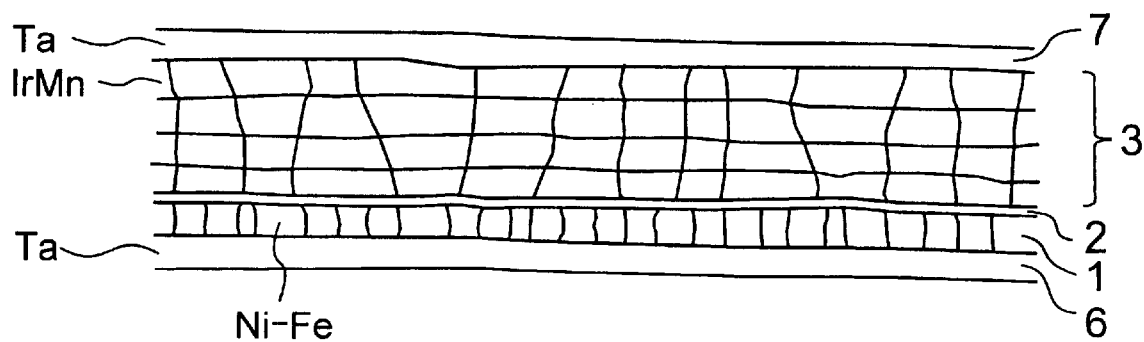
FIGS. 14 and 15 schematically shows the cross-sectional TEM image of Sample 11 and Comparative sample 7, respectively.
Figure 15:
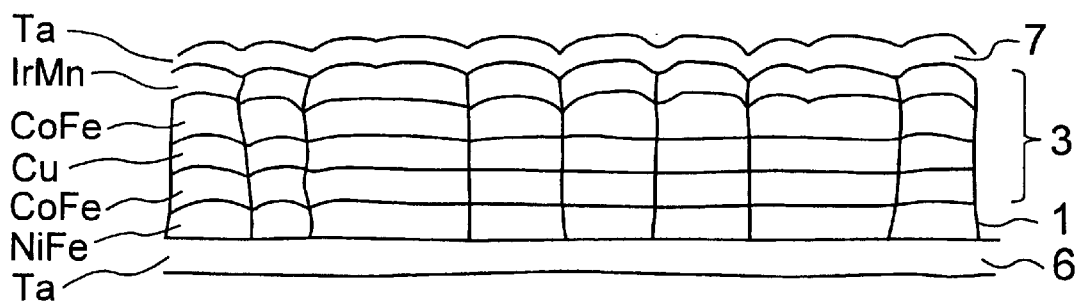

Taking Example 11 and Comparative sample 7, cross-sectional aspects of their films were observed by cross-sectional TEM. Its results are schematically shown in FIG. 14 (Example 11) and FIG. 15 (Comparative sample 7). In Comparative sample 7 (FIG. 15), growth of columnar crystal grains extending through from the base to the protective coat was observed. But, in Example 11 (FIG. 14), growth of grains was discontinuous between upper and lower portions of the crystal growth controlling layer (brighter low-density layer than upper and lower layers). Crystal grain size (here is defines as the width of a columnar crystal) was 15 to 50 nm in Comparative sample 7, 15 to 15 nm and 10 to 30 nm in the base crystal layer and the spin valve film (functional layer), respectively, in Example 11. In comparative sample 7, unevenness along the Co—Fe/Ir—Mn boundary was large, and there was large boundary undulation beyond 1.5 nm in the thickness direction of the film. But, in Example 11, the Co—Fe/Ir—Mn boundary was confirmed to be very smooth, and undulation in the thickness direction of the film was 1 nm or less (around 0.5 nm).

The spin valve films of Example 11 and Comparative sample 7 were annealed individually in a vacuum of approximately $1 \times 10^{-6}$ Torr at 270 degrees in centigrade for 100 hours. In the spin valve films of Example 11 and Comparative sample 7, similar behaviors as those of Example 2 and Comparative sample 2 were observed in post-annealing MR ratio, and excellency of Example 11 in thermal stability was confirmed.

Figure 16:
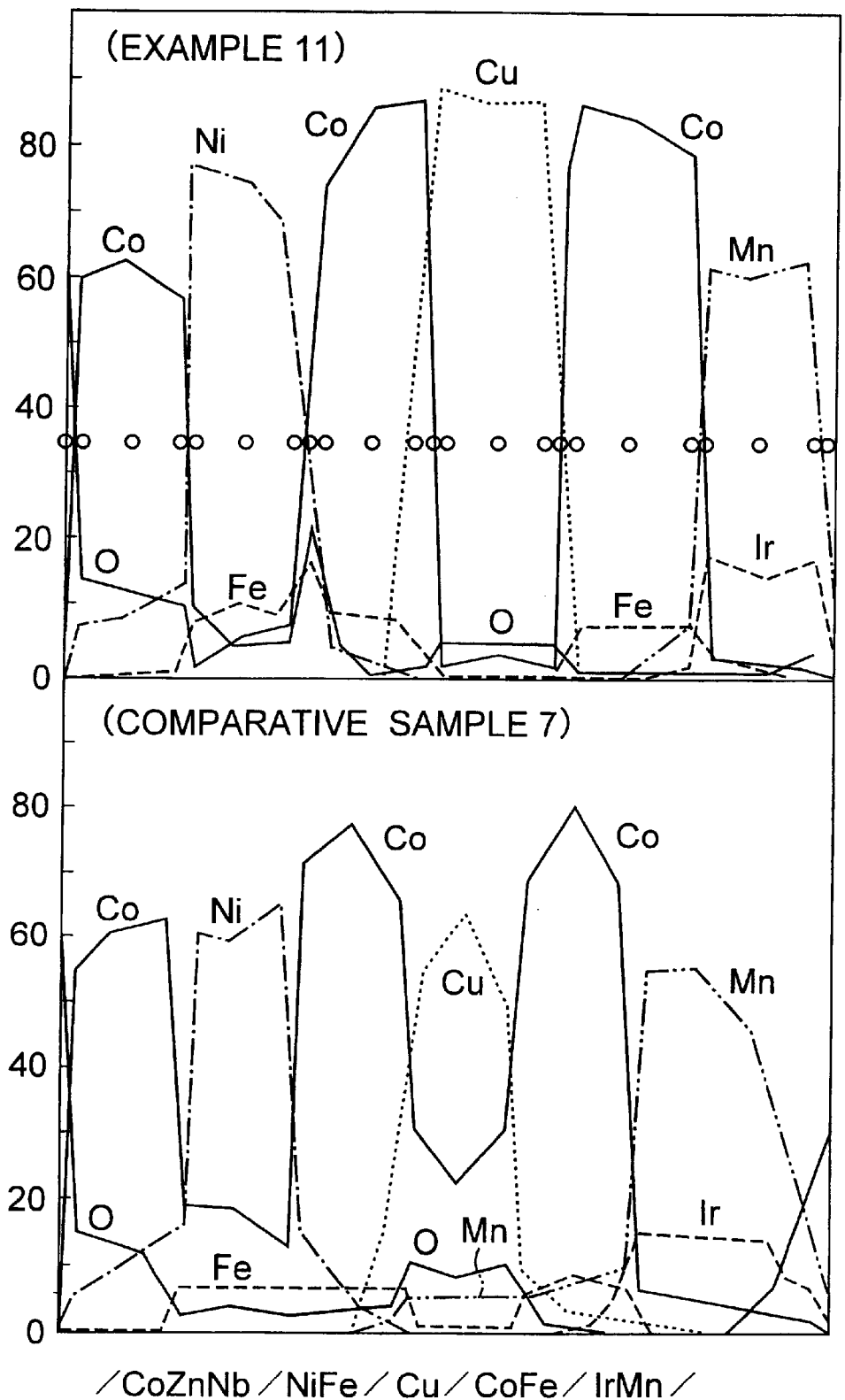
FIG. 16 shows an element profile of major component elements in Example 11 and Comparative sample 7.

Taking Example 11 and Comparative sample 7 after annealing, component analysis of cross section was conducted by FE (field emission) —TEM for directly observing diffusing behaviors of atoms. Component analysis was made in the thickness direction of the film at 25 through 30 points, for example, near boundaries of each layer, in central portions of each layer. Spot diameter of an electron beam pointing each component analysis point was approximately 1 nm. FIG. 16 shows an element profile of major component elements in Example 11 and Comparative sample 7. In the spin valve film of Comparative sample 7, 20 through 40 atomic % of Co element was detected from a central portion of the Cu layer. In the spin valve film of Example 11, almost no Mn was detected in Cu. But, in Comparative sample 7, 4 to 8 atomic % of Mn element was detected from the Cu layer.

From these results, Example 11 was confirmed to have excellent thermal stability and therefore be stable in MR characteristics as compared with Comparative sample 7.

EXAMPLE 12

Sequentially formed on a thermally oxidized Si substrate were a 5 nm thick Ta layer as a buffer layer and a Ni—Fe base layer of a thickness around 10 nm. In contact therewith, a crystal growth controlling layer containing Ni—Fe, Ni oxide and Fe oxide was made as thick as 1.5 nm approximately. Further made on the crystal growth controlling layer was a spin valve film with Co—Fe (1 nm)/Cu(2.5 nm)/Co—Fe(2 nm)/Ir—Mn(12 nm), and a Ta protective coat with a thickness around 5 nm was made thereon.

COMPARATIVE SAMPLE 8

Sequentially formed on a thermally oxidized Si substrate were a 5 nm thick Ta layer as a buffer layer and a Ni—Fe base layer of a thickness around 10 nm. Further made on the crystal growth controlling layer was a spin valve film with Co—Fe (1 nm)/Cu (2.5 nm)/Co—Fe (2 nm)/Ir—Mn (12 nm), and a Ta protective coat with a thickness around 5 nm was made thereon.

Figure 17:
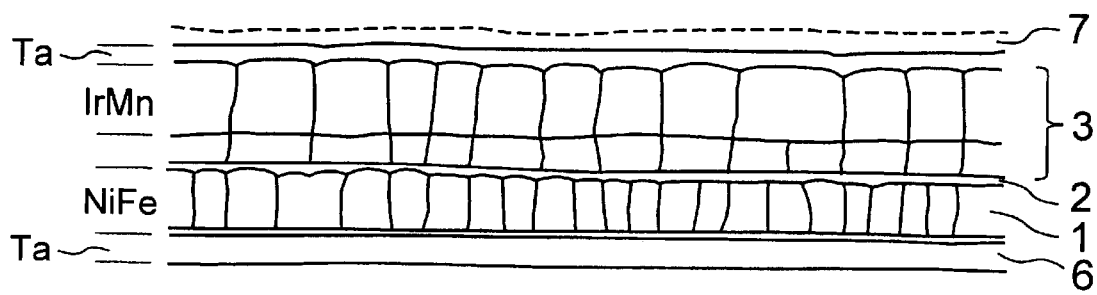
FIGS. 17 and 18 schematically shows the cross-sectional TEM image of Sample 12 and Comparative sample 8, respectively.
Figure 18:
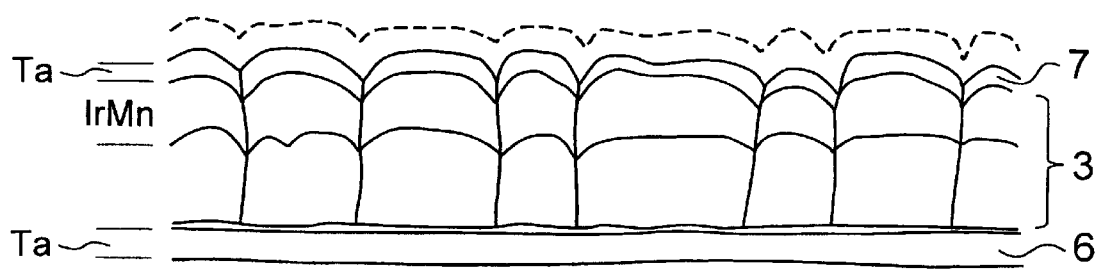

Taking Example 12 and Comparative sample 8, cross-sectional aspects of their films were observed by cross-sectional TEM. Its results are schematically shown in FIG. 17 (Example 12) and FIG. 18 (Comparative sample 8). In Comparative sample 8 (FIG. 18), growth of columnar crystal grains extending through from the base to the protective coat was observed. But, in Example 12 (FIG. 17), growth of grains was discontinuous between upper and lower portions of the crystal growth controlling layer (brighter low-density layer than upper and lower layers). In Comparative sample 8, there was large boundary undulation beyond 2 nm in the thickness direction of the film. But, in Example 12, the Co—Fe/Ir—Mn boundary was confirmed to be very smooth, and undulation in the thickness direction of the film was 1 nm or less (around 0.5 nm).

Taking Example 12 and Comparative sample 8, as-deposited, MR ratios were measured. Thereafter, they were annealed in a vacuum of approximately $1 \times 10^{-6}$ Torr for one hour, MR ratios were measured again. Post-annealing MR ratios decreased by 4% in Example 12 and 24% in Comparative sample 8 from as-deposited MR ratios as references. Example 12 was confirmed to be much more excellent in thermal stability than Comparative sample 8.

Figure 19:
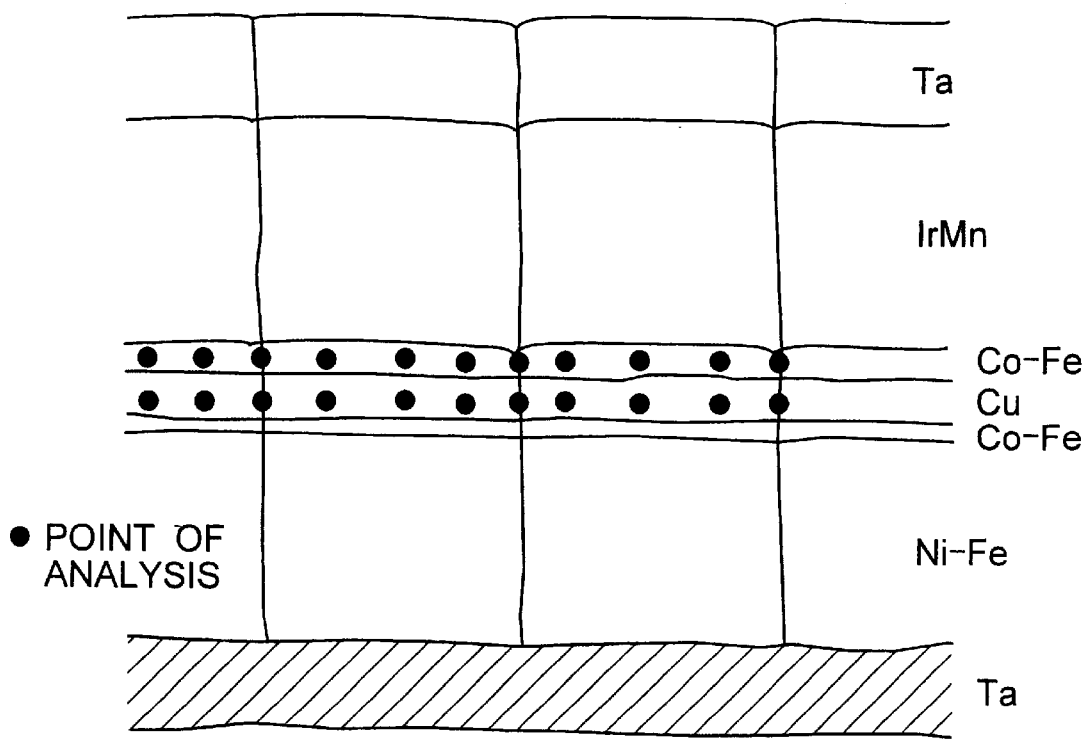
FIG. 19 schematically shows points of analysis in Example 12.

Taking these spin valve films of Example 12 and Comparative sample 8, compositional analysis along a cross section was conducted by FE-TEM for directly observing diffusing behaviors of atoms. Component analysis was made on two layers, namely, upper Co—Fe layer (between the Cu layer and the Ir—Mn layer) and Cu layer, by point analysis in the direction parallel to the film surface. FIG. 19 schematically shows points of analysis in Example 12. Although the spot diameter of an electron beam pointing each component analysis point is approximately 1 nm, taking account of electron beam scattering or secondary electron emission, for example, actual component analysis probably got information on an area as large as 2 nm approximately.

Figure 20:
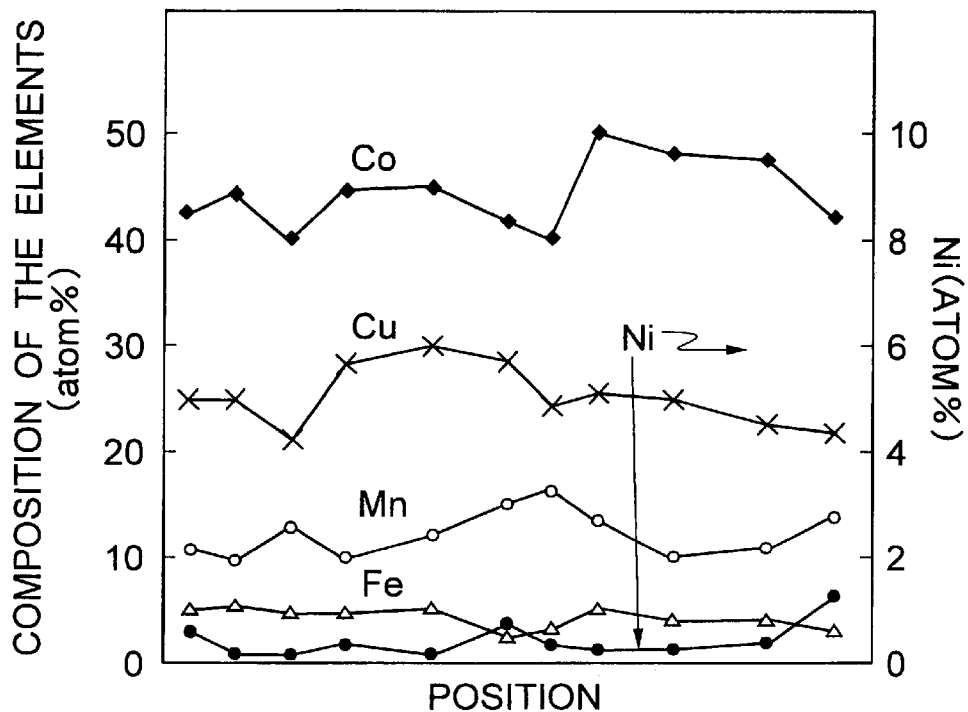
FIGS. 20 and 21 show element profiles of major component elements in Example 12.
Figure 21:
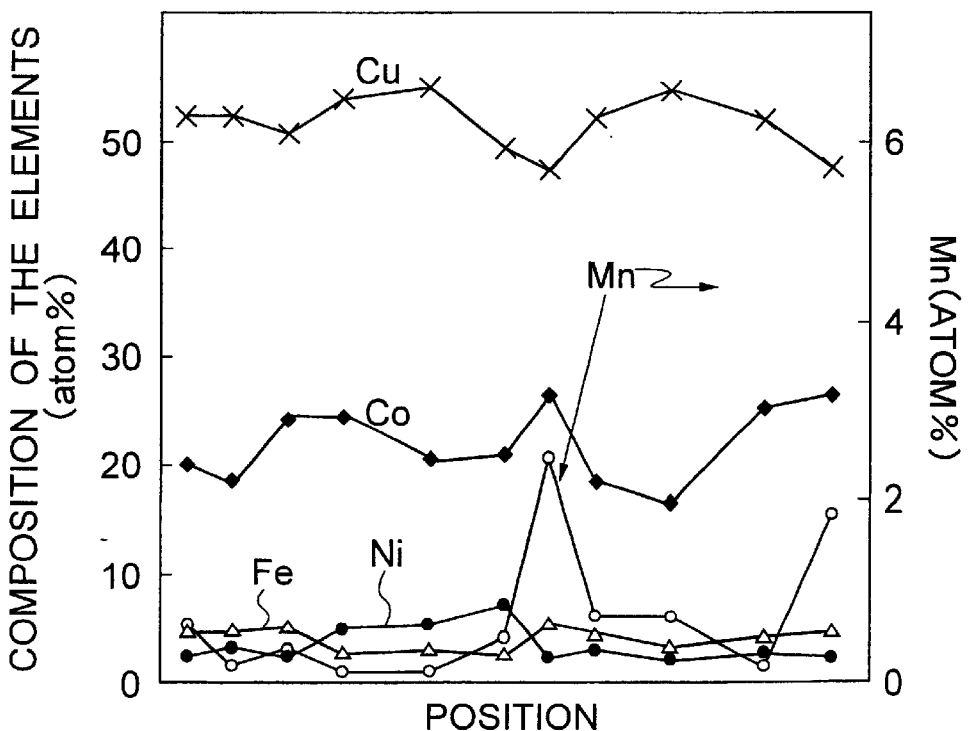
Figure 22:
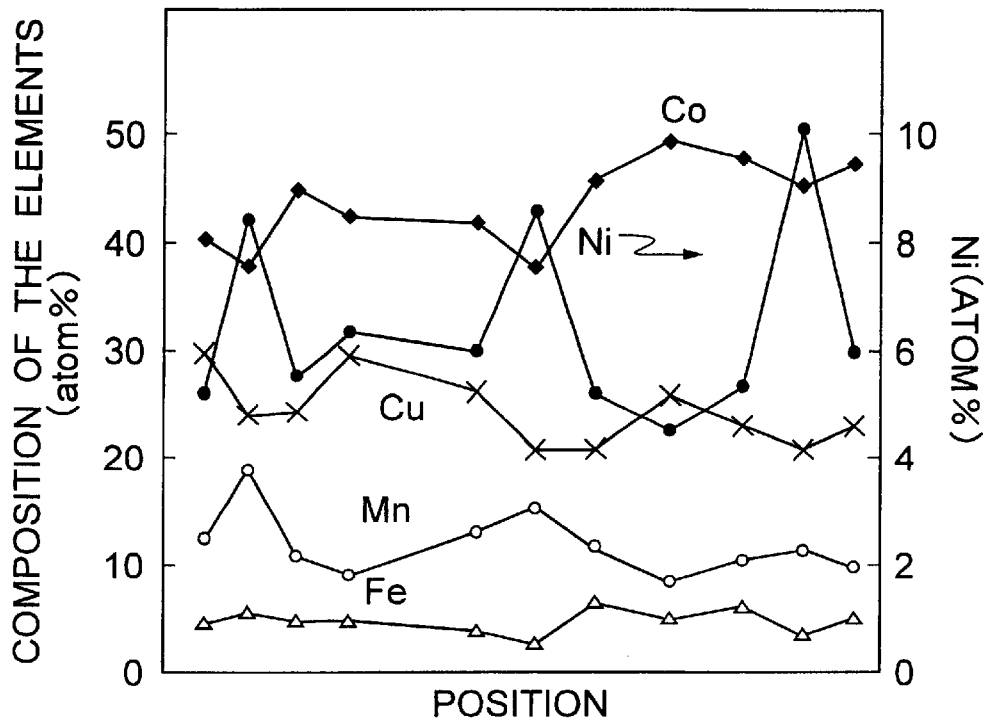
FIGS. 22 and 23 show element profiles of major component elements in Comparative sample 8.
Figure 23:
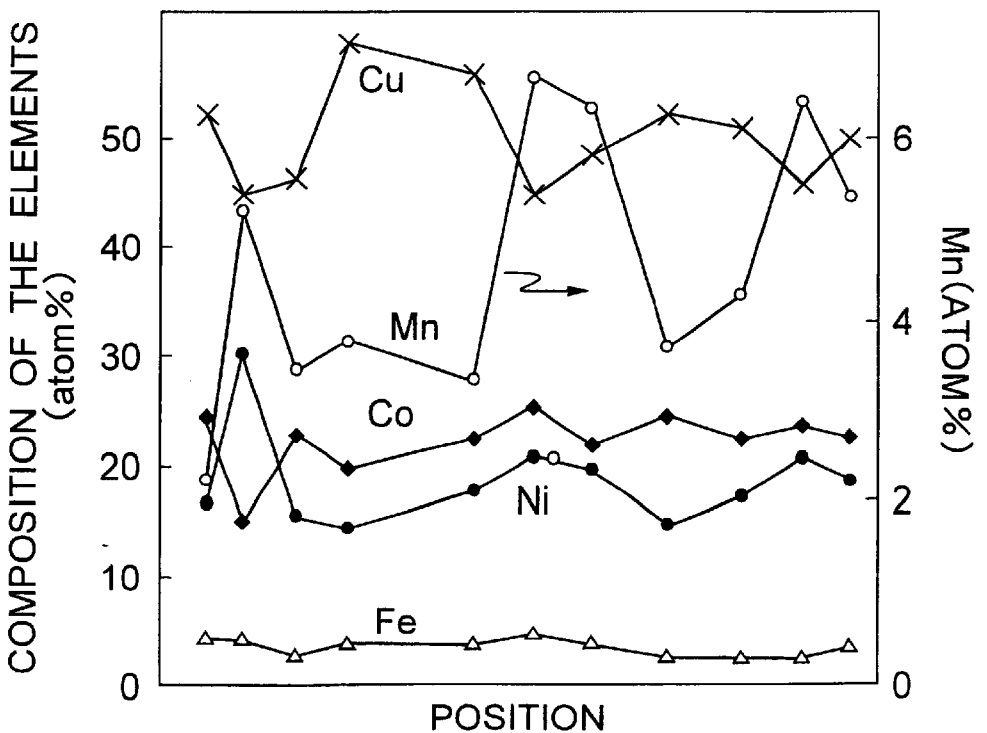
Figure 24:
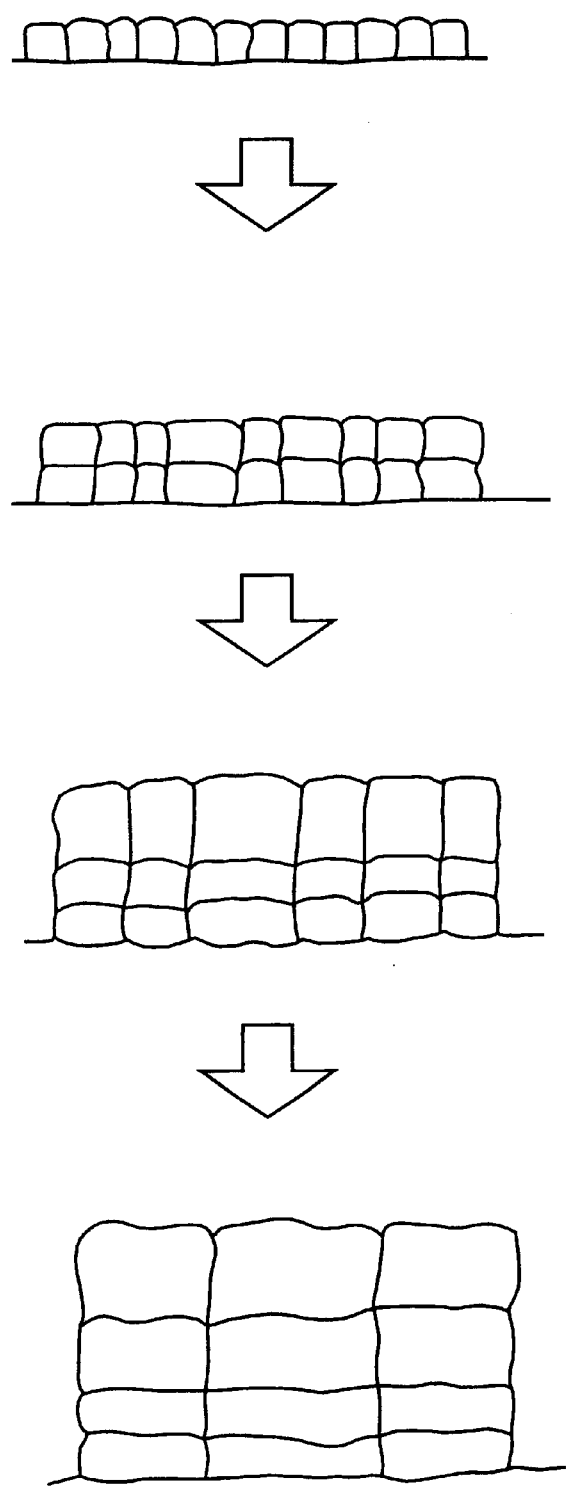
FIG. 24 schematically shows the bulkiness of the grain size in layers in a thin-film functional device.

FIGS. 20 and 21 show element profiles of major component elements in Example 12. FIGS. 22 and 23 show element profiles of major component elements in Comparative sample 8. In the spin valve film of Comparative sample 8, 4 through 10 atomic % of Ni element was detected from the Co—Fe layer (FIG. 22), and 2 to 7 atomic % of Mn element was detected from the Cu layer (FIG. 23). That is, Ni atoms diffused into the upper Co—Fe layer beyond the Co—Fe layer (1 nm) and the Cu layer (2.5 nm), and Mn atoms diffused into the Cu layer beyond the upper Co—Fe layer (2 nm). These elements were detected mainly from grain boundaries of the crystals, and this shows that intergranular diffusion heavily occurred in Ni and Mn atoms. In contrast, in the spin valve film of Example 12, only a few Mn element was found in the Cu layer (FIG. 21), and almost no Ni element was detected from the Co—Fe layer (FIG. 20). Example 12 was confirmed therefrom to have excellent thermal stability against atomic diffusion.

As reviewed above, while serious diffusion of Ni and Mn atoms along the grain boundary by annealing invites decreases the MR ratio by 24% in Comparative sample 8, Example 12 configured to control the crystal growth to make a grain boundary structure difficult for atomic diffusion, certainly realizes excellent thermal stability of the MR ratio.

EXAMPLES 13 AND 14

Sequentially formed on a thermal Si substrate were a 200 nm thick amorphous $AlO_x$ layer, and a spin valve film with Ir—Mn (20 nm)/Co—Fe (2 nm)/K-layer/Ru (0.8 nm)/Co—Fe (1.5 nm)/Cu (1 nm)/Co—Fe (1.1 nm)/Ni—Fe (2 nm) in Example 11 or Ir—Mn (20 nm)/Co—Fe (2 nm)/Ru (0.8 nm)/K-layer/Co—Fe (1.5 nm)/Cu (3 nm)/Co—Fe (1.5 nm)/Ni—Fe (2 nm) in Example 12, and a Ta protective coat of a thickness around 5 nm was made thereon.

The K-layer is a crystal growth controlling layer, which is a layer containing Co oxide and Fe oxide (about 1.5 nm thick) in Example 13 or containing Ru oxide (about 1.5 nm thick) in Example 14. The spin valves in Examples 13 and 14 have a inverted structure in which a magnetization-pinned layer whose magnetization is pinned by the Ir—Mn layer is located lower whereas a magnetization-free layer is located upper.

COMPARATIVE EXAMPLE 9

Sequentially formed on a thermal Si substrate were a 200 nm thick amorphous $AlO_x$ layer, and a spin valve film with Ir—Mn (20 nm)/Co—Fe (2 nm)/Ru (0.8 nm)/Co—Fe (1.5 nm)/Cu (3 nm)/Co—Fe (1.5 nm)/Ni—Fe (2 nm), and a Ta protective coat of a thickness around 5 nm was made thereon.

Taking he spin valve films of Examples 13, 14 and Comparative sample 9, changes in characteristics by annealing were observed. As a result, values of post-annealing MR ratio (at 270 degrees in centigrade for 3 hours) to as-deposited MR ratio were: 0.74 in Comparative sample 9, 0.90 in Example 13, and 0.88 in Example 14, and Examples 12 and 13 were confirmed to be excellent in thermal stability.

Additionally, their samples were observed by cross-sectional TEM. It is confirmed from it that Comparative sample exhibited a tendency toward an increase of boundary roughness from lower layers to upper layers, and boundary roughness was about 1.6 nm along the Ir—Mn/Co—Fe boundary and about 2.0 nm along the Co—Fe/Cu boundary. In contrast, in Examples 13 and 14, although roughness at the Ir—Mn/Co—Fe boundary was abut 1.6 nm similarly to Example 8, roughness at the Co/Fe/Cu boundary was as small as 1.2 nm and 1.3 nm, respectively. It is noted here that insertion of the crystal growth controlling layer certainly prevents an increase of boundary roughness from lower layers toward upper layers and successfully reduces boundary roughness.

Also when Pt—Mn (20 nm) was used in lieu of Ir—Mn (20 nm), substantially the same effect was obtained. With an alternative example using a normal spin valve film structure locating an anti-ferromagnetic film in an upper layer, in which a crystal growth controlling layer is interposed in the spin valve film (for example, Si substrate/AlO$_x$/Ni—Fe/Co—Fe/Cu/Co—Fe/K-layer/Ni—Fe/Pt—Mn Ta), boundary unevenness of layers located upper than the K-layer can be reduced less than that of layers located lower than the K-layer, and effects are obtained in preventing atomic inter-diffusion at the Ni—Fe/Pt—Mn boundary and improving the magnetic characteristics.

There are other alternative structures, such as, Si substrate/AlO$_x$/Ni—Fe/Co—Fe/Cu/Co—Fe/K-layer/Co—Fe/Ir—Mn (or Pt—Mn)/Ta and Si substrate/AlO$_x$/Ni—Fe/Co—Fe/Cu/Co—Fe/K-layer/Co—Fe/Ni—Fe/Pt—Mn/Ta.

Heretofore, the active thin-film element according to the invention has been explained by way of first to fourteenth examples and nine comparative samples. That is, by making the base layer 1 having a unique structure and a crystal growth controlling layer 2 on a substrate and then making the functional layer 3 having a predetermined structure thereon, crystallographic property of the functional layer can be positively controlled. As a result, inter-diffusion of atoms between thin-film layers in the functional layer can be alleviated, and this enables significant improvement of thermal stability and increases the long-term reliability. Especially when the concept is applied to a magnetoresistance effect film, a GMR element with remarkably low MR ratio and excellent thermal stability can be realized.

In the above-explained and other examples, structure of the functional layer 3 can be modified appropriately depending upon the type of an active thin-film element to which the invention is applied.

Next explained a series of magnetoresistance effect elements having unique structures and their manufacturing methods which have been invented by the Inventors through their researches.

First explained is the process which resulted in inventing a series of magnetoresistance effect elements which will be described later.

As explained before, among magnetoresistance effect elements, hopefully remarked are GMR elements using a spin valve film having a sandwich structure configured as ferromagnetic layer/non-magnetic layer/ferromagnetic layer. In a spin valve film, while magnetization of one of ferromagnetic layers is pinned by exchange bias magnetic field exerted from the anti-ferromagnetic film and the ferromagnetic film, for example, magnetization of the other ferromagnetic layer is reversed by an external magnetic field, so as to obtain a large magnetoresistance effect by relative changes in magnetization of the ferromagnetic layers between parallel and non-parallel orientations.

It has been further proposed that a metal compound, such as oxide, nitride, carbide, fluoride or boride, be interposed as a diffusion preventing layer between a metal base layer and a ferromagnetic layer (see Japanese Patent Laid-Open Publication No. H10-65232). This atomic diffusion preventing layer is made by applying oxidizing or nitrogenizing processing onto the surface of the metal base layer. A spin valve film having the diffusion preventing layer made of such a metal compound is expected to have both a high MR ratio and a high thermal resistance.

The inventors found, through their researches, that a diffusion preventing layer made of such a metal compound not only functions to prevent inter-layer atomic diffusion but also plays the role of mirror reflection of electrons. The electron reflection effect has been noted to elongate efficient mean free path of electrons and increase the MR ratio.

Currently, with a progressive increase of the magnetic recording density, further improvement of MR ratio is a very important issue, and insertion of a metal compound as an electron reflection layer is remarked as a hopeful means to realize both a high MR ratio and a high thermal resistance.

However, according to further researches by the Inventors, since a diffusion preventing layer made by oxidizing the surface of a NiFe alloy layer, for example, contains a magnetic oxide like NiO, there was noted the possibility that it causes an increase of magnetic distortion and induced magnetic anisotropy of a ferromagnetic layer made of Co or Co alloy on the diffusion preventing layer . Also when a compound other than an oxide is used as the diffusion preventing layer, magnetic distortion and induced magnetic anisotropy of the ferromagnetic layer may increase.

In the case where a spin valve film is actually used as a magnetoresistance effect element, induced magnetic anisotropy is one of characteristics which should be taken into consideration. However, induced magnetic anisotropy of a substance can take any values from maximum value to 0 inherent to the substance, and it readily increases with a magnetic field under a high temperature. Therefore, it is indispensable to take account of changes with time of the induced magnetic anisotropy at the design stage. However, its design is very difficult because, if the initial value is large, the increasing rate also increases, and makes it difficult to determine a bias point in a magnetic head, for example. Under the circumstances, even when the induced magnetic anisotropy of a ferromagnetic layer takes its maximum value, it is preferably held in a value not exceeding 10 Oe, approximately.

Magnetic distortion may cause not only a Barkhausen effect but also deterioration in mechanical strength. Therefore, it is preferably held under 1 ppm (parts per million) or less, for example. However, spin valve films using a conventional diffusion preventing layer often fail to satisfy these requirements.

On the other hand, in a diffusion preventing layer made by oxidizing the surface of a metal base layer by naturally oxidization or by introducing oxygen into a film-making chamber, or in a diffusion preventing layer made by typical plasma oxidation, it is difficult to obtain a stable and uniform film, and there is the problem that the surface roughness increases. Since a diffusion preventing layer is originally made as thin as several nm, an increase in surface roughness will destroys its function, and decreases its function as a mirror-reflection layer for electrons.

Moreover, in a spin valve film using a mirror-reflection layer, it is known that larger increase of MR effect can be attained by bringing about an electron reflection effect on surfaces of both magnetic layers in a sandwich structure with magnetic material/non-magnetic material/magnetic material. However, especially in a spin valve film of a type using an anti-ferromagnetic material for pinning of magnetization, there was no anti-ferromagnetic material providing both a good electron reflection effect and good magnetization-pinned characteristics, and it has been difficult to realize a spin valve utilizing a practical double-faced electron reflection effect.

For example, in the case where a metal anti-ferromagnetic material such as IrMn, NiMn or FeMn exhibiting good magnetization-pinned characteristics is used, it is difficult to obtain the electron reflection effect at the boundary between a magnetization-pinned layer and a the anti-ferromagnetic material. If an oxide anti-ferromagnetic layer such as NiO or $Fe_2O_3$ is used, good electron reflection effect can be obtained. However, its practical use is still difficult, taking account of blocking temperature, unidirectional anisotropic magnetic field, coercive force of the magnetization-pinned layer, and so on. It is therefore strongly desired to realize a magnetization-pinned layer promising both good electron reflection characteristics and good magnetization-pinned characteristics.

Furthermore, in the case where a pin valve film is used in a magnetic head for reproduction of a hard disk, for example, reproduced-output sensitivity must be improved to meet higher densities of magnetic recording. For this purpose, the product of saturated magnetization and thickness (hereinafter called "Mst product") of a layer variable in magnetic orientation relative to an external magnetic field (hereinafter called "free layer") had better be as small as possible.

However, as the Mst product of the free layer is simply decreased, magnetostatic coupling effect with the magnetization-pinned layer increases, and it becomes difficult to rectangularly intersect magnetic orientations of the magnetization-pinned layer and the free layer. This invites deterioration of symmetry of reproduced outputs, which is a serious problem, when the spin valve film is used as a reproducing magnetic head.

This problem can be overcome by using, as the magnetization-pinned layer, a multi-layered film including first and second ferromagnetic films anti-ferromagnetically coupled to each other, and a film anti-ferromagnetically coupled to separate these ferromagnetic films, such as Co/Ru/Co and CoFe/Cr/CoFe. This structure is hereinafter called "synthetic anti-ferromagnetic structure". By using the structure, the magnetization-pinned layer and the free layer can be readily made to intersect in magnetic orientation in zero magnetic field by mutually canceling their magnetization in the magnetization-pinned layer and thereby reducing the effect of magnetostatic coupling with the free layer.

However, such synthetic anti-ferromagnetic structures make it difficult to obtain good electron reflection effect. It is therefore difficult to obtain a large MR ratio by electron reflection effect while using a synthetic anti-ferromagnetic structure.

There are two types of spin valve films, namely, "bottom spin valve film" locating its anti-ferromagnetic layer for magnetization fixture on the side of a magnetic material nearer to the substrate, and "top spin valve film locating same on the side of a magnetic material remoter from the substrate. More preferable one of these types is used depending on the structure of a intended magnetic head. Therefore, it is preferable to ensure good electron reflection effect in both types of spin valve films.

However, in the case where an oxide anti-ferromagnetic material, such as NiO or $Fe_2O_3$ exhibiting an electron reflection effect is used as a bottom spin valve, since its free layer is made on the oxide anti-ferromagnetic material, control of the crystalline property is difficult, and good soft magnetic characteristics could not easily obtained. Especially when a Co alloy promising large MR effect is used as the free layer, the soft magnetic characteristics cannot be obtained easily. Also when the Mst product of the free layer is made smaller, crystallographic property further deteriorate, and soft magnetic characteristics deteriorate.

As discussed above, although spin valve films interposing a metal compound layer between a metal base layer and a ferromagnetic layer for preventing diffusion and reflecting electrons are remarked as hopeful materials of GMR elements having both a high thermal resistance and a high MR ratio, there still remains room for further improvements in that the existence of the metal compound layer causes magnetic distortion of the ferromagnetic layer and an increase of the induced magnetic anisotropy.

Moreover, a conventional method for manufacturing a diffusion preventing and electron reflecting layer may cause another problem that a tendency toward an increase of surface roughness leads to a decrease of the atomic diffusion preventing effect or a decrease of its function as the electron mirror-reflecting layer.

Furthermore, there was no magnetization-pinned layer promising both a good magnetization-pinned property and a good electron reflecting property, and it was therefore difficult to realize a practical spin valve film using double-faced electron reflecting effect. It is also difficult to simultaneously ensure a synthetic anti-ferromagnetic structure and electron reflecting effect. Additionally, it was difficult to obtain good soft magnetic characteristics with a bottom spin valve film using an insulator anti-ferromagnetic material such as NiO or $Fe_3O_4$.

Under the circumstances, in magnetoresistance effect elements using a spin valve film, or the like, it is demanded to well maintain the function of the electron reflecting layer interposed in the spin valve film, for example, and to effectively prevent adverse influence to magnetic characteristics and defective deposition of itself.

Magnetoresistance effect elements and their manufacturing methods have been invented, based on recognition of these problems. That is, an object of the invention explained below is to provide a magnetoresistance effect element which has good magnetoresistance effect characteristics, various magnetic characteristics and excellent thermal resistance, and to provide a manufacturing method and a manufacturing apparatus which promise reproducible fabrication of the magnetoresistance effect element. Another object thereof is to provide a magnetoresistance effect element which can be increased in stability as a magnetic head, for example.

Figure 25:
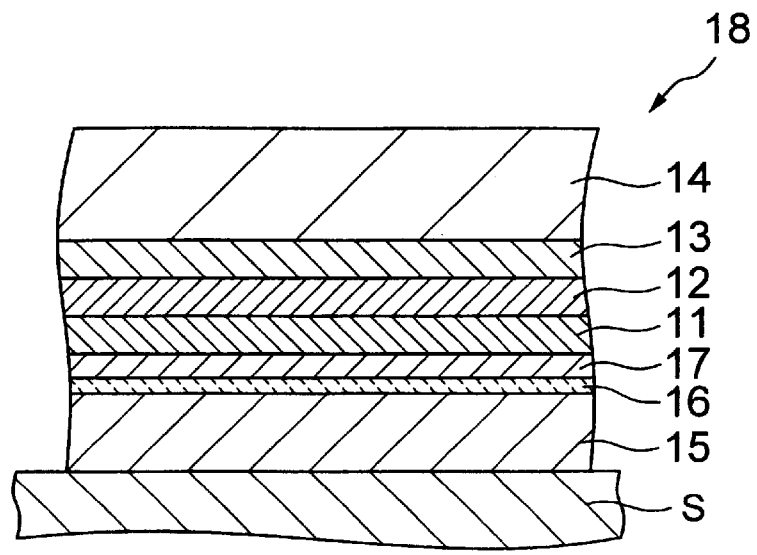
FIG. 25 is a cross-sectional view illustrating a central structure of a MR element according to the second embodiment.

First explained is a magnetoresistance effect element (MR element) according to the second embodiment of the invention. FIG. 25 is a cross-sectional view illustrating a central structure of a MR element according to the second embodiment. In FIG. 25, reference numeral 11 denotes a first magnetic layer, referred to as free layer, in which magnetized orientation changes with an external magnetic field such as signal magnetic field. A second magnetic layer 13 is stacked on the first magnetic layer 11 via a non-magnetic intermediate layer 12.

The second magnetic layer 13 is pinned in magnetization by a bias magnetic field exerted from an anti-ferromagnetic layer made of an anti-ferromagnetic alloy such as IrMn, PtMn, NiMn or FeMn, or an oxide anti-ferromagnetic material such as NiO, CoO or $Fe_2O_3$ stacked thereon. It is a so-called pin layer.

The first magnetic layer 11 may be made as a single magnetic layer such as CoFe magnetic layer, or as a multi-layered structure in which a plurality of magnetic layers are stacked like NiFe/CoFe. In this case, in order to ensure a high spin-dependent scattering effect at the boundary with Cu, Co or Co alloy, such as CoFe, is preferably located along the boundary in contact with the Cu layer, and its thickness is preferably 0.5 nm or more.

The first and second magnetic layers 11, 13 are made up of a ferromagnetic material containing Co or Co alloy, or a ferromagnetic material such as NiFe alloy. Among these materials, Co alloys providing large MR ratio are especially preferable. Usable Co alloys are those made by adding to Co one or more kinds of elements such as Fe, Ni, Au, Ag, Cu, Pd, Pt, Ir, Rh, Ru, Os and Hf by 5 to 50 atomic % approximately. From the viewpoint of obtaining a large MR ratio, it is especially preferable to use Fe and/or Ni as elements to be added. Thicknesses of the first and second magnetic layer 11 and 13 are preferably selected within the range from 1 to 30 nm, in which a large MR ratio is obtained and Barkhausen noise is prevented.

To form the non-magnetic intermediate layer 12 interposed between the magnetic layers 11 and 13, usable materials are: Cu, Au, Ag, or paramagnetic alloys containing them and magnetic elements, Pd, Pt, or alloys containing them as their major component. Thickness of the non-magnetic intermediate layer 12 is preferably determined within the range from 2 to 5 nm, approximately. If thickness of the non-magnetic intermediate layer 12 exceeds 5 nm, sufficient sensitivity to a change of resistance cannot be obtained. If it is thinner than 2 nm, it is difficult to sufficiently reduce exchange coupling between the magnetic layers 11 and 13.

Among these magnetic layers 11, 13, the first magnetic layer as the free layer is preferably made of a Co alloy exhibiting a fcc crystal structure and preferably (111)-oriented normally to the film surface. In this manner, improvement of the film quality of the Co alloy and improvement of soft magnetic characteristics are ensured. Taking it into consideration, preferably formed is a metal base layer 15 which is preferably made of a metal material having fcc structure, such as NiFe alloy, NiFeCo alloy, any of high-resistance alloys made by adding to them appropriate additives such as Ti, V, Cr, Mn, Zn, Nb, Mo, Tc, Hf, Ta, W and Re, or any of Ta, Ti, Cr, Cu, Au, Ag, Ru, Rh, Pd, Ir and Pt, or any of their alloys.

In this manner, smoothness and crystallographic property of an electron reflecting layer formed thereon can be improved. As a result, (111) orientation of the magnetic layer 11 formed thereon can be improved, and improvement of the entire film quality and improvement of soft magnetic characteristics can be realized.

In order to improve wettability with the substrate and stabilize the fcc structure, a material such as Ta, Ti or Cr is preferably applied as a base under the former metal base layer. More specifically, a multi-layered structure including two or more layers, such as Ta/Cu, Ta/NiFe, Ta/Au, Ta/Ru, Ta/Pd, Ta/Pt, Ta/Ir, Ta/Ag, and so forth, can be used as the base. It is important that the Ta layer be stacked nearer to the substrate.

In order to improve the soft magnetic characteristics of the free layer and reduce its magnetic distortion, it is important to control distortion of the crystal lattice in the free layer. For this purpose, the base layer must be controlled in lattice constant. Thus, a multi-layered structure including three layers, such as Ta/Au/Cu, Ta/Ru/Cu or Ta/Ru/Au, can be also used as the base. By stacking two kinds of such fcc materials different in lattice constant and changing the ratio of their film thicknesses, the total lattice contact of the metal base layer can be controlled. As a result, lattice constant of the electron reflecting layer itself can be controlled, and lattice constant of the free layer made in contact therewith can be controlled.

More specifically, a multi-layered structure of Ta (5 nm)/Ru (1 nm)/Cu (1 nm) can be used as the base layer. By employing this structure, it is possible to control lattice distortion by Ru/Cu and obtain soft magnetic characteristics through the electron reflecting layer while maintaining good wettability to the substrate and making a continuous film.

For the purpose of controlling lattice distortion and obtaining soft magnetic characteristics, the use of a multi-layered structure is not indispensable, but the lattice constant may be controlled by alloying. Therefore, a fcc alloy film such as Ta/RuCu can be also used as the base layer.

These base structures can be used also when a ferromagnetic material such as NiFe alloy is used as the first magnetic layer 11.

A non-metal material is preferably used as the electron reflecting layer 16. In this case, good atomic diffusion preventing effect is obtained. Additionally, since the difference in potential from metals is large, the electron mirror-reflecting effect can be introduced more effectively. Moreover, by using a crystalline non-metal material is used, its boundary with the overlying metal layer can be smoothed with a good consistency, and it can be epitaxially grown where appropriate. As a result, not only increased is the electron mirror-reflecting effect but also further improved is the crystallographic property to further improve the heat resistance.

Usable as the component material of the electron reflecting layer 16 are: for example, oxides, nitrides, carbides, borides, fluorides, sulfides and chlorides. These can be used either as a singular or as a mixture or a complex compound. Among them, particularly favorable materials are: self-oxidizing films, surface oxidizing films, passive state films which are readily made and excellent in atomic diffusion preventing function. Although some of those compounds metallically behave, they are usually insulators or high resistors at the room temperature or higher temperatures, and effectively function as the electron reflecting layer 16.

The compound forming the electron reflecting layer 16 may have but need not have stoichiometrically accurate composition. Also, it may form but need not form a well-ordered crystal lattice, and may take an amorphous phase. However, in order to improve the entire crystalline property, it is preferable for the compound to form a well-ordered crystal lattice and maintain partially epitaxial relation with the adjacent metal layer. Furthermore, the electron reflecting layer 16 need not be configured to uniformly cover the metal buffer layer 4, but may be configured to include pin holes or to contain the above-mentioned oxides, nitrides, carbides, borides, fluorides, etc. in form of isles or in a discontinuous state. Also, it may include pin holes, etc. to an extent not giving adverse affection to the electron reflecting effect. Average size of pin holes is preferably approximately the same as or smaller than the distance between every adjacent pin holes.

The electron reflecting layer 16 made of an above-mentioned compound can be readily made by first making the metal base layer 15 and thereafter once exposing its surface to the atmospheric air or exposing it to an atmosphere containing oxygen, nitrogen, carbon, boron, fluorine, chlorine, etc. It can be also made by ion implantation or exposure to plasma. Although the electron reflecting layer 16 may be made by any of the above-mentioned methods, it is especially preferable to employ a method using radicals, which is explained later. The method using radicals promises reproducible deposition of an electron reflecting layer 16 which is uniform and excellent in surface smoothness.

Surface of the electron reflecting layer 16 (more specifically, its boundary with a metal barrier layer 7 explained later) is preferably excellent in smoothness to more effectively obtain the electron mirror-reflecting effect. Its concrete surface roughness (boundary roughness) is preferably not larger than 2 nm in mean roughness Ra. The method using radicals ensures reproducible fabrication of the electron reflecting layer 16 with excellent smoothness.

In the case where the electron reflecting layer 16 is made by oxidizing the surface of the metal base layer 5 made of a NiFe alloy, for example, since the electron reflecting layer 16 contains a magnetic material such as NiO and FeO, there is the possibility that induced magnetic anisotropy of the first magnetic layer 11 increases to 10 Oe or more, or magnetic distortion increases to 1 ppm or more. Especially when the first magnetic layer 11 is made of a Co alloy, for example, these possibilities increase.

Taking it into consideration, a metal barrier layer 7 is interposed between the electron reflecting layer 16 and the first magnetic layer as the free layer. By inserting the metal barrier layer 17 between the electron reflecting layer 16 and the first magnetic layer 11 and cutting their magnetic interaction, increase of induced magnetic anisotropy and magnetic distortion of the first magnetic layer 11 can be prevented.

In order to cut magnetic interaction between the electron reflecting layer 16 and the first magnetic layer 11, the metal barrier layer 17 is preferably made of a non-magnetic metal material. The non-magnetic metal material forming the metal barrier layer 17 is not limited to a specific material, but may be selected from various kinds of non-magnetic metal materials. However, particularly preferable materials are: metals, such as Sc, Ti, Cu, Zn, Y, Zr, Ru, Rh, Pd, Ag, Cd, Re, Os, Ir, Pt, Au, Tl and Pb, and non-magnetic alloys containing them.

A low-resistance substance having a long mean free path is recommended as the material of the metal barrier layer 17 to effectively introduce mirror reflection of electrons. Its thickness (average thickness) is preferably not larger than 3 nm from the viewpoint of alleviating the decrease in resistance changing ratio by shunt diversion. On the other hand, if it is excessively thin, it may fail to sufficiently attain the above-explained effects. Thus, its thickness is preferably not smaller than 0.5 nm. However, in the case where an element for higher resistance is added to increase the resistance of the metal barrier layer 17, if it is advantageous against shunt diversion, but disadvantageous for mirror reflection of electrons. Therefore, it is not always recommended. Average thickness of the metal barrier layer 17 is more preferably held within the range from 1 to 3 nm, and the range from 1 to 2 nm is especially preferable.

Since the metal barrier layer 17 is located between the electron reflecting layer 16 and the first magnetic layer 11, the sum of thicknesses (average thicknesses) of the metal barrier layer 17 and the first magnetic layer 11 is preferably not larger than 10 nm.

By optimizing the material, thickness and structure of the metal barrier layer, current magnetic field applied to the free layer can be controlled as well.

In the case where a spin valve film is used as a sensor device such as a head, for the purpose of reducing noise and increase the sensitivity, it is preferable to change the free layer into a single domain, suppress Barkhausen noise and add an external magnetic field normally to the magnetization. In order to enable discrimination of the direction of the magnetic field, increase the sensitivity and improve the linearity to the external magnetic field, magnetization of the pin layer and magnetization of the free layer preferably intersect when the external magnetic field is zero.

If the requirement is not satisfied, dynamic range decreases, and linearity to external magnetic field deteriorates. If it is used in this state is used as a sensor device of a head, absolute values of outputs responsive to positive and negative signals differ from each other, and output symmetry deteriorates. Deterioration of output symmetry invites an increase of errors upon reading signals from a disk. Therefore, it is very important to ensure that magnetization of the free layer and magnetization of the pin layer intersect when the external magnetic field is zero. Designing to establish intersecting relation under zero external magnetic field is usually called design of bias point.

In order to design bias point in a micro-miniaturized spin valve element, it is preferable to diminish all of the torque applied to the free layer from the pin layer by magnetostatic coupling, torque applied by exchange coupling via the pin layer and the intermediate non-magnetic layer of the free layer, torque from the current magnetic field generated by a sense current and torque generated by a magnetic field from a hard film for establishing a single domain, and to cancel them mutually.

For this purpose, it is preferable that the current magnetic field by the sense current can be optimized. Therefore, distribution of a current flowing in the spin valve film in the thickness direction of the film must be designed appropriately. More specifically, since the magnetic field generated by a current flowing in the location nearer to the substrate than the free layer and the magnetic field generated by a current flowing in a location remoter from the substrate than the free layer are oppositely oriented, both can cancel them mutually. Therefore, in order to bring the current magnetic field applied to the free layer closer to zero, it is desirable to design so that these two current amounts be substantially equal. However, in a typical construction of the free layer, more current flows in the location nearer to the pin layer with respect to the free layer, and larger current magnetic field is inevitably generated.

Since deviation of the bias point by a current magnetic field becomes larger as the free layer is made thinner, along with the progress in thinning Mst of the free layer for a higher sensitivity, mutual cancellation of current magnetic fields becomes more and more important.

Taking account of it, the metal barrier layer can be used to increase the current in one side of the free layer remoter from the pin layer. Especially by direct contact with the electron reflecting layer, boundary scattering is suppressed, and a sufficient current can be made in the metal barrier layer, although it is thin. Therefore, the metal barrier layer can be used as a good current magnetic field control layer.

When it is used for this purpose, a metal having a long mean free path, such as Cu, Au and Ag, can be used as its material. Thickness thereof can be designed to establish the intersecting relation of the current magnetic field applied to the free layer by flowing a sense current during operation in a head structure. In a practical example, the thickness is preferably determined in the range from 0.5 nm to 5 nm.

Thickness of the electron reflecting layer 16 is preferably not larger than, for example, 3 nm in average thickness, to maintain information on crystal growth (information on crystalline orientation, crystal grain size, etc.), for example, of the metal base layer 15 to an extent and to perform the role of transmitting it to the metal barrier layer and further to the first magnetic layer 11. However, if it is excessively thin, it will lose its function as the atomic diffusion barrier and the electron mirror-reflecting layer. Therefore, its thickness is preferably not smaller than 0.5 nm in average thickness.

The diffusion preventing/electron reflecting layer 16 as thick as mentioned above is magnetically unstable and weak even when it contains a magnetic material. therefore, it is possible to use a magnetic metal material as the metal barrier layer 17, where appropriate. Preferably used as the metal barrier layer 17 made of a magnetic metal material is Ni, or Ni alloy such as NiFe, or an alloy prepared by adding another element (other than Co) to any of them from the viewpoint of preventing an increase in anisotropy and magnetic distortion.

The spin valve 18 has any of the above-explained structures. In a MR element including such a spin valve film 18, the second magnetic layer 13 is pinned in magnetization whereas the first magnetic layer 11 changes in magnetized orientation in response to an external magnetic field. Therefore, these two magnetic layer 11 and 13 located at opposite sides of the non-magnetic intermediate layer 12 change in relative angle between their magnetized orientations, and a magnetic resistance effect is obtained accordingly.

The above-explained spin valve film 18 is made on an insulator substrate, like thermal oxide Si substrate or $Al_2O_3$-added $Al_2O_3$-TiC substrate. Surface oxide layers of these insulator substrate should be distinguished from the diffusion preventing/electron reflecting layers according to the invention. That is, according to the invention, the diffusion preventing/electron reflecting layer is made independently from the surface oxide layer of the substrate, and it forms a part of the spin valve film 18.

In the MR element according to the above-explained embodiment, since the diffusion preventing/electron reflecting layer 16 made of an oxide, nitride, carbide, boride, fluoride, etc. is interposed between the first magnetic layer and the metal be layer 15, it is possible to stably prevent inter-diffusion of atoms between he first magnetic layer and the metal base layer during intersection annealing or annealing for crystallographic improvement, and to improve MR ratio by electron mirror-reflecting effect.

Since the structure further includes the metal barrier layer 7 interposed between the first magnetic layer and the diffusion preventing/electron reflecting layer 16, magnetic interaction between the electron reflecting layer 16 and the first magnetic layer 11 can be cut, and magnetic distortion of the first magnetic layer 11 and increase of the induced magnetic anisotropy can be prevented. This nature greatly contributes to improvement the stability when the MR element is used as a magnetic head.

Figure 26:
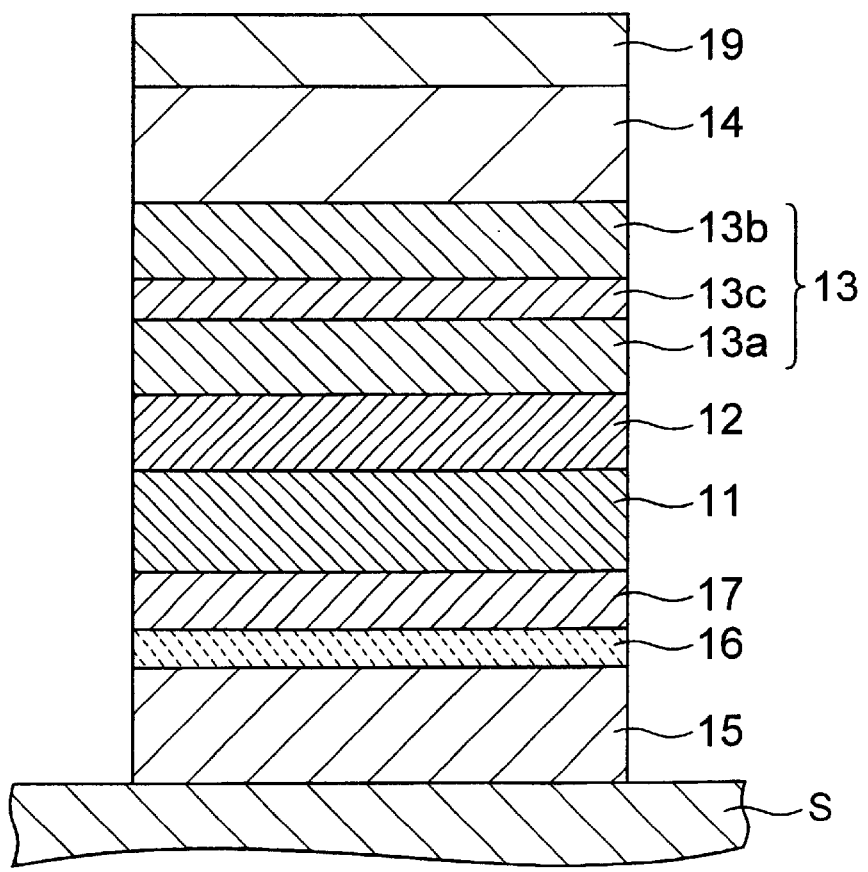
FIG. 26 is a cross-sectional view including a synthetic structure.

In the present invention, as shown in FIG. 26, the magnetization-pinned layer of the second magnetic layer as the pin layer may include a synthetic structure made up of first and second ferromagnetic films 13a, 13b antiferromagnetically coupled to each other, and a film 13c anti-ferromagnetically coupled to separate these two ferromagnetic films. By combining it with a synthetic structure, magnetostatic coupling between the pin layer 13 and the free layer 11 can be decreased, and a sensitive structure with a small Mst product of the free layer 11 can be used as a sensor of a reproducing magnetic head. In FIG. 26, numeral 19 denotes an optional protective coat.

Especially when the synthetic structure used in the pin layer, leak magnetic field from the pin layer can be reduced from the viewpoint of designing the bias point. Therefore, stable design of the bias point is possible while increasing the sensitivity by using the free layer with a smaller Mst, rather than controlling the intensity of a current magnetic field applied to the free layer by the metal barrier layer.

Figure 27:
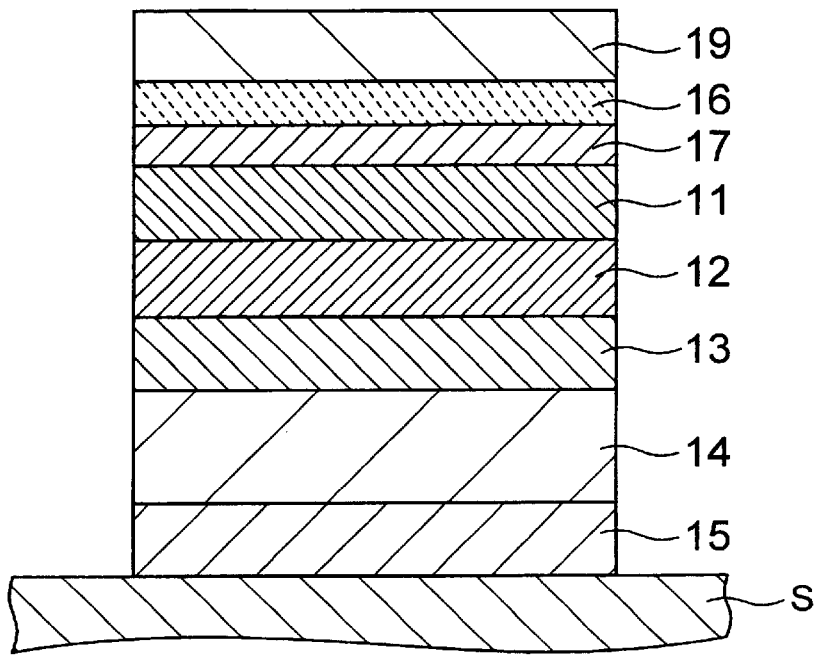
FIGS. 27 and 28 schematically show the cross-sectional view of bottom-type structures.
Figure 28:
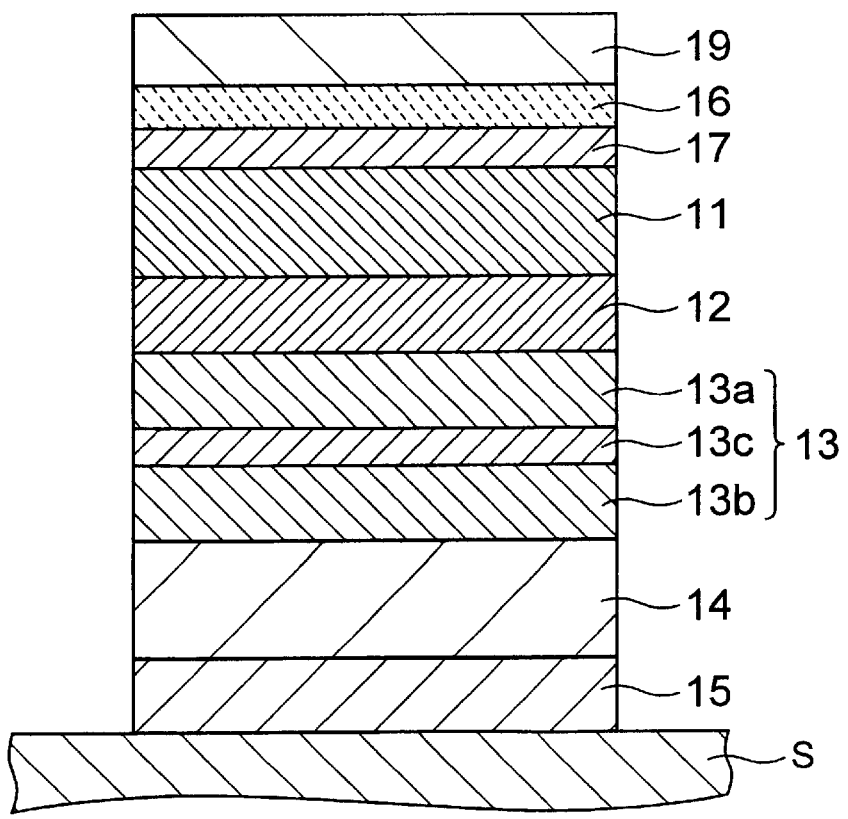

Moreover, as shown in FIG. 25 and FIG. 26, the invention can employ a top structure in which the free layer 11 is located nearer to the substrate S than the pin layer 13. However, as shown in FIGS. 27 and 28, it is also possible to employ a bottom-type structure in which, to the contrary, the pin layer 13 is located nearer to the substrate S than the free layer 11. In this manner, any appropriate structure can be selected depending on the head structure.

Heretofore, the magnetoresistance effect element according to the second embodiment has been explained. Also in the second embodiment, the use of the crystal growth controlling layer explained with the first embodiment is more desirable.

Figure 29:
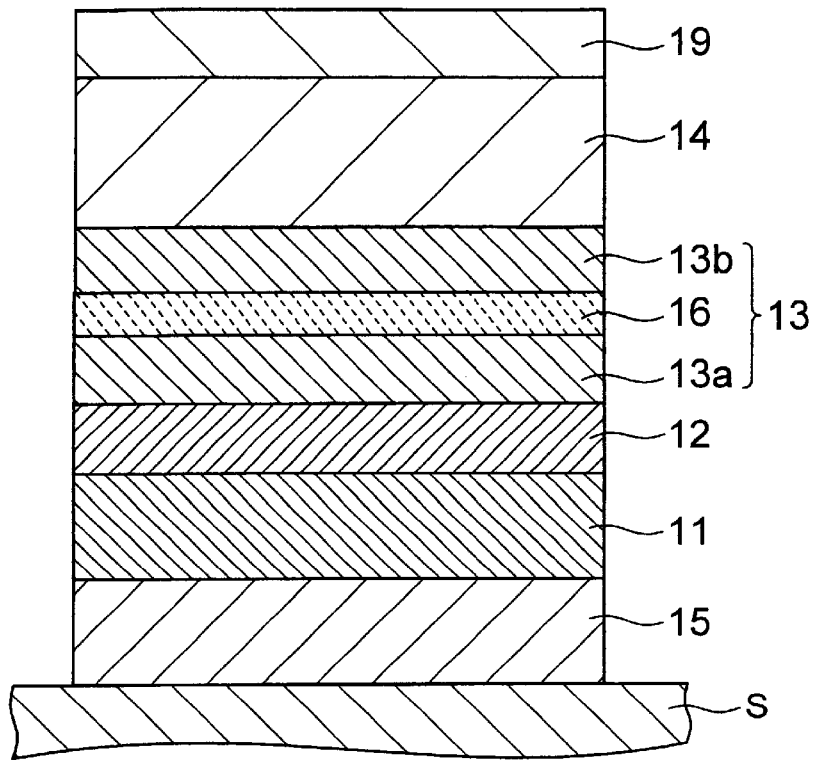
FIG. 29 is a cross-sectional view illustrating a central structure of the MR element according to the third embodiment.

Next explained is a magnetoresistance effect element (MR element) according to the third embodiment of the invention. FIG. 29 is a cross-sectional view illustrating a central structure of the MR element according to the third embodiment. In FIG. 29, reference numeral 11 denotes a first magnetic layer, referred to as free layer, in which magnetized orientation changes with an external magnetic field such as signal magnetic field. A second magnetic layer 13 is stacked on the first magnetic layer 11 via a non-magnetic intermediate layer 12. The second magnetic layer 13 is pinned in magnetization by a bias magnetic field exerted from an anti-ferromagnetic layer made of an anti-ferromagnetic alloy such as IrMn, PtMn, NiMn or FeMn, or an oxide anti-ferromagnetic material such as NiO, CoO or $Fe^2O_3$ stacked thereon. It is a so-called pin layer. A metal base layer 15 is further provided in contact with the substrate S to improve the entire crystalline property.

The magnetoresistance effect element shown here is characterized in interposing the electron reflecting layer 16 in an intermediate position in the second magnetic layer 13 as the pin layer. That is, in the spin valve film shown in FIG. 29, the second magnetic layer 13 as the pin layer has a multi-layered structure including a magnetic layer 13a on an electron reflecting layer 16 on a magnetic layer 13b. The magnetic layer 13a is in contact with a non-magnetic intermediate layer, and behaves as the pin layer causing GMR effect. The electron reflecting layer 16 bears the role of not only preventing deterioration of the magnetoresistance effect derived from atomic diffusion by heat but also mirror-reflecting conduction electrons injected from the magnetic layer 13a to virtually increase the mean free path of electrons and thereby increase the MR ratio. The magnetic layer 13b is in contact with an anti-ferromagnetic material so as to be pinned in magnetized orientation by a unidirectional anisotropic magnetic field.

While using a metal-based anti-ferromagnetic material promising better magnetization-pinned characteristics according to the above-explained structure, an effect of increasing MR by the electron reflecting effect can be attained. the first magnetic layer 11 and the second magnetic layer 13a are made up of a ferromagnetic material containing Co or Co alloy, or a ferromagnetic material such as NiFe alloy. Among these materials, Co alloys providing large MR ratio are especially preferable. Usable Co alloys are those made by adding to Co one or more kinds of elements such as Fe, Ni, Au, Ag, Cu, Pd, Pt, Ir, Rh, Ru, Os and Hf by 5 to 50 atomic % approximately. From the viewpoint of obtaining a large MR ratio, it is especially preferable to use Fe and/or Ni as elements to be added.

In order to ensure that magnetization of the pin layer does not increase too much while obtaining a large MR effect, the magnetic layer 13a may be made as a multi-layered structure such as NiFe/CoFe or NiFe/Co. In this case, for the purpose of increasing the spin-dependent scattering effect at the boundary with Cu, Co or Co alloy like CoFe is preferably located along the boundary in contact with the Cu layer, and its thickness is preferably as thick as 0.5 nm or more. In order to ensure that magnetization of the pin layer does not become too large, the thickness is preferably determined not to exceed 3 nm. For effective use of the electron reflecting effect by the electron reflecting layer, the total thickness of 13a is preferably not larger than the mean free path of the magnetic material, namely, not larger than 10 nm.

Material of the magnetic layers 13b and 13a in contact with the anti-ferromagnetic material may be but need not be identical. Since the magnetic layer 13b does not contribute to the MR effect but contributes to diversion of a sense current, surface resistance of the magnetic layer 13b is preferably set as high as possible. Therefore, preferably used as the material of the magnetic layer 13b is a high resistance material made by adding Cr, Nb, B, Rh, or the like, to a Co or Ni alloy. For the magnetic layer 13b not contributing to the GMR effect, a Co alloy with high saturation magnetization need not be used, but a Ni alloy with smaller saturation magnetization may be used. In this manner, unidirectional anisotropic magnetic field of the pin layer can be increased as large as possible, and operation of the spin valve can be stabilized.

Since the magnetic layer 13b does not contribute to the MR effect but contributes to diversion of a sense current, it functions to decrease the entire MR ratio. To minimize diversion of a sense current and prevent a decrease in MR ratio, electron reflection factor is preferably minimized between the magnetic layer 13b and the electron reflecting layer 16. If electron reflection effect occurs at the boundary, the mean free path for effective electrons increases, and the diverted current increases. For the same purpose, electron reflection factor may be decreased by inserting in the boundary a material such as Ta, Cr or Ti, for example, which exhibits a small electron reflection effect.

The first magnetic layer 11 may be made of a single magnetic layer such as CoFe magnetic layer, or may be made of a plurality of stacked layers, such as NiFe/CoFe. In this case, for the purpose of increasing the spin-dependent scattering effect at the boundary with Cu, Co or Co alloy such as CoFe is preferably placed at the boundary in contact with the Cu layer, and its thickness is preferably as thick as 0.5 nm or more.

Thickness of the first magnetic layer 11 is preferably chosen in the range from 1 to 30 nm, promising large MR ratio and capable of preventing Barkhausen noise. Thickness of the magnetic layer 13a is preferably thinner to ensure effective use of the electron reflection effect. More specifically, its thickness should e thinner than the mean free path of electrons in the magnetic material. In this respect, if a Co alloy or Ni alloy is used, its thickness is preferably not larger than 10 nm. More preferably, by setting the thickness not larger than 3 nm, large MR effect can be obtained.

Thickness of the magnetic layer 13b is preferably as thin as possible to minimize the diversion effect of the sense current and increase the MR effect. Also for minimizing the Mst product of the pin layer and increasing the unidirectional anisotropic magnetic field, the thickness is preferably as thin as possible. Taking account of it, it is preferably not larger than 5 nm, and more preferably not larger than 3 nm.

A non-metal material is preferably used as the electron reflecting layer 16 to obtain a good effect of preventing atomic diffusion. Additionally, since a large potential difference from a metal is obtained, the electron mirror-reflection effect can be used more effectively. Moreover, by using a crystalline non-metal material, its boundary with a overlying metal layer can be smoothed with a good consistency, and it can be epitaxially grown where appropriate. As a result, not only increased is the electron mirror-reflecting effect but also further improved is the crystallographic property to further improve the heat resistance.

Usable as the component material of the electron reflecting layer 16 are: for example, oxides, nitrides, carbides, borides, fluorides and chlorides. These can be used either as a singular or as a mixture or a complex compound. Among them, particularly favorable materials are: self-oxidizing films, surface oxidizing films, passive state films which are readily made and excellent in atomic diffusion preventing function.

If a non-magnetic material is used as the electron reflecting film, average thickness of the diffusion preventing layer should not exceed 2 nm. If average thickness of the electron reflecting layer exceeds 2 nm, magnetic coupling between the magnetic layers 13a and 13b forming the pin layer is cut, and the effect of the spin valve film as the pin layer is lost. Usable as the electron reflecting film of a non-magnetic material are: $Al_2O_3$, MgO and $SiO_2$, for example.

In the case where a non-metal material containing a 3d transitional element or lanthanoid is used as the electron reflecting layer, thickness of the electron reflecting layer is not thicker than 3 nm. In this case, magnetic coupling between the magnetic layers 13a, 13b forming the pin layer is not cut even when the thickness exceeds 2 nm because the electron reflecting layer itself has a spin. However, if thickness of the electron reflecting layer exceeds 3 nm, magnetic coupling between the magnetic layers 13a, 13b forming the pin layer is cut, and the function of the spin valve as the pin layer is lost. Usable non-metal materials containing a 3d transitional element or lanthanoid are: CoO, FeO and GdO, for example.

When a ferromagnetic material or anti-ferromagnetic material is used as the electron reflecting film, average thickness of the electron reflecting layer is 10 nm or less. In this case, magnetic coupling between the magnetic layers 13a, 13b forming the pin layer is not cut even when thickness of the electron reflecting layer exceeds 2 nm because it is maintained through the magnetism of the electron reflecting layer. However, if it exceeds 10 nm, magnetic stability deteriorates, and magnetic characteristics of the electron reflecting layer come to the front. Therefore, this range of thickness is not desirable for use as a practical element. By setting the thickness preferably not thicker than 5 nm, stable magnetic coupling is obtained. Usable as the electron reflecting film having ferromagnetism are: ferrites represented by $Fe_{3,4}$, ferrite alloys made by adding to them Co, Ni, Mn, Cu, or the like, $CrO_2$ and $Cr_2O_3$, for example. Usable as the electron reflecting film having anti-ferromagnetism are: NiO, CoO, and $Fe_2O_3$, for example.

The compound forming the electron reflecting layer 16 may have but need not have stoichiometrically accurate composition. Also, it may form but need not form a well-ordered crystal lattice, and may take an amorphous phase. However, in order to improve the entire crystalline property, it is preferable for the compound to form a well-ordered crystal lattice and maintain partially epitaxial relation with the adjacent metal layer. Furthermore, the electron reflecting layer 16 need not be configured to uniformly cover the metal buffer layer 4, but may be configured to include pin holes or to contain the above-mentioned oxides, nitrides, carbides, borides, fluorides, etc. in form of isles or in a discontinuous state. Also, it may include pin holes, etc. to an extent not giving adverse affection to the electron reflecting effect. Average size of pin holes is preferably approximately the same as or smaller than the distance between every adjacent pin holes.

The electron reflecting layer 16 made of an above-mentioned compound can be readily made by first making the metal base layer 13a and thereafter once exposing its surface to the atmospheric air or exposing it to an atmosphere containing oxygen, nitrogen, carbon, boron, fluorine, chlorine, sulfur etc. It can be also made by ion implantation or exposure to plasma. Although the electron reflecting layer 16 may be made by any of the above-mentioned methods, it is especially preferable to employ a method using radicals, which is explained later. The method using radicals promises reproducible deposition of an electron reflecting layer 16 which is uniform and excellent in surface smoothness. Surface of the electron reflecting layer 16 is preferably excellent in smoothness to more effectively obtain the electron mirror-reflecting effect. Its concrete surface roughness (boundary roughness) is preferably not larger than 2 nm in mean roughness Ra.

Used as the non-magnetic intermediate layer 12 located between the magnetic layers 11 and 13 is Cu. Au, Ag or any of their alloys, for example. Thickness of the non-magnetic intermediate layer 12 is preferably set in the range from 2 to nm, approximately. If the thickness of the non-magnetic intermediate layer 12 exceeds 5 nm, sufficient sensitivity to changes in resistance is not obtained. I it is thinner than 2 nm, it is difficult to sufficiently reduce the exchange coupling between the magnetic layers 11 and 13.

Among these magnetic layers 11, 13a, 13b, the first magnetic layer as the free layer is preferably made of a Co alloy exhibiting a fcc crystal structure and preferably (111)-oriented normally to the film surface. In this manner, improvement of the film quality of the Co alloy and improvement of soft magnetic characteristics are ensured. Taking it into consideration, preferably formed is a metal base layer 15 which is preferably made of a metal material having fcc structure, such as NiFe alloy, NiFeCo alloy, any of high-resistance alloys made by adding to them appropriate additives such as Ti, V, Cr, Mn, Zn, Nb, Mo, Tc, Hf, Ta, W and Re, or any of Ta, Ti, Cr, Cu, Au, Ag, Ru, Rh, Pd, Ir and Pt, or any of their alloys.

In order to improve wettability with the substrate and stabilize the fcc structure, a material such as Ta, Ti or Cr is preferably applied as a base under the former metal base layer. More specifically, a multi-layered structure including two or more layers, such as Ta/Cu, Ta/NiFe, Ta/Au, Ta/Ru, Ta/Pd, Ta/Pt, Ta/Ir, Ta/Ag, and so forth, can be used as the base. It is important that the Ta layer be stacked nearer to the substrate.

In order to improve the soft magnetic characteristics of the free layer and reduce its magnetic distortion, it is important to control distortion of the crystal lattice in the free layer.

For this purpose, the base layer must be controlled in lattice constant. Thus, a multi-layered structure including three layers, such as Ta/AuCu, Ta/Ru/Cu or Ta/Ru/Au, can be also used as the base.

More specifically, a multi-layered structure of Ta (5 nm)/Ru (1 nm)/Cu (1 nm) can be used as the base layer. By employing this structure, it is possible to control lattice distortion by Ru/Cu and obtain soft magnetic characteristics through the electron reflecting layer while maintaining good wettability to the substrate and making a continuous film.

For the purpose of controlling lattice distortion and obtaining soft magnetic characteristics, the use of a multi-layered structure is not indispensable, but the lattice constant may be controlled by alloying. Therefore, a fcc alloy film such as Ta/RuCu can be also used as the base layer.

These base structures can be used also when a ferromagnetic material such as NiFe alloy is used as the first magnetic layer 11.

The non-magnetic buffer layer may be used to increase the current on one side remoter from the pin layer as viewed from the free layer. Therefore, a metal barrier layer can be used as a good current magnetic field control layer. By selecting an appropriate material and an appropriate thickness, it is possible to cancel the current magnetic field generated by a current in one side of the free layer nearer to the pin layer and to change it to a SV film free of current magnetic field.

Figure 30:
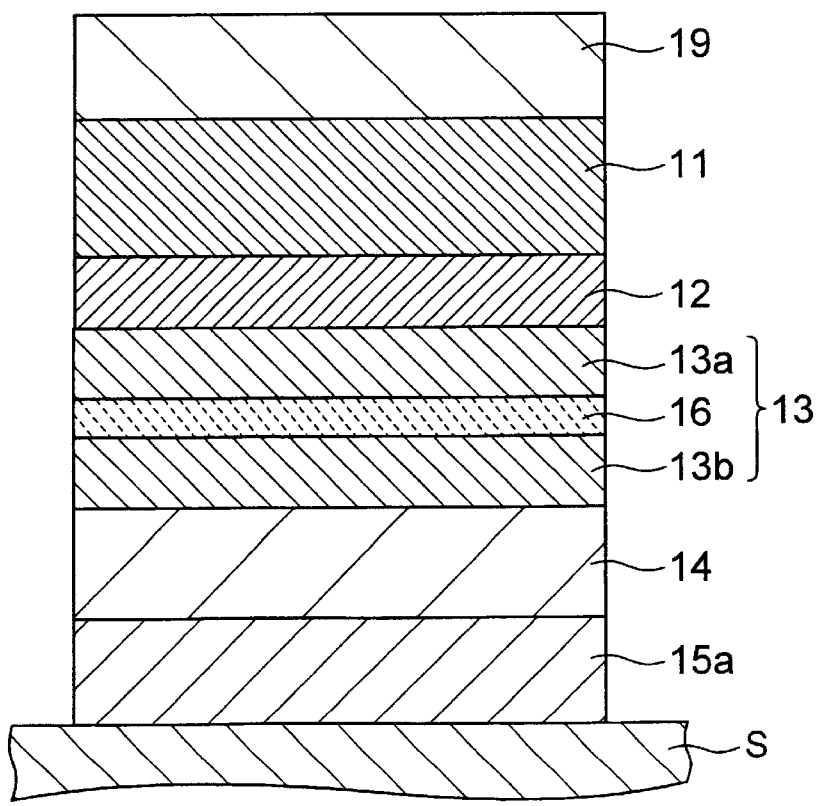
FIG. 30 schematically shows the cross-sectional view of bottom-type structure.

Moreover, as shown in FIG. 29, the invention can employ a top structure in which the free layer 11 is located nearer to the substrate S than the pin layer 13. However, it is also possible to employ a bottom structure as shown in FIG. 30 in which, to the contrary, the pin layer 13 is located nearer to the substrate S than the free layer 11. Any appropriate structure can be selected depending on the head structure.

When a bottom structure is employed, the metal base 15a used as the base layer of the anti-ferromagnetic material is preferably made of a material which makes the entire film be (111)-oriented, improve the film quality and improve the soft magnetic characteristics. Taking it into consideration, preferably formed is a metal base layer 15 which is preferably made of a metal material having fcc structure, such as NiFe alloy, NiFeCo alloy, any of high-resistance alloys made by adding to them appropriate additives such as Ti, V, Cr, Mn, Zn, Nb, Mo, Tc, Hf, Ta, W and Re, or any of Ta, Ti, Cr, Cu, Au, Ag, Ru, Rh, Pd, Ir and Pt, or any of their alloys.

In order to improve wettability with the substrate and stabilize the fcc structure, a material such as Ta, Ti or Cr is preferably applied as a base under the former metal base layer. More specifically, a multi-layered structure including two or more layers, such as Ta/Cu, Ta/NiFe, Ta/Au, Ta/Ru, Ta/Pd, Ta/Pt, Ta/Ir, Ta/Ag, and so forth, can be used as the base. It is important that the Ta layer be stacked nearer to the substrate.

Furthermore, in order to realize good pin-fixing characteristics, small exchange coupling between the in layer and the free layer and good soft magnetism, it is important to control crystal lattice distortion of the anti-ferromagnetic layer. To do so, lattice constant of the base layer must be controlled. For this purpose, a triple-layered structure such as Ta/Au/Cu, Ta/Ru/Cu, Ta/Ru/Au, or the like, can be also used as the base.

More specifically, a multi-layered structure of Ta (5 nm)/Ru (1 nm)/Cu (1 nm) can be used as the base layer. By employing this structure, it is possible to control lattice distortion by Ru/Cu and obtain soft magnetic characteristics through the electron reflecting layer while maintaining good wettability to the substrate and making a continuous film.

For the purpose of controlling lattice distortion and obtaining soft magnetic characteristics, the use of a multi-layered structure is not indispensable, but the lattice constant may be controlled by alloying. Therefore, a fcc alloy film such as Ta/RuCu can be also used as the base layer.

These base structures can be used also when a ferromagnetic material such as NiFe alloy is used as the first magnetic layer 11.

Figure 31:
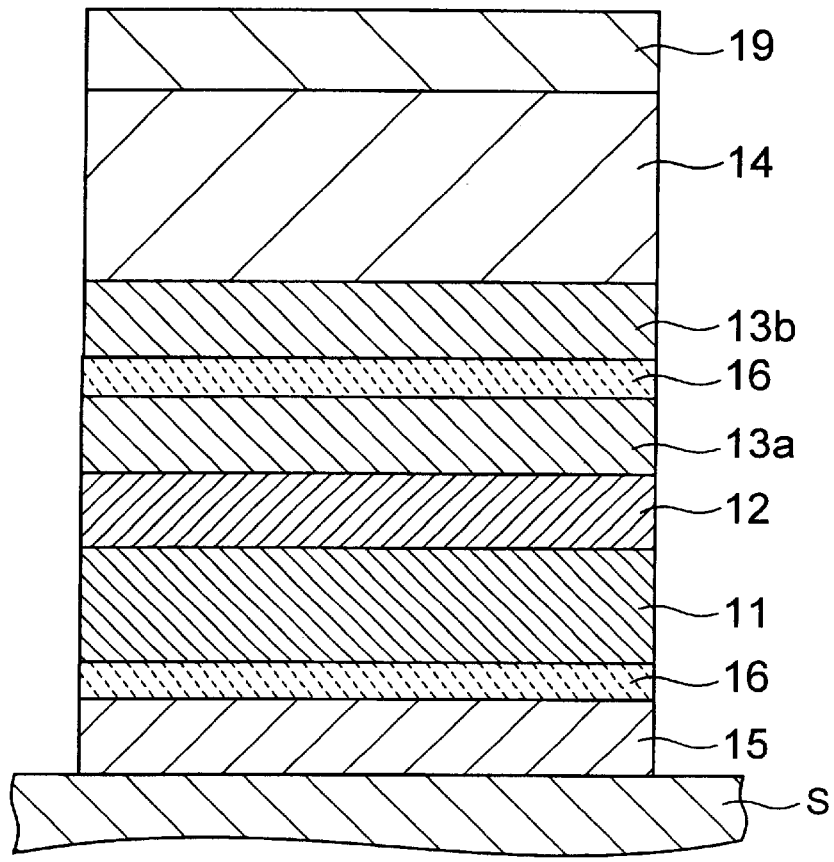
FIG. 31 shows the cross-sectional view of another structure in which the electron reflecting film 16 is made adjacent to the free layer 11.

In the present invention, another electron reflecting film 16 can be made adjacent to the free layer 11 as shown in FIG. 31. By providing electron reflecting layers 16 to both the pin layer 13 and the free layer 11, electron reflection is brought about at both surfaces to ensure both a large MR ratio and good magnetization-pinned characteristics.

Thickness of the electron reflecting layer 16 adjacent to the free layer 11 is preferably not larger than 3 nm. If the thickness of the electron reflecting layer 16 exceeds 3 nm, soft magnetic characteristics deteriorate due to lattice distortion. When a bottom structure is employed, if the thickness of the electron reflecting film 16 exceeds 3 nm, its contact resistance with an electrode for a sense current made above the free layer 11 increases, and it makes difficult to obtain a good electric contact. Therefore, the performance as a sensor deteriorates. When a top structure is employed, if the thickness of the electronic reflecting layer 16 exceeds 3 nm, then the information on crystal growth stops there. As a result, it becomes difficult to obtain good crystalline property of the entire film, (111) orientation, and so forth, and soft magnetic characteristics, etc. deteriorate.

Figure 32:
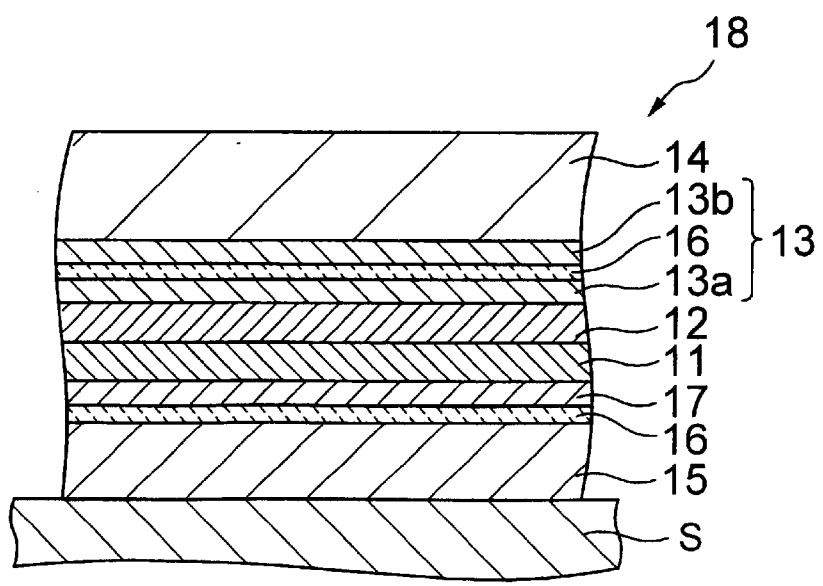
FIG. 32 shows the cross-sectional view of another structure in which a metal barrier layer 17 may be made in combination.

On the part of the free layer 11, a metal barrier layer 17 may be made in combination as shown in FIG. 32. In this manner, it is possible to realize both good MR characteristics and soft magnetic characteristics.

In this case, both a magnetic buffer layer and a metal barrier layer may be used to increase the current on one side remoter from the pin layer as viewed from the free layer. The total current magnetic field from these two layers cancel the current generated in the other side nearer to the pin layer as viewed from the free layer, and can change it to a SV (spin valve) film free of current magnetic field.

However, depending on the case, it may be desired to positively use the current magnetic field from the part of the pin to stabilize the magnetic domain. In this case, these two films are preferably as small as possible to prevent a current from flowing there. Additionally, a high-resistance is preferably used as the material of the metal buffer layer. At the boundary between the metal buffer layer and the electron reflecting layer, the electron reflection effect had better be small to decrease the current shunt. For this purpose, a material with a small electron reflecting effect, such as Ta, Cr, Ti, may be inserted at the boundary between the metal buffer layer and the electron reflecting layer to deteriorate the electron reflection factor.

Figure 33:
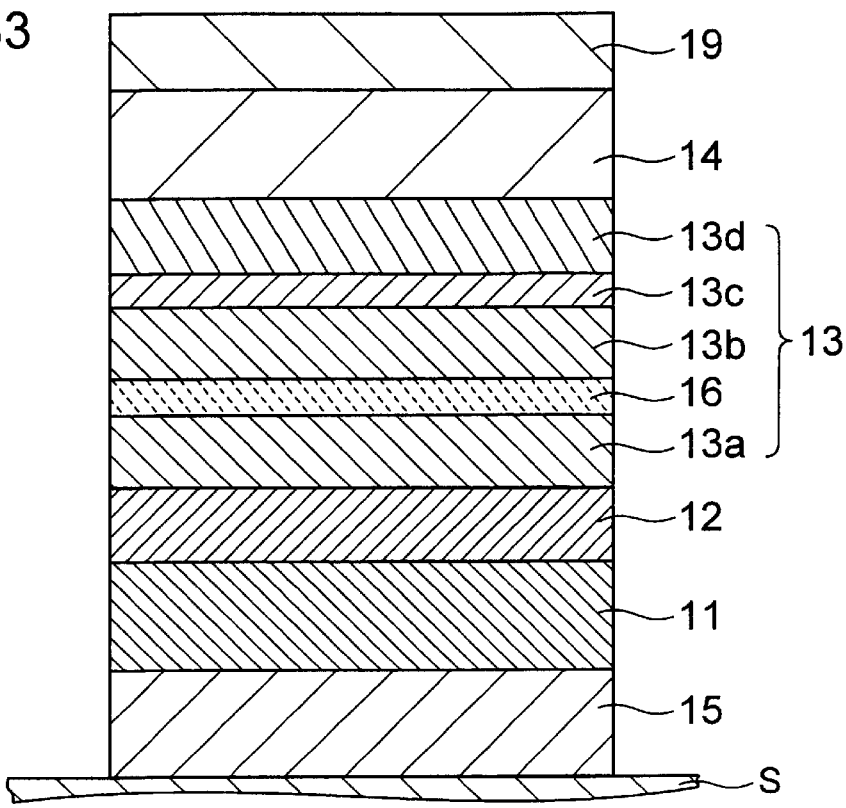
FIG. 33 shows the cross-sectional view of another structure in which the magnetization-pinned layer of the second magnetic layer 13 as the pin layer may have a synthetic structure made up of first and second ferromagnetic film 13b, 13d anti-ferromagnetically coupled to each other, and a film 13c anti-ferromagnetically coupled to separate these two magnetic films.

In the embodiment shown here, as shown in FIG. 33, the magnetization-pinned layer of the second magnetic layer 13 as the pin layer may have a synthetic structure made up of first and second ferromagnetic film 13b, 13d anti-ferromagnetically coupled to each other, and a film 13c anti-ferromagnetically coupled to separate these two magnetic films.

That is, in the spin valve film shown in FIG. 33, the second magnetic layer 13 as the pin layer has a multi-layered structure configured as the magnetic layer 13a/electron reflecting layer 16/magnetic layer 13b/Ru layer 13c/ magnetic layer 3d. The magnetic layer 13a is in contact with the non-magnetic intermediate layer 12 and functions as a pin layer bringing about GMR effect. The electron reflecting layer 16 bears the role of not only preventing deterioration of the magnetoresistance effect attendant to atomic diffusion by heat, but also mirror-reflecting conduction electrons injected from the magnetic layer 13a to virtually increase the mean free path of electrons and thereby increase the MR ratio. The magnetic layer 13b is in contact with Ru and bears the role of anti-ferromagnetically couple with the magnetic layer 13d via the Ru layer 13c. the magnetic layer 13d is in contact with the anti-ferromagnetic layer 14 so as to be pinned in magnetized orientation by a unidirectional anisotropic magnetic field.

As to positional relation between the Ru layer 13c and the electron reflecting layer 16, the electron reflecting 16 is preferably located nearer to the intermediate non-magnetic layer 12 as shown in FIG. 33. In this manner, by bringing the position where electron reflection occurs nearer to the intermediate non-magnetic layer 12 so as to obtain a large electron reflection effect. Additionally, such placement ensures electron reflection without inviting undesirable electron scattering in the Ru layer 13c or at the boundary between the magnetic layer and the Ru layer, and hence promises a large MR ratio. However, it is not impossible to locate the Ru layer 13c nearer to the intermediate non-magnetic layer 12.

By combining the synthetic structure in this manner, magnetostatic coupling between the pin layer 13 and the free layer 11 can be reduced, and a highly sensitive structure with a small Mst product of the free layer 11 can be used as a sensor like a reproducing magnetic head.

In order to minimize magnetostatic field from the pin layer, the sum of the Mst product of the magnetic layer 13a and the Mst product of the magnetic layer 13b is preferably equalized to the Mst product of the magnetic layer 13d as far as possible.

Material of the magnetic layers 13b, 13d may be but need not be identical to that of 13a. Since the magnetic layers 13b, 13d do not contribute to the MR effect but contribute to diversion of a sense current, their surface resistance is preferably set as high as possible. Therefore, preferably used as the material of the magnetic layers 13b, 13d is a high resistance material made by adding Cr, Nb, B, Rh, or the like, to a Co or Ni alloy. For the magnetic layers 13b, 13d not contributing to the GMR effect, a Co alloy with high saturation magnetization need not be used, but a Ni alloy with smaller saturation magnetization may be used. In this manner, operation of the spin valve can be stabilized while maintaining well-balanced magnetization of the synthetic structure.

In order to maximize the MR effect, thickness of the magnetic layer 13a is preferably thin enough to ensure effective use of the electron reflection effect. More specifically, it should be thinner than the mean free path of electrons in the magnetic material. Therefore, is a Co alloy or Ni alloy is used, the thickness is preferably not thicker than 10 nm. More preferably, by making it as thin as 3 nm or less, large MR effect can be obtained.

Thickness of the magnetic layer 13b is preferably as thin as possible to minimize the diversion effect of the sense current and increase the MR effect. To reduce leakage of magnetostatic field with minimum Mst product of the magnetic layer 13d, thickness of the magnetic layer 13b is preferably as thin as possible. Taking account of it, it is preferably not larger than 5 nm, and more preferably not larger than 3 nm.

To suppress the current diversion effect by the magnetic layer 13b, electron reflection effect at the boundary between the magnetic layer 13b and the electron reflecting layer 16 is preferably minimized. If electron reflection effect occurs at the boundary, then the mean free path of effective electrons increases, and diverted current increases. Taking it into account, a material with a small electron reflection effect, such as Ta, Cr, Ti, may be inserted at the boundary to deteriorate the electron reflection factor.

Thickness of the magnetic layer 13d is preferably as thin as possible to minimize the diversion effect of the sense current and increase the MR effect. However, since the magnetostatic field from the magnetic layers 13a, 13b must be cancelled, the thickness should be determined taking the Mst product into consideration.

Figure 34:
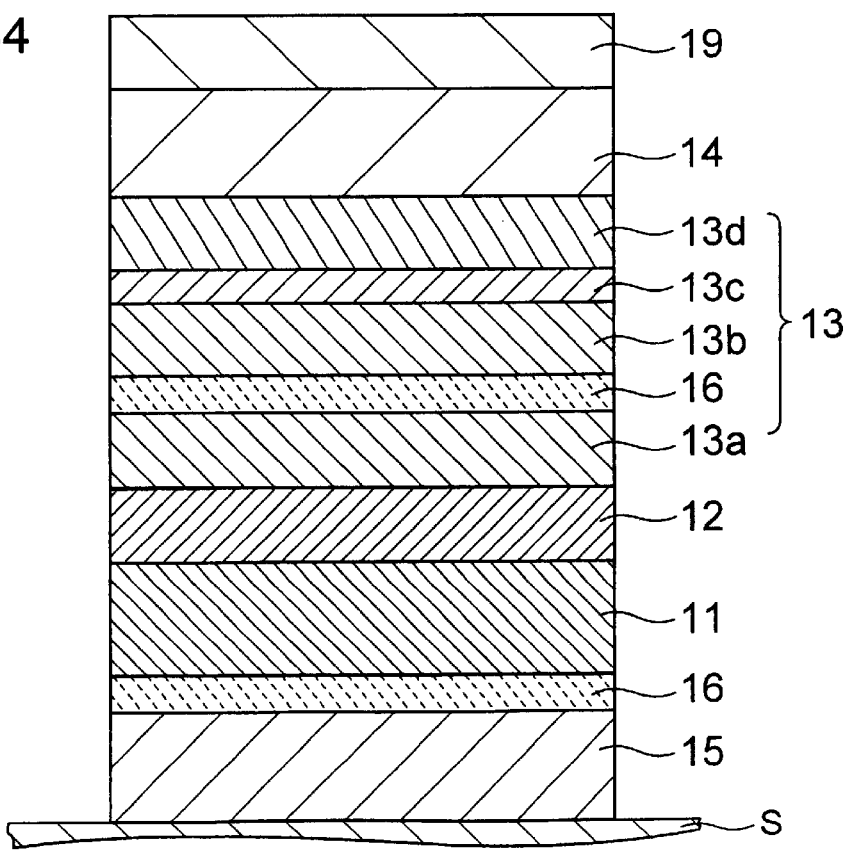
FIG. 34 shows the cross-sectional view of another structure in which another electron reflecting film 16 in contact with the free layer 11 is provided in addition to the structure shown in FIG. 33.

It is also possible to provide another electron reflecting film 16 in contact with the free layer 11 as shown in FIG. 34, in addition to the structure shown in FIG. 33. By providing electron reflecting layers 16 to both the pin layer 13 and the free layer 11, electron reflection is brought about at both surfaces, and a large MR ratio can be obtained. By using the invention, it is possible to obtain a spin valve film which brings about electron reflection at both surfaces and obtains a large MR ratio while promising good magnetization-pinned characteristics and small magnetostatic coupling between the pin layer and the free layer because of the synthetic structure.

Figure 35:
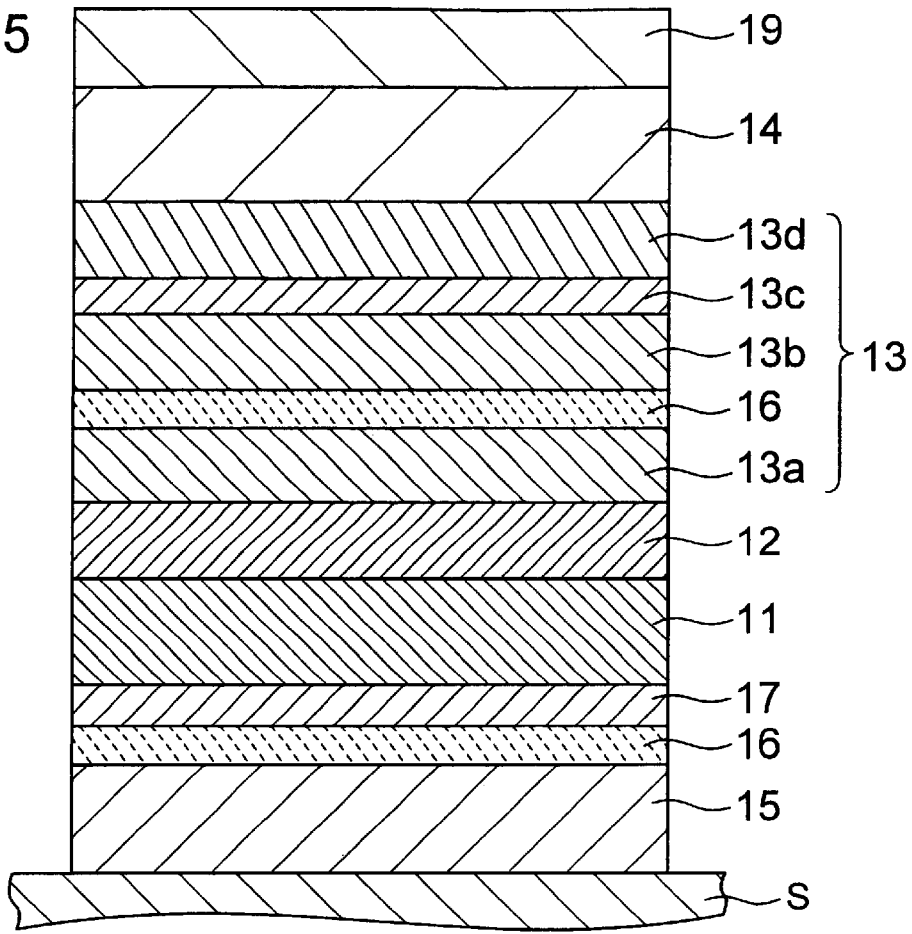
FIG. 35 shows the cross-sectional view of another structure in which the metal barrier layer 17 in contact with the free layer
Figure 36:
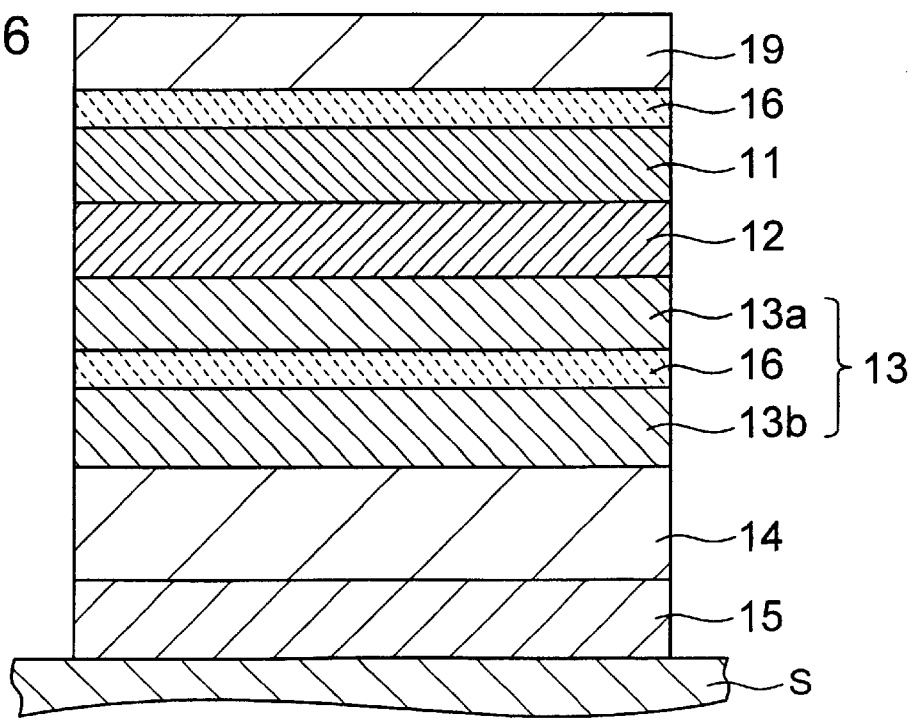
FIGS. 36 through 40 show the cross-sectional view of bottom-type spin valve films.
Figure 37:
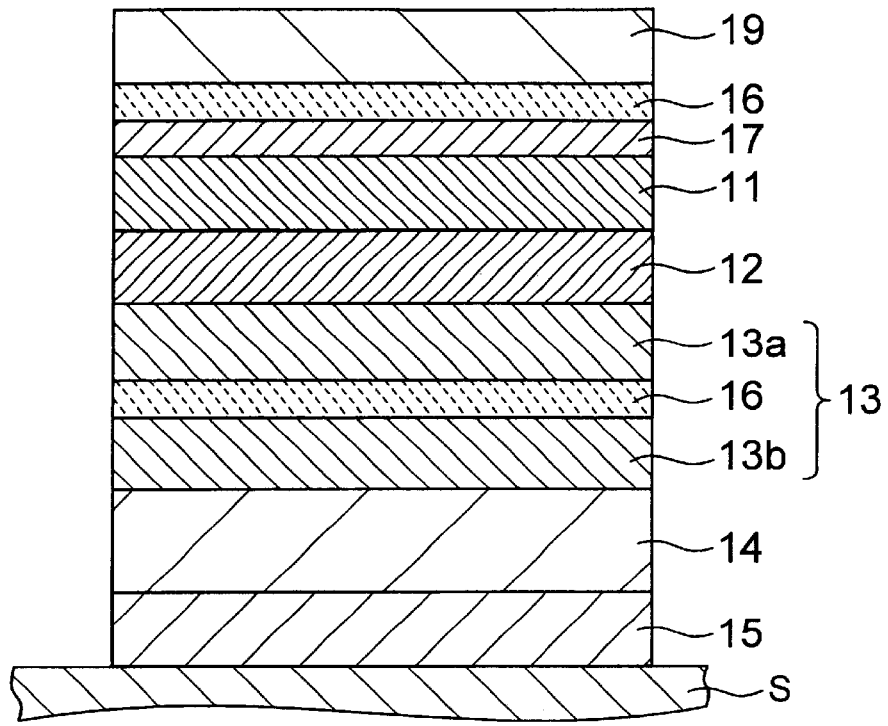
Figure 38:
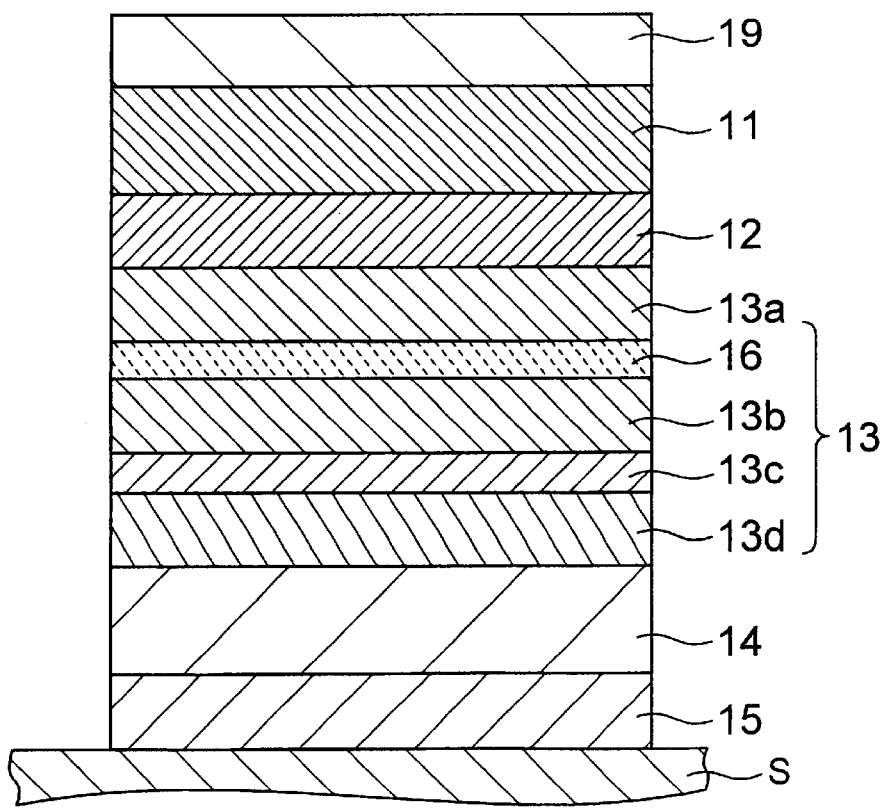
Figure 39:
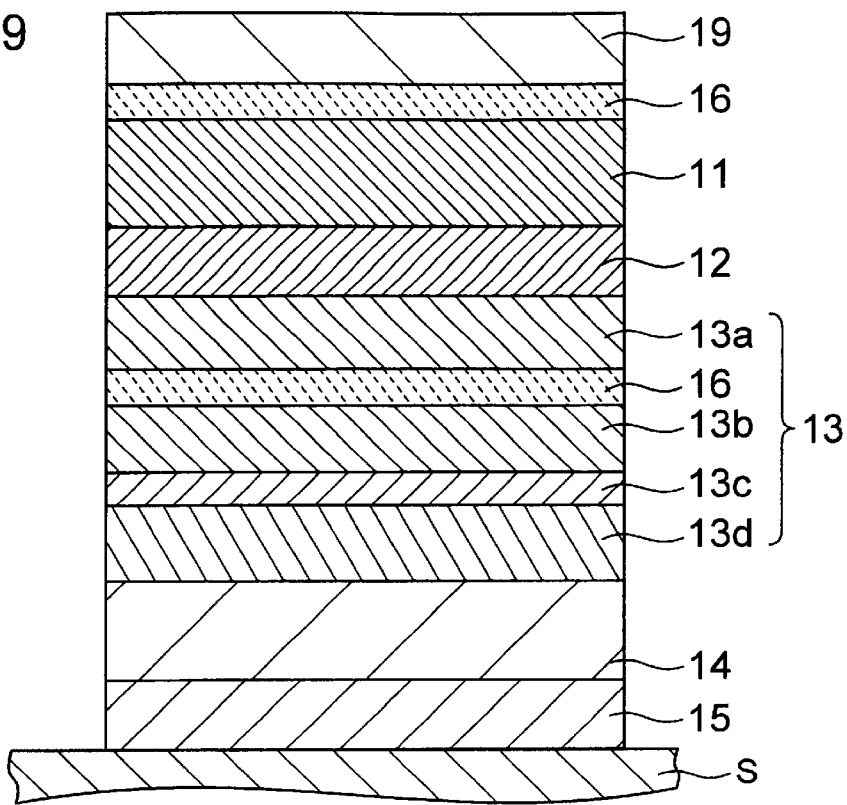
Figure 40:
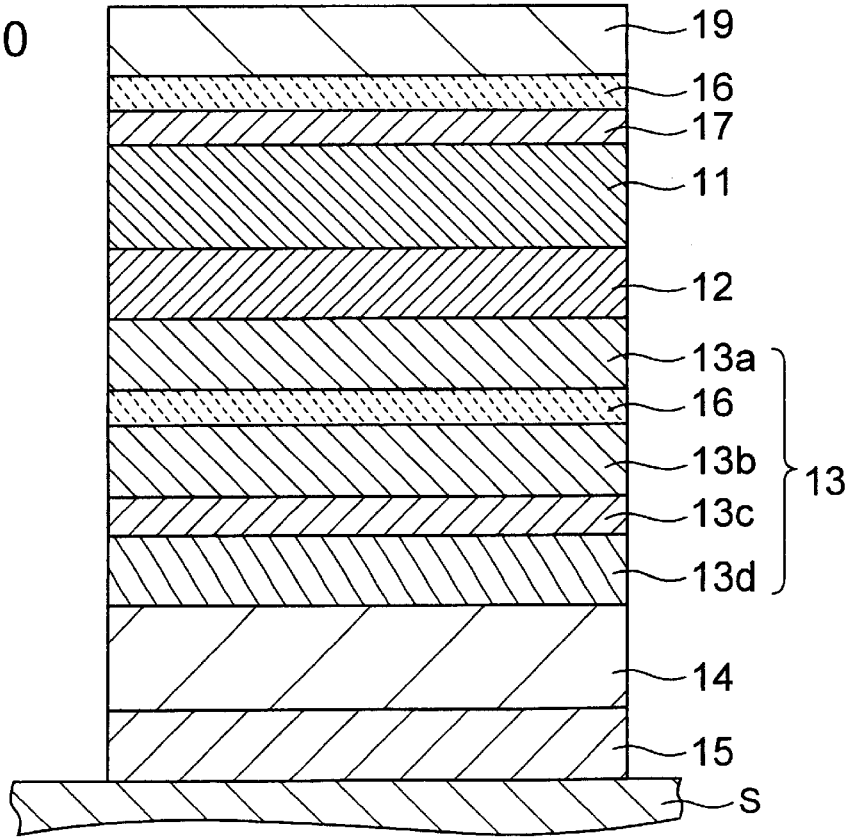

Additionally, as shown in FIG. 35, the metal barrier layer 17 in contact with the free layer 11 may be combined, in addition to the structure shown in FIG. 34. In this manner, both good MR characteristics and soft magnetic characteristics are ensured.

In the film using the synthetic pin structure explained above, since the effect of the torque by magnetostatic coupling especially from the pin layer is small, by controlling thickness and material of the buffer layer and the metal barrier layer to reduce the effect of the current magnetic field, stable bias point designing is possible while using the free layer with a low Mst product and realizing a high sensitivity.

Although FIGS. 31 through 35 show top-type films, bottom-type spin valve films can be also made, in which the structure in a top-type film is inverted. These bottom-type structures are shown in FIGS. 36 through 40. As to these drawings, parts or elements identical to those explained above are labeled with common numerals, and their detailed explanation is omitted. Between these top-type and bottom-type structures, optimum one can be selected depending on the structure of the head.

Figure 41:
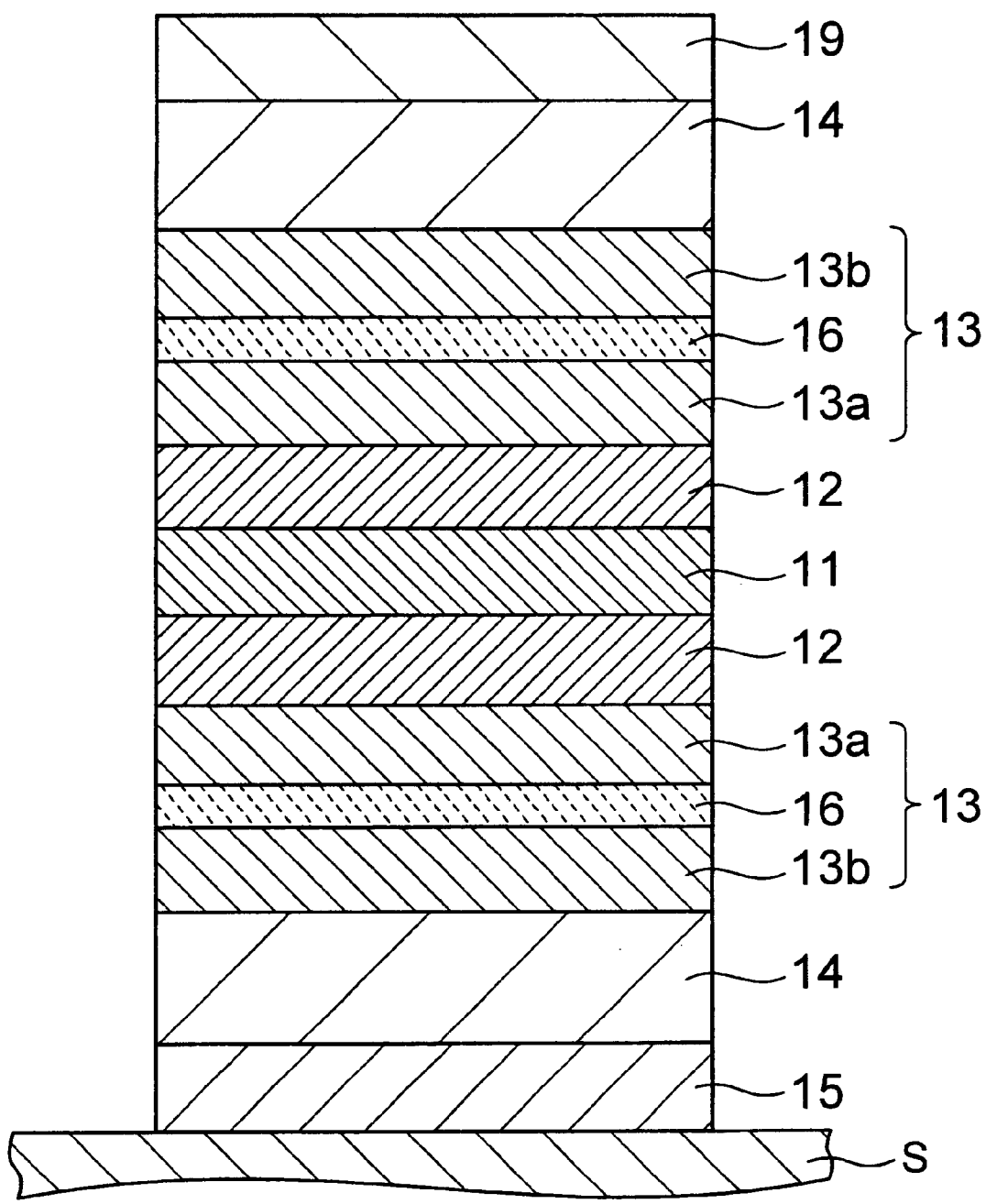
FIG. 41 shows the cross-sectional view of a dual-type spin valve film having two pin layers 13.

Also in a dual-type spin valve film having two pin layers 13 as shown in FIG. 41, the electron reflecting layer 16 may be inserted in each pin layer 13. By employing such a dual-type structure, a large MR ratio can be obtained.

Figure 42:
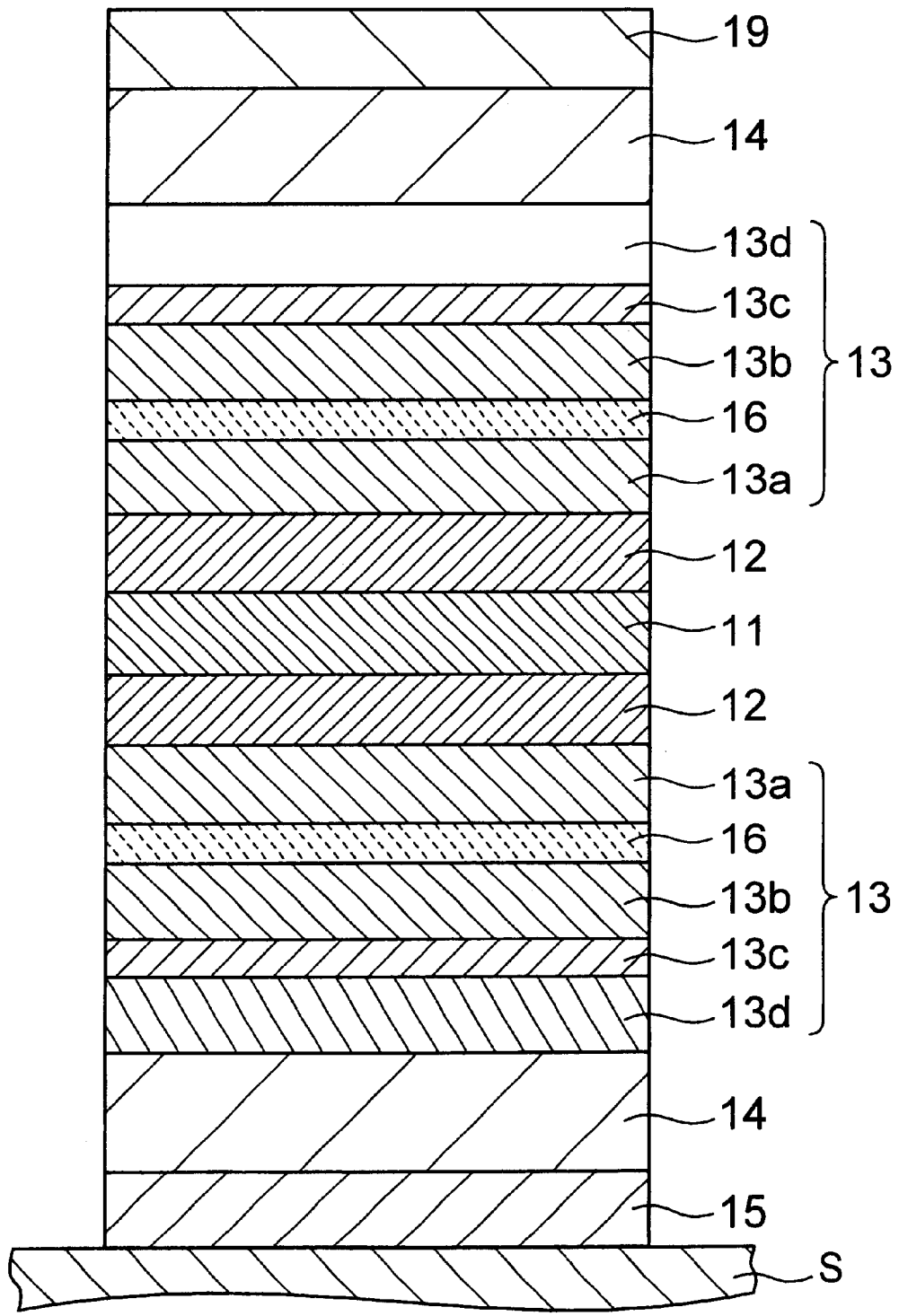
FIG. 42 shows the cross-sectional view of another structure in which a the magnetization-pinned layer of the second magnetic layer 13 as the pin layer has a synthetic structure.

In the present invention, as shown in FIG. 42, the magnetization-pinned layer of the second magnetic layer 13 as the pin layer may have a synthetic structure made up of first and second ferromagnetic film 13b, 13d anti-ferromagnetically coupled to each other, and a film 13c anti-ferromagnetically coupled to separate these two magnetic films.

That is, in the dual-type spin valve film shown in FIG. 42, the second magnetic layer 13 as the pin layer has a multi-layered structure configured as the magnetic layer 13a/electron reflecting layer 16/magnetic layer 13b/Ru layer 13c/magnetic layer 3d.

By combining the synthetic structure in this manner, magnetostatic coupling between the pin layer 13 and the free layer 11 can be reduced, and a highly sensitive structure with a small Mst product of the free layer 11 can be used as a sensor like a reproducing magnetic head.

Figure 43:
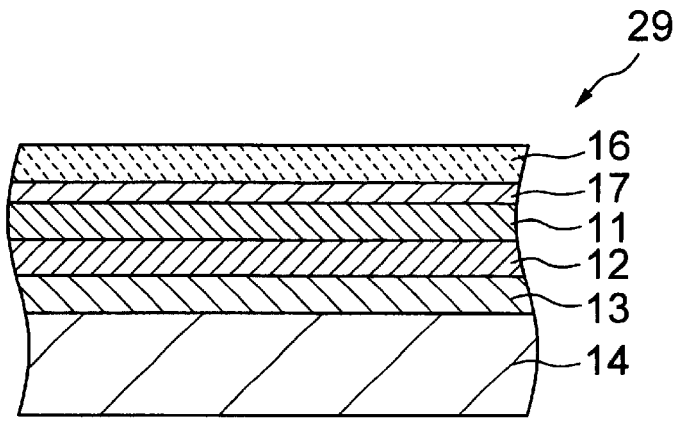
FIG. 43 shows the cross-sectional view of another structure of the fourth embodiment of the invention.

Next explained is a magnetoresistance effect element according to the fourth embodiment of the invention with reference to FIG. 43. The spin valve film 29 shown in FIG. 43 has a multi-layered structure stacking films as: anti-ferromagnetic layer 14/second magnetic layer (pin layer) 13/non-magnetic intermediate layer 12/first magnetic layer (free layer) 11/metal barrier layer 17/diffusion preventing/electron reflecting layer 16. In FIG. 41, illustration of the substrate, base layer, crystal growth controlling layer, etc. is omitted.

Materials of these layers are substantially the same as those of the spin valve film 18 in any of the above-explained embodiments. Also in the other respects, substantially the same conditions are preferably used.

The inverted-type spin valve film 29 can be readily made by first making the metal barrier layer 17 and thereafter once exposing its surface to the atmospheric air or exposing it to an atmosphere containing oxygen, nitrogen, carbon, boron, fluorine, chlorine, etc. Alternatively, it can be made by ion implantation, exposure to plasma, or by a method using radicals. The diffusion preventing/electron reflecting layer 16 can be made not only by oxidization of the metal barrier layer 17 but also by depositing it directly on the metal barrier layer 17 in the same manner as the diffusion preventing/electron reflecting layer 16 explained before.

Figure 44:
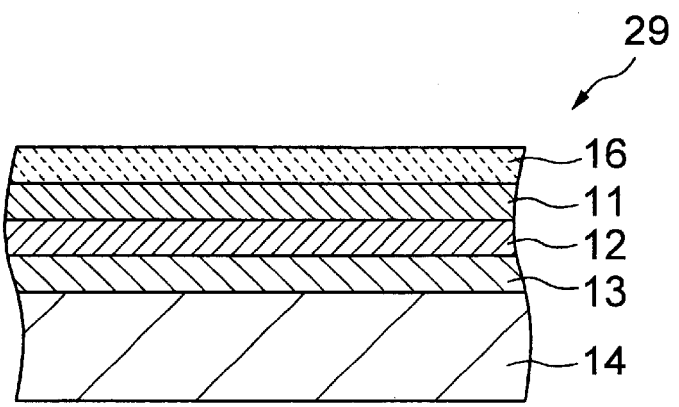
FIG. 44 shows the cross-sectional view of another structure of the fourth embodiment of the invention.

In the inverted-type spin valve film 29, as shown in FIG. 44, the electron reflecting layer may be made directly on the first magnetic layer (free layer) 11. In this case, thickness of the electron reflecting layer is preferably not thicker than 3 nm, and more preferably not thicker than 2 nm.

The inverted-type spin valve film 29 can also improve the MR ratio by electron mirror-reflection effect, and can cut magnetic interaction between the first magnetic layer 11 and the electron reflecting layer 16 by the metal barrier layer 17 interposed between them to thereby prevent magnetic distortion of the first magnetic layer 11 and an increase in induced magnetic anisotropy.

The magnetoresistance effect element according to the invention is used as a reproduction element of a magnetic head, for example. Not limited to a magnetic head, it can be also applied to a magnetic storage device such as magnetoresistance effect memory (MRAM).

Figure 45:
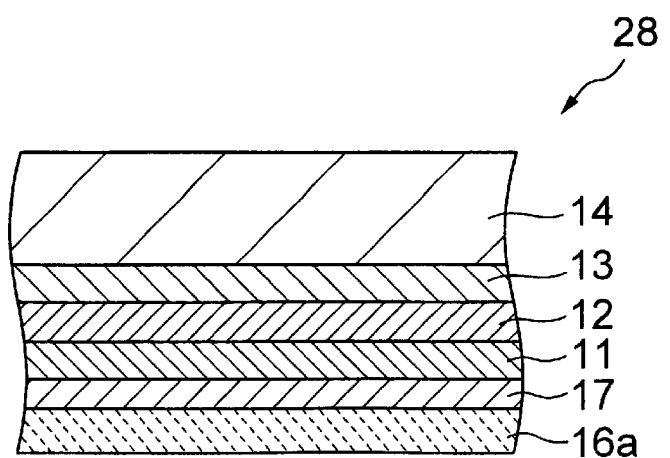
FIG. 45 shows the cross-sectional view of the fifth embodiment of the invention.

Next explained is a magnetoresistance effect element according to the fifth embodiment of the invention with reference FIG. 45. Here again, identical or equivalent parts or components as those of the former embodiments are labeled with common reference numerals, and their detailed description is omitted. As shown in FIG. 45, it is also possible to directly deposit a diffusion preventing/electron reflecting layer 16a made of NiO, α-Fe$_2$O$_3$ or CoO, for example, and make the first magnetic layer 11 thereon via the metal barrier layer 17.

In this case, the diffusion preventing/electron reflecting layer 16a made of NiO,α-Fe$_2$O$_3$ or CoO, for example, not only brings about electron mirror-reflection effect, but also has a surface excellent in smoothness. Therefore, its boundary with the overlying metal barrier layer 17 can be smoothed with a good consistency, and it can be epitaxially grown where appropriate. Accordingly, crystalline properties of respective layers can be improved, and the heat resistance can be improved. In this manner, the diffusion preventing/electron reflecting layer may be configured to prevent atomic diffusion between layers, relying on smoothness of boundaries and improvement of crystalline properties.

Material of the diffusion preventing/electron reflecting layer 16a is not limited to NiO, α-Fe$_2$O$_3$ or CoO, but any of oxides of alloys containing at least one element selected from Co, Ni and Fe, or oxides made by adding an additive element to these alloys can be used. In lieu of these oxides, an insulator or a nitride behaving as high-resistance metal can be also used. Examples of such nitrides are: nitrides of at least one kind of metal selected from Sc, Ti, V, Cr, Mn and Fe, and nitrides of alloys containing these metals.

Additionally, at least one kind of magnetic metal materials selected from IrMn alloys, RhMn alloys, PtMn alloys and RhRuMn alloys can be smoothed at its boundary with the overlying metal barrier layer 17 with a good consistency, and can be epitaxially grown, where appropriate. Therefore, it is also possible to use the above-mentioned magnetic metal base layer as the diffusion preventing/electron reflecting layer.

In the case where an oxide magnetic material such as NiO, $\alpha$-$Fe_2O_3$ or CoO, for example, or a magnetic metal material such as IrMn alloy is used as the diffusion preventing/electron reflecting layer 16a, the metal barrier layer 17 made of a non-magnetic metal material is used to break magnetic exchange interaction between itself and the first magnetic layer 11. In this case, thickness of the metal barrier layer 17 is preferably not thinner than 1 nm. In the other respects, the same conditions are preferably used.

Next explained are a method and an apparatus for manufacturing a magnetoresistance effect element according to the invention. First referring to FIG. 46 and FIG. 47, a process for manufacturing a magnetoresistance effect element according to the invention.

Figure 46:
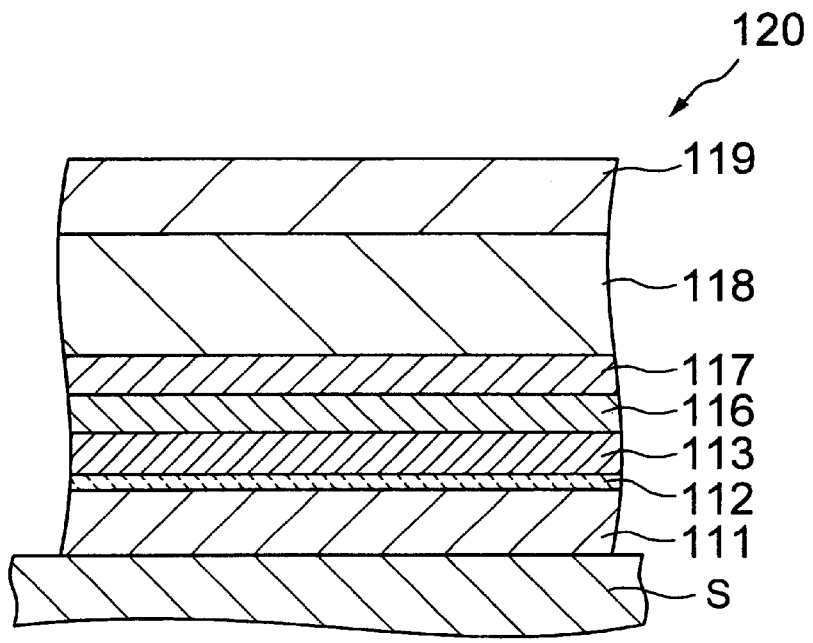
FIGS. 46 through 49 show exemplary structures to be manufactured by the process according to the invention.
Figure 47:
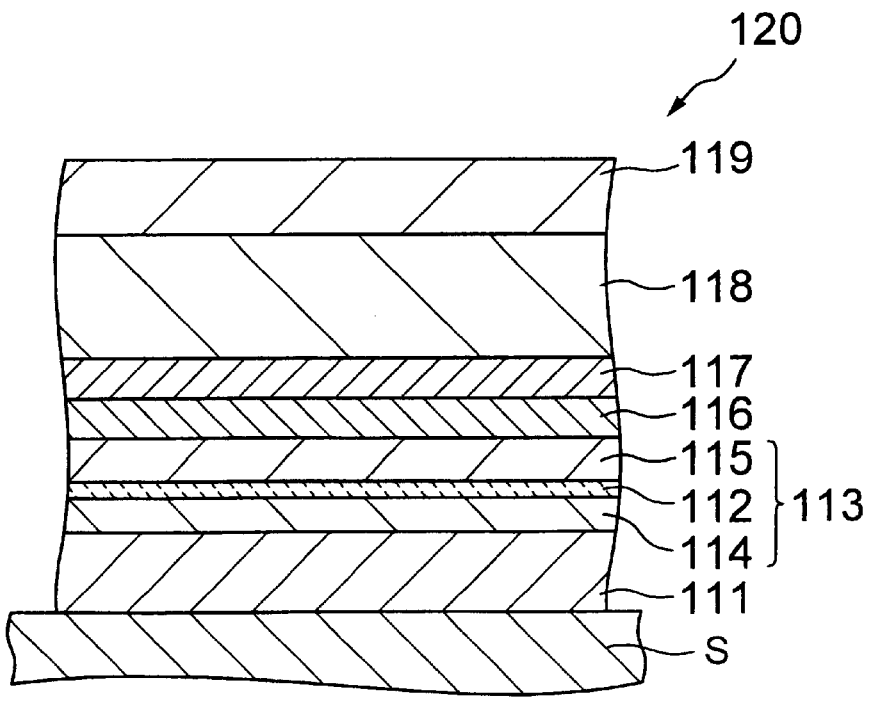

FIGS. 46 and 47 are schematic diagrams showing cross-sectional aspects of the magnetoresistance effect element to be made by the manufacturing method according to the invention. In these drawings, S denotes a substrate, and 111 denotes a metal base layer. In FIG. 46, a diffusion preventing/electron reflecting layer 112 is made on the metal base layer 111, and a first magnetic layer 113 is made thereon as a free layer. In FIG. 47, a magnetic base layer 114 is made on the metal base layer 111, and a ferromagnetic layer 115 is made on the magnetic base layer via a diffusion preventing/electron reflecting layer 112, and these stacked films form the first magnetic layer 113 as the free layer.

Formed on the first magnetic layer 113 is a second magnetic layer 117 as a pin layer via a non-magnetic intermediate layer 116, and an anti-ferromagnetic layer 118 is stacked thereon. Numeral 119 denotes a protective coat. These layers form a spin valve film 120. Materials of respective layers forming the spin valve film 120 may be the same as those of the foregoing embodiments.

The diffusion preventing/electron reflecting layer 112 as the effect of preventing inter-layer diffusion of atoms and the effect of increasing MR ratio by reflection of electrons.

Major modes of atomic diffusion are transgranular diffusion and intergranular diffusion. The diffusion preventing/electron reflecting layer 112 shuts intergranular diffusion path by preventing coincidence of grain boundaries between layers, and simultaneously shuts transgranular diffusion path by blocking contact of crystal grains between layers, and its effect of preventing atomic diffusion by heat is great. Moreover, mean free path of electrons can be extended significantly by electron reflection effect, and MR ratio is expected to increase due to an increase of electrons contributing to resistance changes.

In the embodiment shown here, the diffusion preventing/electron reflecting layer 112 is made by using a gas containing radicals or a gas containing ozone. Fabricating methods using a gas containing radicals involve methods relying on irradiation of a gas flow containing radicals onto the film, sputtering while irradiating a gas flow containing radicals, vapor deposition and MBE (molecular beam epitaxy). A method using a gas containing ozone is similarly involved.

In general, plasma is made up of ions and electrons. In addition to them, radicals taking various excited states, neutral atoms and neutral molecules exist. In typical plasma irradiation processing, ions and electrons are major components, and they are extracted by applying an electric field and irradiated onto samples for reform processing. In the typical plasma processing, since ions are major components, ions having a high energy hits the film, and may damage the diffusion preventing/electron reflecting layer to be made. Therefore, it increases surface roughness, and simultaneously causes unevenness of the layer to be made, which results in a decrease in effectiveness as the diffusion preventing/electron reflecting layer.

By making the diffusion preventing/electron reflecting layer 112 by using a gas flow containing radicals, damage to the diffusion preventing/electron reflecting layer 112 is diminished. Additionally, chemical reaction on the film surface is promoted by chemically active radicals, and surface diffusion of atoms along the film surface is promoted by heat of chemical reaction. As a result, the diffusion preventing/electron reflecting layer 112 which is very smooth and very thin as thin as approximately 0.3 nm or less can be made. More specifically, the diffusion preventing/electron reflecting layer 112 has a smoothness not larger than 2.0 nm in Ra along its upper and lower boundaries.

Moreover, since radicals as active seeds are supplied by irradiation, chemical absorption becomes a major streams rather than physical adsorption, and adsorption probability increases. As a result, growth cores increases, and facilitates deposition of a dense diffusion preventing/electron reflecting layer 112. Therefore, the diffusion preventing/electron reflecting layer 112 with a uniform thickness, even smooth upper and lower boundaries and less pin holes or other defects can be made. These factors promise excellent heat resistance, and large MR ratio (changing rate in magnetoresistance) by electron reflection effect.

Usable as the gas for radical processing is any gas containing radicals made up of at least one element selected from oxygen, nitrogen, carbon, hydrogen, fluorine and chlorine. Used as the source material gas containing these radicals is a reactive gas containing any of those elements. Usable as the reactive source material gas are oxide, nitride, fluorides chloride gases such as $O_2$, $N_2$, F, $NH_4$, $H_2O$ vapor, $H_2O_2$ vapor, NO, $N_2O$.

Although these reactive gases form compounds without being excited, when radicals as excited seeds are used, chemical adsorption and chemical reaction occurs quickly, and the smooth and uniform diffusion preventing/mirror-reflection layer 112 made up of a compound phase such as oxide, nitride, carbide, chloride, or fluoride. can be readily obtained. Since these compounds are made by chemically reactive adsorption, they do not thermally dissociate easily unlike those by physical adsorption, and form a thermally stable diffusion preventing/mirror-reflection layer.

Oxygen radicals are particularly effective for making the diffusion preventing/electron reflecting layer112. Examples of oxide gases are $O_2$, $H_2O$ vapor, $H_2O_2$ vapor, alcoholic vapor, $N_2O$, NO, and $CO_2$. Examples of oxygen radicals having various electronic configurations made by using these source material gases are: O(3p), O(1D) and O(1S). Among them, O(1D) and O(1S) exhibit higher activity and more easily get into chemical coupling than O(3P), and are suitable for making an oxide-group diffusion preventing/ electron reflecting layer 112.

Since most oxides are electrical insulators, have large gaps from vacuum levels. Therefore, they are believed to have large electron reflecting effect. Still here, it is indispensable to smooth boundaries for reducing electron scattering along the boundaries and for elongating the mean free path of electrons. By making the oxide-group diffusion preventing/electron reflecting layer 112 using oxygen radicals, smooth boundaries that cannot be obtained by oxide film deposition processes can be made, sufficient performance of the mirror-reflection effect is expected, and a large magnetoresistance effect can be induced. Moreover, oxide phases, in general, are thermally stable, and are optimum for use as the diffusion preventing/electron reflecting layer 112.

Radical-based gases used in the present invention are those containing more radicals than typical plasma, for example, and they are preferably contain radicals as many as possible. To generate a radical-contained gas, it is usually necessary to generate plasma. Plasma contains ions, electrons, radicals and neutral atoms (molecules). Therefore, to generate a radical-based gas, if is sufficient that at least radicals exist in a plasma generated state. Ions and electrons can be adjusted to an optimum value by appropriately modifying a positive-negative electric field applying device, for example.

The existence or absence of radicals can be confirmed through the intensity detected by plasma radiation spectrometry. Excited radiation intensity of radicals and ions ($I_{radical}/I_{ion}$) is preferably not less than 0.01 for each radical and ion. Radical density can be quantitatively determined by a particle measurement method such as laser induced radiation or appearance mass spectrometry (AMS). In this case, ion density is preferably lower than radical density.

As explained above, a gas containing $O_3$ (ozone) can be used to make the diffusion preventing/electron reflecting layer 112. Ozone is generated in the process of plasma generation as mentioned above. Since ozone is very active like oxygen radicals, it is excellent in oxidization. Additionally, it is neutral like oxygen radicals, and does not damage the film. Therefore, the same effect as that of oxygen radicals is expected.

Additionally, light may be irradiated onto the substrate upon making the electron reflecting layer. By irradiation of light, an energy for dissociating gas molecules adsorbed onto the film surface can be applied to increase its reactivity. For example, even when $O_2$ molecules are adsorbed onto the surface, it is possible to dissociate $O_2$ into O atoms and promote reaction by irradiation using an ultraviolet excimer lamp. As a result, a dense and smooth oxide film can be made. Furthermore, since chemical adsorption occurs more than physical adsorption, a stable electron reflecting layer can be obtained.

As to light for irradiation, light may be irradiated by using a xenon lamp so as to additionally apply a thermal energy from the surface of the film. In this case, since moles on the surface of the film obtain a thermal energy as well, their reaction is promoted, and a dense and smooth electron reflecting film can be obtained.

In the diffusion preventing/electron reflecting layer made by radical processing or ozone processing as explained above, Ra of both or one of their upper and lower boundaries can be made as small as 0.2 nm or less. Average roughness Ra can be readily measured by AFM (interatomic force microscopy) or STM (scanning tunneling microscopy). Alternatively, it can be obtained by observation using an electronic microscope from a cross section.

Ra of upper and lower boundaries of the diffusion preventing/electron reflecting layer 112 is preferably not larger than 2.0 nm. Especially, Ra of its boundary nearer to the magnetic layer is preferably not larger than 2.0 nm. If Ra at a boundary exceeds 2.0 nm, non-elastic scattering of electrons along the boundary will reduce the electron reflecting effect, and seriously decreases the MR ratio. In case where the diffusion preventing/electron reflecting layer 112 is a very thin film, s thin as 3.0 nm or less, if Ra exceeds 2.0 nm, pin holes are produced, and the diffusion preventing effect id reduced.

Figure 48:
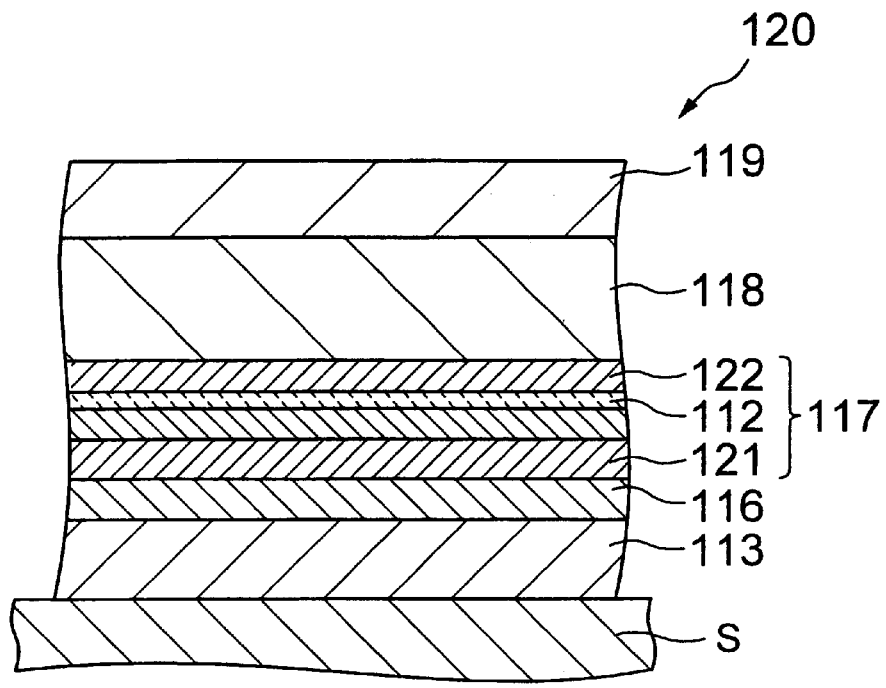
Figure 49:
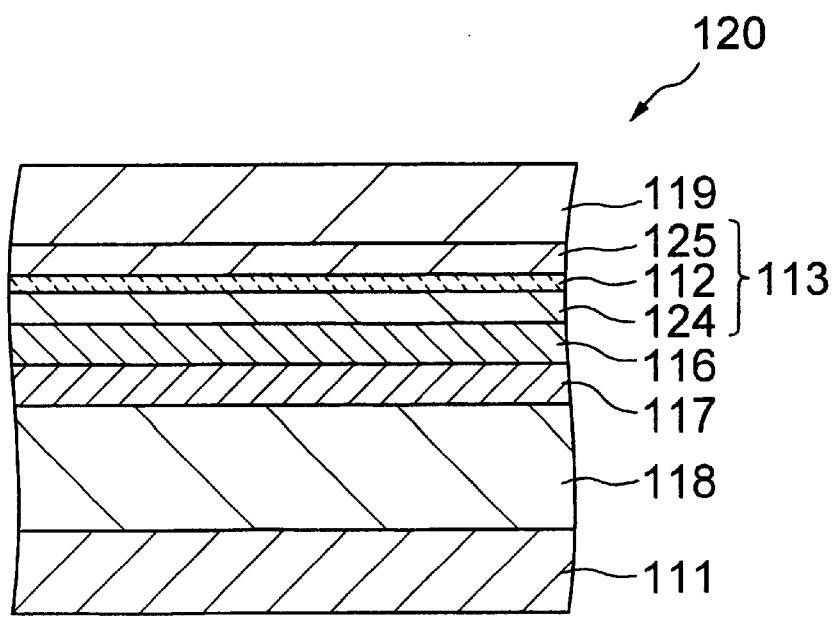

The method for manufacturing a magnetoresistance effect element according to the invention is applicable, not only to the structures shown in FIGS. 46 and 47, but also to a structure as shown in FIG. 48 in which the second magnetic layer 117 is multi-layered as: ferromagnetic layer 121/ diffusion preventing/electron reflecting layer 112/ ferromagnetic layer 122; a structure as shown in FIG. 49 in which the first magnetic layer 113 of the inverted-type spin valve film 123 is multi-layered as: ferromagnetic layer 124/diffusion preventing/electron reflecting layer 112/ ferromagnetic layer 125; or a structure combining them.

Furthermore, it is applicable also to the spin valve films according to the foregoing embodiments.

Additionally, the manufacturing method according to the invention is applicable to fabrication of a tunneling layer of a magnetoresistance effect element using a tunneling phenomenon. It is possible to made a very thin tunneling layer as tin as 3.0 nm, having a uniform thickness and made up of a SiOX layer or $AlO_x$ layer without pin holes, or their oxide.

Figure 50:
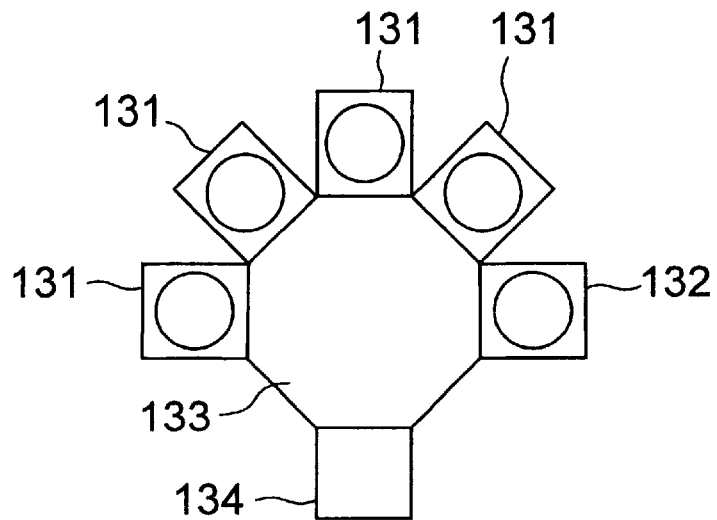
FIGS. 50 and 51 show the manufacturing apparatus used according to the invention.
Figure 51:
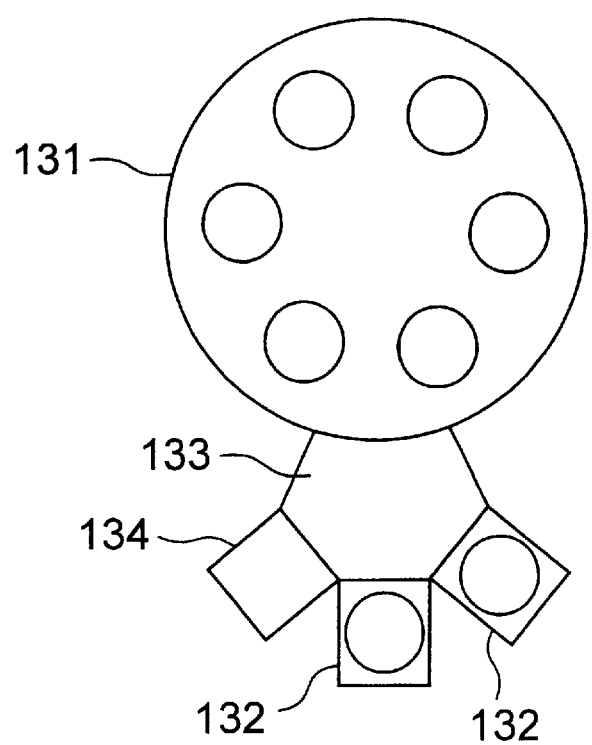

Next explained is a method and an apparatus for manufacturing a magnetoresistance effect element according to the invention with reference to FIGS. 50 and 51.

FIGS. 50 and 51 are schematic views roughly illustrating construction of manufacturing apparatuses usable in the present invention. These manufacturing apparatuses include a first deposition chamber 131 for making component layers of the magnetoresistance effect element except its diffusion preventing/electron reflecting layer without using radicals, and a second deposition chamber 132 for making the diffusion preventing/electron reflecting layer by using radicals. The manufacturing apparatus shown in FIG. 50 has a plurality of first deposition chambers 131 each containing a target whereas the manufacturing apparatus shown in FIG. 51 has a single deposition chamber 131 containing a plurality of targets.

Transport of substrates from the first film deposition chamber(s) 131 to the second deposition chamber 132 is effected by mechanical transport via a carrier chamber 133. In FIGS. 50 and 51, numeral 134 denotes a load lock chamber. By using these two different kinds of deposition chambers 131, 132, adverse affection to target surfaces by a gas supplied for radical or other boundary treatment can be prevented.

Especially when an oxygen gas is used, Mn-group targets for making Mn-group anti-ferromagnetic films are seriously oxidized along their surfaces, and may deteriorate characteristics of the films to be made. However, any of these apparatuses can reduce influence of an adsorption gas from chamber side walls. Further, the apparatus can reduce the time required for pre-sputtering, or the like, for removing a useless layer from the target surface, and can improve the throughput. Simultaneously, the apparatus reduces adverse affection to targets, and promises high-yield fabrication of high-performance MR elements. Additionally, when using different gas seeds or different targets, it is preferable to prepare a plurality of deposition chambers each for a single gas seed or target, taking account of influences by impurities.

Figure 52:
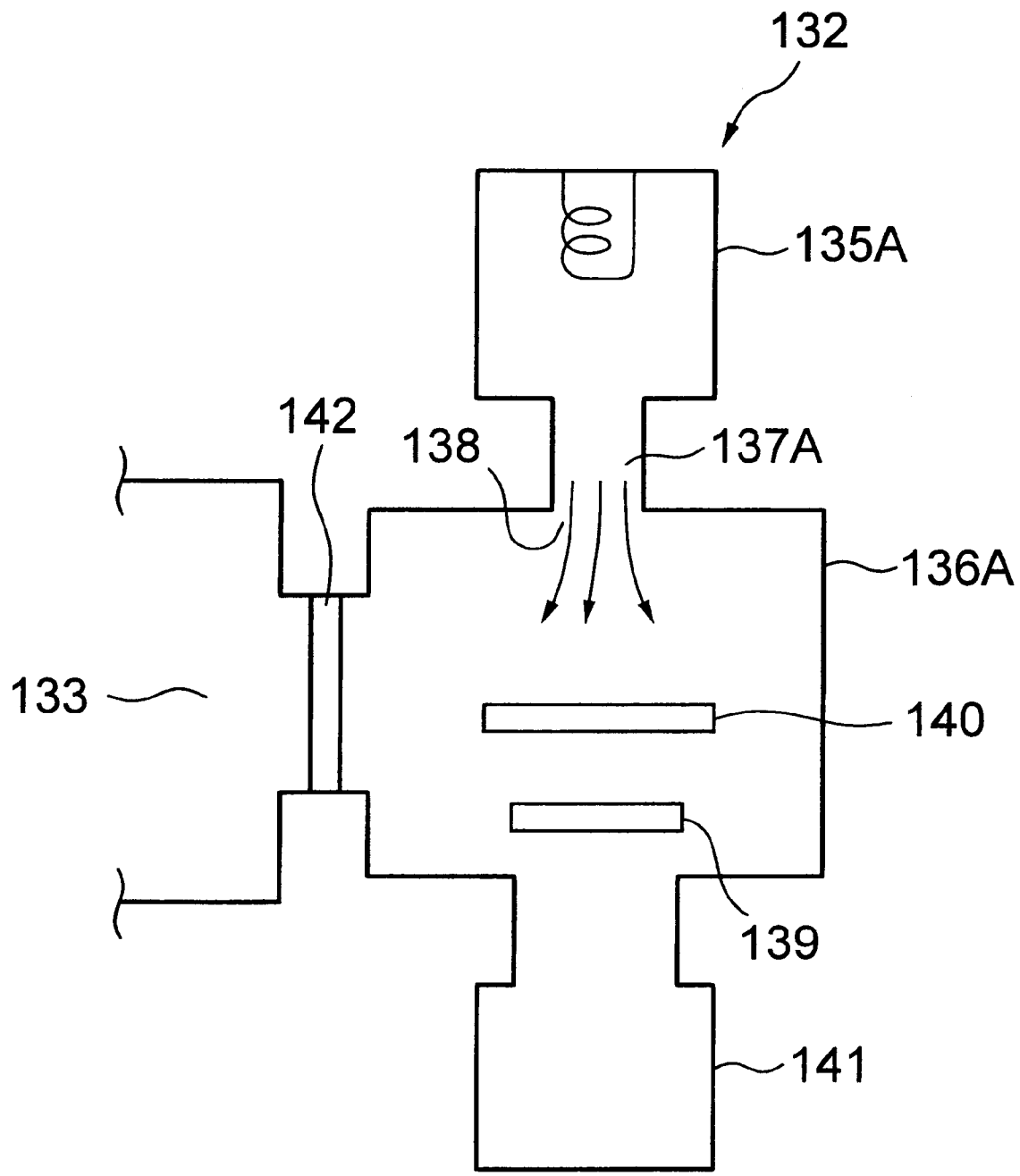
FIG. 52 shows a fabricating machine including a radical generation region 135A and a radical irradiating region 136A.

The second deposition chamber 132 for using radicals includes a radical generation region 135A and a radical irradiating region 136A as shown in FIG. 52, for example. If the diffusion preventing/electron reflecting layer is made in the radical generating region 135A where plasma is generated, high-energy ions, electrons or other particles hit and damage the film. However, by separating the radical generation region 135A from the radical irradiating region 136A, damage to the film can be minimized.

The radical irradiating region 136A has a radical guide pipe 137A, radical irradiating aperture 138, and substrate table 139. The radical irradiating aperture 138 is located along a normal line of the substrate tape 139. In FIG. 52, Numeral 140 denotes a shutter, 141 denotes a vacuum pump, and 142 denotes a valve. The arrangement shown here is desirable to reduce distribution of the radical irradiation amount within the plane of the substrate and make a diffusion preventing/electron reflecting layer which is uniform throughout the wafer.

By introducing and guiding a plasma flow from the radical generating region 135A into the radical guide tube 137A, only radicals can be selectively extracted by removing or re-combining ions and electrons having electric charges. Selective extraction of radicals is ensured by changing the length of the radical guide tube 137A, depending on the gas seed used for generating plasma. for example, in case of oxygen plasma, the distance from the plasma source to the substrate surface is preferably determined not shorter than 100 mm and not longer than 1000 mm. If it is shorter than 100 mm, the substrate will be affected by ions from the plasma source. If it exceeds 1000 mm, radicals are liable to disappear.

Inner wall of the radical guide pipe 137A is preferably coated with an insulating material such as $SiO_x$, $AlO_x$ or BN. This is effective for confining ions or electrons within the radical generating region 135A by charging up the inner wall of the radical guide tube with positive or negative electric charge, and or removing ions and electrons by collision thereof onto the charged inner wall.

Figure 53:
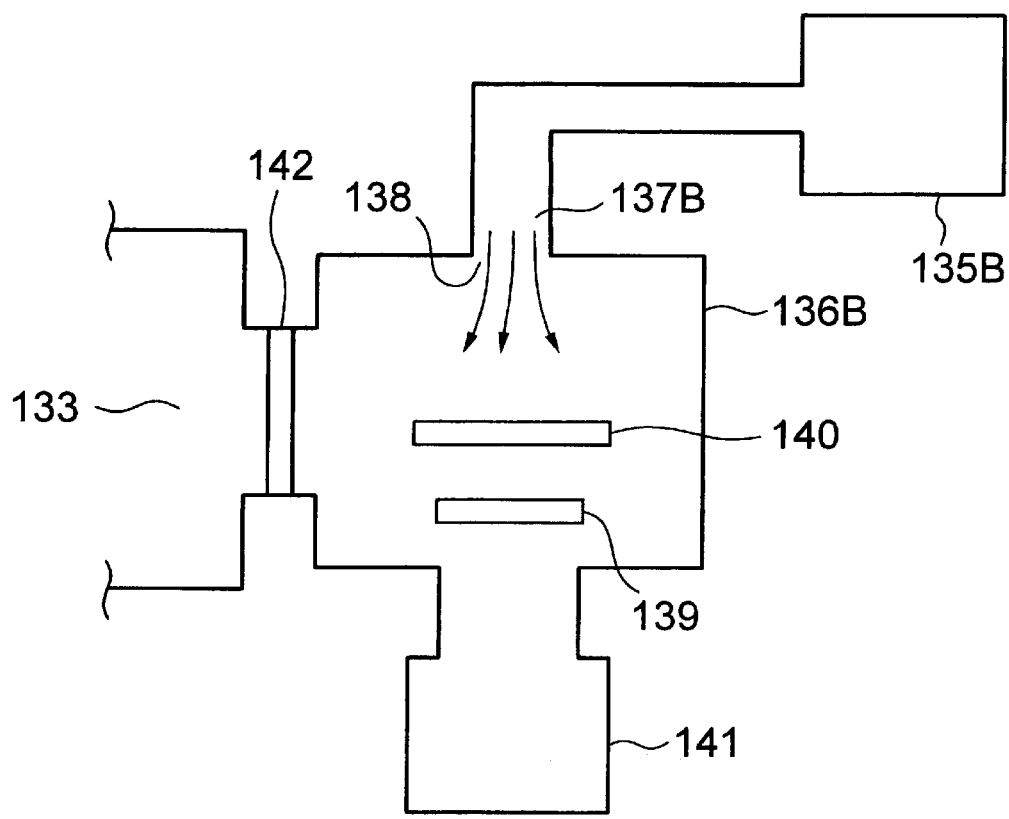
FIG. 53 shows a fabricating machine including a an ozone source 135B may be provided.

It is not indispensable for the second deposition chamber 132 to include the radical generating source. Instead of it, as shown in FIG. 53, an ozone source 135B may be provided. In FIG. 53, Numeral 136B denotes an ozone irradiating chamber and 137B denotes an ozone guide tube.

Alternatively, both of the radical source and the ozone source may be provided there.

Figure 54:
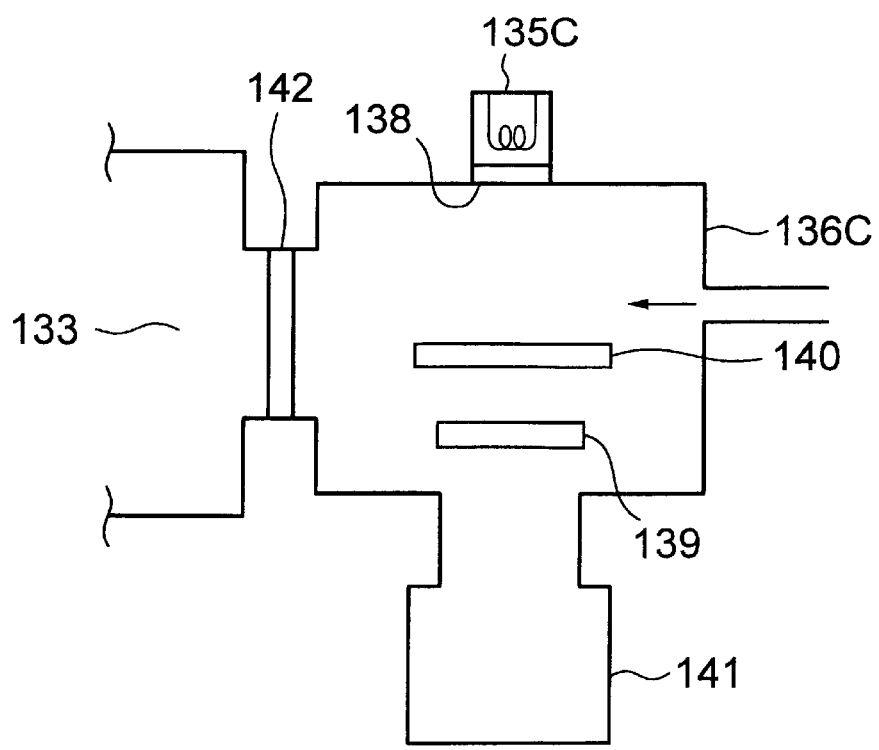
FIG. 54 shows a fabricating machine including a light source 135C and a light irradiating chamber 136C.

Alternatively, as shown in FIG. 54, a light source 135C may be provided. In FIG. 54, Numeral 136C denotes a light irradiating chamber. Of course, the radical source, the ozone source and the light source may be combined in any possible combination.

Next introduced are specific examples of the magnetoresistance effect elements according to the second to fifth embodiments explained before, while referring to the manufacturing methods according to the invention.

EXAMPLE 15

A 5 nm thick Ta film was deposited on a thermal oxide silicon substrate by DC magnetron sputtering, and a 6 nm thick NiFe alloy was formed thereon. After that, oxygen was introduced into the deposition chamber to deposit a passive state film on the surface of the NiFe alloy layer (Sample 1). This layer functions to barrier atomic diffusion and to mirror-reflect electrons. This film was observed through TEM and was confirmed to have an average thickness of approximately 2 nm and be continuous in the in-plane direction. On the other hand, $O_2$ radicals were irradiated onto the surface of a similarly deposited NiFe alloy layer for 30 seconds to form a diffusion preventing/electron reflecting layer (Sample 2). In this process, for the purpose of extracting only radicals, surface reforming treatment was conducted by extracting radicals exclusively using a gas flow produced by a pressure difference between the plasma source and the chamber. Immediately after the reforming treatment, the film surface was analyzed by XPS and X-ray diffraction. As a result, a layer containing oxides, namely, $Fe_2O_3$, $Fe_3O_4$ and NiO. Its average thickness was approximately 2 nm.

Next deposited on the oxide film was NiFe alloy as a metal barrier layer by 2 nm. Then, sequentially stacked were CoFe alloy (2 nm), Cu (3 nm), CoFe alloy (2 nm) and IrMn alloy (10 nm), and finally stacked was 5 nm thick Ta as a protective coat.

For comparison with the Example, spin valve films with a film structure without the metal barrier layer (Sample 3) and a film structure having neither the oxide film nor the metal barrier layer (Sample 4) were prepared as comparative samples in the same manner as explained above.

After patterning these spin valve films, they were annealed at 270EC, and their MR ratios before and after annealing were measured. The result is shown in Table 2. Furthermore, spin valve films as Samples 1 and 2 of Example 15 and Sample 3 of the comparative sample were annealed in a magnetic field of 5 kOe at 270 degrees in centigrade for one hour, and thereafter measured on induced magnetic anisotropy and magnetic distortion. Its result thereof is also shown in Table 2.

As apparent from Table 2, although both samples of the Example 15 are slightly inferior in heat resistance to Sample 3 as the comparative sample with no metal barrier, they exhibit better heat resistance than Sample 4 as the comparative sample with no oxide film. Induced magnetic anisotropy and magnetic distortion were improved by the use of the metal barrier layer, and samples of Example 15 were confirmed to be smaller both in induced magnetic anisotropy and in magnetic distortion than Sample 3 as the comparative sample.

EXAMPLE 16

Under the same conditions as those of Sample 1 of Example and Sample 4 as the comparative sample, a 3 nm thick CoFe layer was formed as the second magnetic layer. At that time, a gas containing oxygen radicals was once introduced to make an oxide layer by 1 nm. Then, a CoFe layer of 2 nm was made. Thereafter, in the same manner as Example 15, an IrMn film of 10 nm and a Ta film of 5 nm were made.

Construction of spin valve films as samples of Example 16 are 5Ta/5NiFe/$O_2$/2NiFe/2CoFe/3Cu/3CoFe/$O_2$/2CoFe/ 10IrMn/5Ta (Sample 1), and 5Ta/5NiFe/2CoFe/3Cu/3CoFe/ $O_2$/2CoFe/10IrMn/5Ta (Sample 2). Numerical values in respective film components here and hereinafter represent average thicknesses (nm).

As-deposited MR ratios of samples of Example 16 were 8.7% in Sample 1, and 8.5% in Sample 2. Post-annealing MR ratios of these samples after annealing at 270EC for one hour were 8.5% in Sample 1 and 6.5% in Sample 2. That is, MR ratios were increased by mirror-reflection as compared Example 15 and Comparative sample 10, and good characteristics were obtained even after annealing.

EXAMPLE 17

A 5 nm thick amorphous Ta base was deposited on a thermal oxide silicon substrate by DC magnetron sputtering, and Co of 5 nm was deposited thereon. After that, Co was oxidized by radical oxygen treatment. Its complete oxidization was confirmed by XPS.

After Cu was deposited by 1 nm as a metal barrier layer on the Co oxide, CoFe (4 nm), Cu (3 nm), CoFe (2 nm), IrMn (10 nm) and Ta (5 nm) were stacked sequentially. As a result of TEM observation of a cross section of the films, unevenness along the boundary between the Co oxide layer and the Cu layer was as small as 1 nm in Ra. The Co oxide layer had a crystallographic property with an orientation, and the portion of Cu/CoFe/Cu/CoFe/IrMn was epitaxially grown. The spin valve film of Example 17 exhibited MR ratio of 10%, induced magnetic anisotropy of 5 Oe, and magnetic distortion of 0.6 ppm.

For comparison with the Example, a sample stacking 5Ta/2Cu/4CoFe/3Cu/2CoFe/10IrMn/5Ta on a thermal oxide Si substrate (comparative sample—Sample 1) and a sample stacking 5Ta/5CoO/4CoFe/3Cu/2CoFe/10IrMn/5Ta on a thermal oxide Si substrate (comparative sample—Sample 2) were prepared. In these samples as comparative samples, Sample 1 exhibited MR ratio of 7.8%, induced magnetic anisotropy of 5 Oe and magnetic distortion of 0.6 ppm whilst Sample 2 exhibited MR ratio of 10.5%, induced magnetic anisotropy of 25 Oe and magnetic distortion of 3 ppm.

In this manner, because the crystalline Co oxide base contributed as an electron mirror-reflection layer to improvement of the magnetoresistance effect, and the Cu barrier layer alleviated structural distortion and cut magnetic coupling between the oxide film and the free layer, good magnetic characteristics of the free layer were obtained simultaneously.

The sample of Example 17 and Sample 1 as the comparative sample were annealed in a vacuum at 270 degrees in centigrade for 20 hours. As a result, whilst Example 17 exhibited MR ratio of 9.5%, the comparative samples exhibited deterioration to 6%. It was therefore confirmed that the Co oxide base certainly contributes to improvement of the film quality.

Similar evaluation was made on samples in which the Co oxide was replaced by Ni and Fe. It was confirmed from a result of XPS that NiO and "—$Fe_2O_3$ were generated. According to cross section TEM, its crystalline property demonstrated similar tendencies to those of the Co oxide base both in smoothness of its boundary with the oxide film and crystalline growth (epitaxial growth). Its result is shown in Table 3.

As understood from the data, similar effects were obtained by using Fe, Ni and Co. These facts permits the presumption that similar effect be readily obtained also by oxidizing these alloys. Furthermore, also when any other transition metal element, Ti, V, Cr, Mn or Cu, for example, is added to these metals or alloys, similar results are obtained.

Further prepared were Sample A having 5Ta/3CoO/2NiFe/4CoFe/3Cu/2CoFe/10IRMn/5Ta on a thermal Si substrate, and Sample B having 5Ta/10CoO/2NiFe/4CoFe/3Cu/2CoFe/10IRMn/5Ta on a thermal oxide Si film. MR ratio was 0.8% in Sample A and 9.7% in Sample B, both being acceptable values. Induced magnetic anisotropy, however, was 10 Oe in Sample A, but 30 Oe in Sample B. It can be presumed that, in a structure like Sample A using a thin film of CoO as thin as 3 nm or less, magnetic characteristics are incomplete, coupling with NiFe is weak, and good soft magnetic characteristics are attained.

EXAMPLE 18

A film of 5Ta/5IrMn/2Cu/4CoFe/3Cu/2CoFe/10IRMn/5Ta was prepared by DC magnetron sputtering. The IrMn film was deposited under 5 mTorr of Ar gas at the rate of 0.2 nm/second. Through review of cross section TEM, unevenness at the boundary was as small as 0.5 nm or less in Ra, and very smooth film was obtained. MR ratio of the spin valve film was 9.1%, which is better than the value of the film without the IrMn base. In this manner, by making the IrMn or other magnetic metal base under the above-explained conditions, a very smooth film with a large electron reflection effect can be obtained. Similar effects were obtained also when using RhMn, RhRuMn, NiMn, FeMn, PtMn, and so on.

EXAMPLE 19

A film configured as 5Ta/20IrMn/2CoFe/3Cu/4CoFe/2NiCr/5(NiCr)O/5Ta was prepared by DC magnetron sputtering. After stacking 5Ta/20IrMn/2CoFe/3Cu/4CoFe/7NiCr, radical oxygen treatment was conducted to oxidize the NiCr layer to the depth of 5 nm. the Through review of cross section TEM, the boundary between the oxidized $Ni_{0.8}Cr_{0.2}$ layer and the $Ni_{0.8}Cr_{0.2}$ layer was confirmed to be smooth approximately in the level of a monolayer.

MR ratio of this film was 9.5%. That is, very large MR ratio was obtained regardless that the shunt diversion by a film not contributing to magnetoresistance effect is larger than Example 17, for example, probably because mirror-reflection effect by the smoothed boundary between the reflecting film and the free layer prominently appeared. Furthermore, since $Ni_{0.8}Cr_{0.2}$ is non-magnetic, it broke magnetic coupling with the oxide, and could establish good soft magnetic characteristics. Radical treatment makes the surface under oxidization very smooth, and it is effective for making the electron mirror-reflection film. It promises substantially the same effects also when using non-magnetic metals other than those actually used here.

As examples where an oxide exhibits anti-ferromagnetism and ferrimagnetism, further made were a structure of 5Ta/20IrMn/2CoFe/3Cu/4CoFe/2NiFe/3(NiFe)O/5Ta (sample C), and a structure of 5Ta/20IrMn/2CoFe/3Cu/4CoFe/2NiFe/10(NiFe)O/5Ta (sample D). MR ratio was 10% in Sample C and 10.3% in Sample D, which are satisfactory values. However, as to induced magnetic anisotropy, Sample C exhibited 10 Oe, but Sample D exhibited 30 Oe. Even when the oxide exhibits ferromagnetism, anti-ferromagnetism or ferrimagnetism, by limiting radical treatment within 3 nm, it is possible to made a magnetically incomplete film and to prevent deterioration of magnetic characteristics of the free layer by magnetic coupling. The same effects can be obtained also when applying radical treatment on any arbitrary alloy of Fe, Ni or Co.

EXAMPLES 20 TO 23

Structure of spin valve films as Examples 20 to 23 and Comparative samples A to D are shown in Table 4.

All of the samples were made on thermal oxide Si substrates by DC magnetron sputtering. Manufacturing methods of respective Examples are shown below.

After a 5.0 nm thick Ta film was made as a metal base film on a thermal oxide Si substrate, a 10.0 nm thick NiFe alloy film was stacked as a magnetic metal base layer. After the NiFe alloy film was made and transported to a boundary treatment chamber through a carrier chamber, $O_2$ radicals were irradiated onto the surface of the NiFe alloy film for 30 seconds to make a boundary-reformed layer. In this process, for the purpose of extracting only radicals, boundary reforming treatment was conducted by extracting radicals exclusively using a gas flow produced by a pressure difference between the plasma source and the chamber. A distance of approximately 20 cm was placed between the radical generating source and the substrate.

Immediately after the boundary reforming treatment, the film surface was analyzed by XPS and X-ray diffraction. As a result, a layer containing oxides, namely, $Fe_2O_3$, $Fe_3O_4$ and NiO. Its average thickness was approximately 2.0 nm, and Ra was 0.2 nm as a result of review of the aspect of the boundary-reformed layer by AFM and cross section TEM.

After that, sequentially formed on the surface-reformed NiFe alloy layer were a 3.0 nm thick CoFe alloy film as a first ferromagnetic material, 0.3 nm thick Cu film as a non-magnetic intermediate layer, 2.0 nm thick CoFe alloy film as a second magnetic layer, 10.0 nm thick IrMn alloy film as an anti-ferromagnetic film, and 5.0 nm thick Ta film as a protective coat to form a spin valve film. After the process of making films, chemically coupled aspect at the boundary between the NiFe alloy film and the CoFe alloy film was investigated by XPS. As a result, the film was confirmed to also contain Co oxides including CoO as its major component in addition to Fe and Ni oxides mentioned above.

In Example 21, after conducting radical treatment on NiFe in the same manner as Example 20, another NiFe alloy film of 20 nm was made as a barrier layer. Example 22 had the same film structure as those of Example 21, but it was processed by using ozone. In Example 23, NiO as the anti-ferromagnetic film was made by sputtering while irradiating radicals. Additionally, the same treatment as Example 20 by oxygen radicals was applied onto the NiFe alloy film.

As Comparative sample A for comparison with the invention, a spin valve film was prepared by the same process as that of Example 20 except that, after the NiFe alloy film was made, without applying boundary reforming treatment on its surface, all layers were made within the vacuum chamber after the NiFe alloy film was made.

As Comparative sample B for comparison with the invention, a diffusion preventing/electron reflecting layer was made by making the NiFe alloy film and thereafter applying boundary oxidizing treatment onto its surface by irradiating argon gas mixed with 20% of oxygen for 60 seconds. After that, in the same process as that of Example 20, a spin valve was prepared. Immediately after the boundary reforming treatment, its average surface roughness was confirmed by AFM to be approximately 0.5 nm.

As Comparative sample C for comparison with the invention, a pin valve film was prepared having the same film structure as that of Example 21, by conducting boundary oxidizing treatment using the same argon-oxygen mixed gas as used for Comparative sample B instead of oxygen radical treatment.

As Comparative sample D for comparison with the invention, a diffusion preventing/electron reflecting layer was made by making the NiFe alloy film and thereafter applying boundary oxidizing treatment onto its surface in oxygen plasma for 30 seconds. In this process, a voltage was applied to the substrate side. Immediately after the boundary reforming treatment, its average surface roughness was confirmed by AFM to be approximately 2.5 nm.

The spin valve multi-layered films as Examples and Comparative samples introduced above were annealed at 250 degrees in centigrade after patterning. MR ratios of MR elements thus obtained were measured before annealing, and one hour, five hours, 10 hours, 50 hours and 100 hours later than annealing. Its result is sown in Table 5.

As understood from Table 5, in case of Comparative sample C prepared by continuously stacking films without boundary reforming treatment, its as-deposited MR ratio was a favorable value, 6.5%, but one hour later after annealing, MR ratio decreased significantly. Thereafter, also, as time passed after annealing, MR ratio continued to decrease. It is assumed that, because no boundary-reformed layer for preventing thermal diffusion of atoms was made at the boundary between NiFe and CoFe, atomic diffusion promoted, and MR ratio decreased.

In case of Comparative samples B and C, their as-deposited MR ratios are as large as approximately 7.5%. However, when they were annealed for a long time, their MR ratios began to deteriorate from around 50 hours later. It is assumed that, because of uneven thickness of the boundary-reformed layer, the boundary-reformed layer having the role of preventing atomic diffusion began to deteriorate during long-time annealing. That is, part of the reforming treatment at the NiFe surface probably progressed as physical adsorption instead of chemical adsorption, and it caused deterioration by annealing.

In Example D, a boundary-reformed layer was additionally made by applying boundary reforming treatment at the boundary between NiFe and CoFe by using a plasma flow containing ions. In this case, it was confirmed that, although deterioration of its post-annealing MR was small, its pre-annealing MR ratio was much smaller than those of Examples. It is assumed that an increase of average surface roughness of NiF caused by collision of ions contained in the plasma flow decreased the orientation of the CoFe layer. This is assumed also from the fact that coercive force of the NiFe and CoFe layers was 3 Oe, which shows deterioration in soft magnetic characteristics.

In contrast, in the Example of the invention including the diffusion preventing/electron reflecting layer and in the Example using the NiO anti-ferromagnetic film made by radical irradiation, MR ratios did not deteriorate even after annealing. It is assumed that, because the diffusion preventing/electron reflecting layer made by oxygen radicals was formed by chemical adsorption of oxygen, the diffusion preventing/electron reflecting layer did not deteriorate, and a soft surface reforming effect by radicals successfully reduced the surface roughness. Thus, the MR element made by the manufacturing method according to the invention was confirmed to have excellent heat resistance and high performance.

EXAMPLE 24

Next made was a spin valve film in the same manner as explained above. After a 5.0 nm thick Ta film was made as a metal base layer on a thermal oxide Si substrate by DC magnetron sputtering, a 10.0 nm thick NiFe alloy film was made as a magnetic metal base layer.

After the NiFe alloy film was made and transported to a boundary treatment chamber through a carrier chamber, $N_2$ radicals were irradiated onto the surface of the NiFe alloy film for 60 seconds to form a diffusion preventing/electron reflecting layer. In this process, for the purpose of extracting only radicals, radical treatment was conducted by extracting radicals exclusively using a gas flow produced by a pressure difference between the plasma source and the chamber like Example 20. A distance of approximately 20 cm was placed between the radical generating source and the substrate.

Immediately after the radical treatment, the diffusion preventing/electron reflecting layer on the surface of the NiFe alloy film was made up of magnetic or non-magnetic Ni and Fe nitrides containing FeN, $Fe_3N$ and NiN as a result of measurement by XPS. Average thickness was approximately 1.5 nm, and average surface roughness was 0.5 nm as a result of review of the aspect of the diffusion preventing/electron reflecting layer by AFM and cross section TEM.

After that, sequentially formed on the surface-reformed NiFe alloy layer were a 3.0 nm thick CoFe alloy film as a first ferromagnetic material, 0.3 nm thick Cu film as a non-magnetic intermediate layer, 2.0 nm thick CoFe alloy film as a second magnetic layer, 10.0 nm thick IrMn alloy film as an anti-ferromagnetic film, and 5.0 nm thick Ta film as a protective coat to form a spin valve film. After the process of making films, chemically coupled aspect at the boundary between the NiFe alloy film and the CoFe alloy film was investigated by XPS. As a result, the film was confirmed to also contain Co oxides including CoO as its major component in addition to Fe and Ni oxides mentioned above.

After that, sequentially formed on the NiFe alloy layer after radical treatment on its surface were a 3.0 nm thick CoFe alloy film as a first ferromagnetic material, 0.3 nm thick Cu film as a non-magnetic intermediate layer, 2.0 nm thick CoFe alloy film as a second magnetic layer, 10.0 nm thick IrMn alloy film as an anti-ferromagnetic film, and 5.0 nm thick Ta film as a protective coat to form a spin valve film. After the process of making films, chemically coupled aspect at the boundary between the NiFe alloy film and the CoFe alloy film was investigated by XPS. As a result, the film was confirmed to also contain Co oxides in addition to Fe and Ni oxides mentioned above.

As Comparative sample E for comparison with the invention, after a NiFe alloy film was made, nitriding treatment was applied to its surface by irradiating a $N_2$ gas. After that, a spin valve was made in the same manner as Example 10. As a result of measurement by AFM after the nitriding treatment, average surface roughness of the diffusion preventing/electron reflecting layer was approximately 0.3 nm.

As Comparative sample F for comparison with the invention, after a NiFe alloy film was made, plasma treatment was applied to its surface by irradiating a $N_2$ plasma flow containing ions. In this process, the plasma flow was drawn by applying a voltage to the substrate side. As a result of measurement by AFM after the plasma treatment, average surface roughness of the diffusion preventing/electron reflecting layer was approximately 3.5 nm. After that, a spin valve was made in the same manner as Example 24.

Thereafter, these spin valve films were annealed like Example 20 after patterning. A result of measurement of changes in MR ratio is shown in Table 6.

As noted from Table 6, as-deposited MR ratio of Comparative sample E is as large as approximately 7.0%. However, when it was annealed for a long time, it exhibited MR-deteriorating behaviors. It is assumed that the diffusion preventing/electron reflecting layer is not formed sufficiently by irradiation of $N_2$ gas alone because $N_2$ gas is not active.

In comparative sample F, plasma treatment was applied to the boundary between NiFe and CoFe by using a $N_2$ plasma flow containing ions to form the diffusion preventing/electron reflecting layer. In this case, initial MR ratio is extremely small. It is assumed that orientation of the CoFe layer decreased due to an increase of average surface roughness of NiFe caused by collision of ions contained in the plasma flow. This is assumed also from the fact that coercive force of the NiFe and CoFe layers was as large as 4.5 Oe, which shows deterioration in soft magnetic characteristics. Furthermore, MR deterioration after annealing for one hour exhibited the same tendency as continuous films shown by Comparative sample A. Here is assumed that, because the etching effect exceeded the boundary reforming effect, the process failed to form the diffusion preventing/electron reflecting layer effective enough to prevent atomic diffusion.

In contrast, in Example 24 of the invention including the diffusion preventing/electron reflecting layer made by treating the boundary between NiFe and CoFe by $N_2$ radicals, MR ratio did not deteriorate substantially even after annealing. It is assumed that, because the diffusion preventing/electron reflecting layer made by nitrogen radicals was formed by chemical adsorption of nitrogen radicals, surface roughness of the diffusion preventing/electron reflecting layer was successfully reduced. As these data show, when the manufacturing method according to the invention is used, $N_2$ radicals are also effective, and contribute to fabrication of a MR element with excellent heat resistance a d high performance.

EXAMPLE 25

Ta5/NiFe2/IrMn7/CoFe1/CoFeO1/CoFe2/Cu2/CoFe2/Cu1/CuTaO 1/Ta2 was made on s thermal oxide silicon substrate by magnetron sputtering. Oxide layers were made by radical irradiation or oxygen flow. In case of oxygen flow, MR ratio of 15% was obtained. In a sample made by radical irradiation, MR ratio was 17%.

EXAMPLE 26

Ta5/Ru1.5/Cu1/CoFeO1/Cu1/CoFe2/Cu2/CoFe2/CoFeO1/CoFe1.5/IrMn7/Ta5 was made on a thermal oxide silicon substrate by magnetron sputtering. Oxide layers were made by radical irradiation. MR was 18%. By processing the structure into a stripe of 1 micrometer and fixing its pin layer in the width direction of the stripe, an element in which a hard film bias was applied in the lengthwise direction of the free layer was prepared. As a result of measurement of changes in bias point of perpendicularly-intersecting magnetized orientation responsive to a sense current, the current magnetic field applied to the free layer was confirmed to be not larger than 2 Oe/mA.

EXAMPLE 27

Ta3/Ru1.5/Cu1/CoFeO1/Cu1/NiFe2/Co1/Cu2/Co2/CoO1/Co1/Ru 0.9/CoCr3/PtMn10/Ta5 was made on an AlTiC substrate by magnetron sputtering. Oxide layers were made by radical irradiation. MR was 17%. The structure was processed into a micro pattern, and its bias point was measured. As a result, good perpendicularly intersecting magnetized orientation was confirmed. When it was processed into a head, noiseless output was noted.

EXAMPLE 28

Ta3/Ru2/PtMn10/CoFeCr2.5/Ru0.9/CoFe1/CoFeO1/CoFe2/Cu2/CoFe1/NiFe2/Cu0.5/CoTaO1/Ta2 was made on an AlTiC substrate by magnetron sputtering. Oxide films were made by radical irradiation. MR was 17%. The structure was processed into a micro pattern, and its bias point was measured. As a result, good perpendicularly intersecting magnetized orientation was confirmed. When it was processed into a head, noiseless output was obtained.

EXAMPLE 29

Ta5/NiFe2/PtMn10/CoFe1/NiO5/CoFe2/Cu2/CoFe2/Cu1/CuTaO1/Ta2 was made on a thermal oxide silicon substrate by magnetron sputtering. NiO was made by reactive sputtering. MR was 18%. Stable unidirectional anisotropy of 800 Oe was obtained.

EXAMPLE 30

Ta5/NiFe2/PtMn10/CoFe1/Al$_2$O$_3$1/CoFe2/Cu2/CoFe2/Cu1/CuTaO 1/Ta2 was made on a thermal oxide silicon substrate by magnetron sputtering. Al$_2$O$_3$ was made by radical treatment. MR was 18%. Stable unidirectional anisotropy of 800 Oe was obtained.

EXAMPLE 31

Ta5/Ru1.5/Cu1/Al$_2$O$_3$1/Cu1/CoFe2/Cu2/CoFe2/Fe$_2$O$_3$3/CoFeCr1/PtMn10/Ta5 was made on a thermal oxide silicon substrate by magnetron sputtering. Al$_2$O$_3$ and Fe$_2$O$_3$ were made by radical treatment of Al and Fe. MR was 18%. Stable unidirectional anisotropy of 800 Oe was obtained.

Finally explained is a magnetic recording apparatus using the magnetoresistance effect element according to the invention.

Any of the magnetoresistance effect elements according to the above-explained embodiments is incorporated into a record/reproduce integral-type magnetic head, and assembled in a magnetic recording apparatus, for example.

Figure 55:
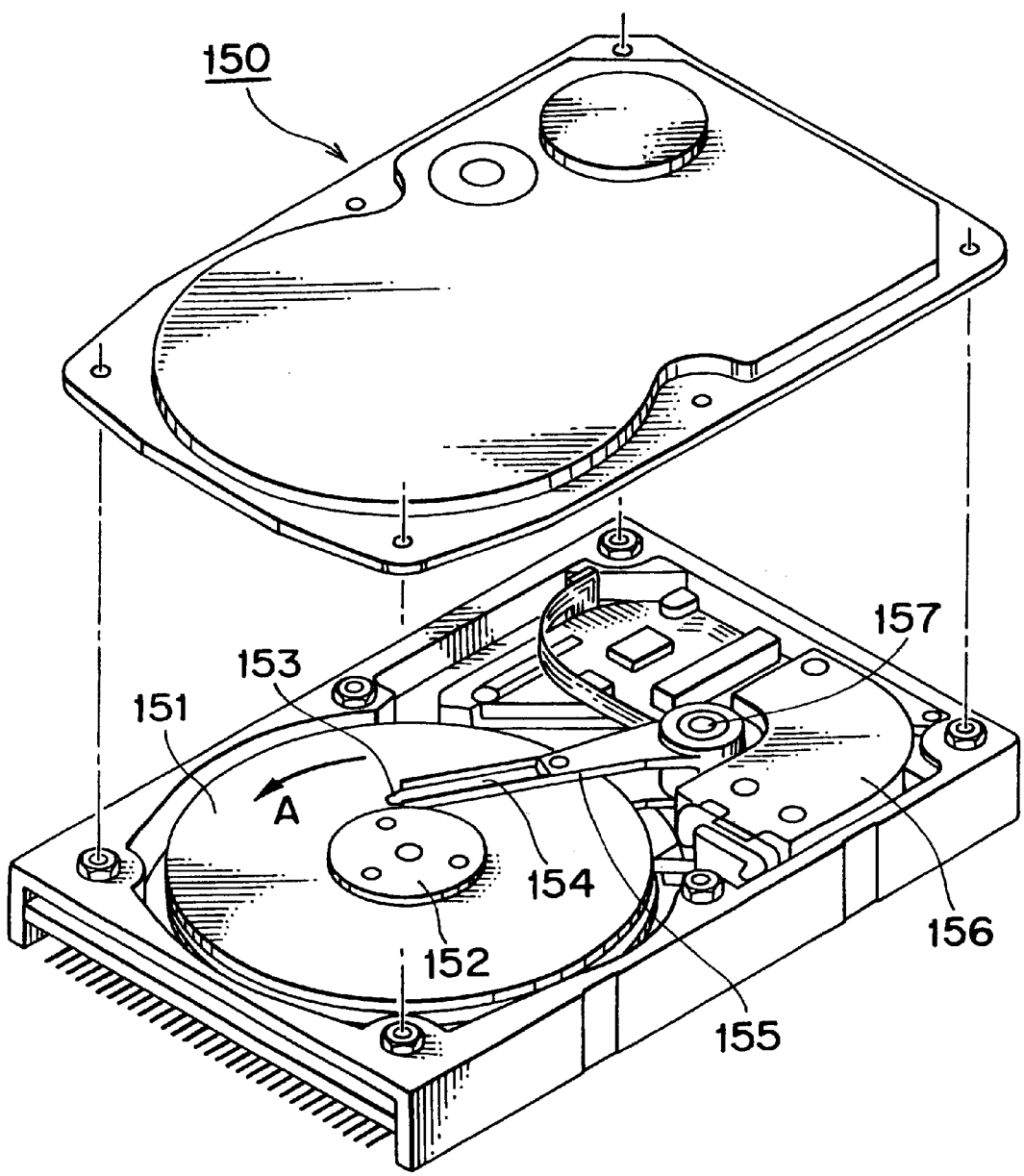
FIG. 55 is a perspective view schematically showing construction of a central part of a magnetic recording apparatus using the magnetoresistance effect element of the invention.

FIG. 55 is a perspective view schematically showing construction of a central part of a magnetic recording apparatus of this type. The magnetic recording apparatus 150 according to the invention is of a type using a rotary actuator. In FIG. 53, a magnetic disk 151 is set on a spindle 152, and rotated by a motor (not shown) in response to a control signal from a drive device controller (not shown). A head slider 153 is attached to the distal end of a thin-film-shaped suspension 154 to record and reproduce information while the magnetic disk 151 floats above. The head slider 153 is equipped with any one of magnetoresistance effect elements according to the embodiments as a part of the magnetic head.

When the magnetic disk 151 rotates, the medium-faced surface of the head slider 153 is held distant above the surface of the magnetic disk 151 by a predetermined float amount.

The suspension 154 is connected to one end of an actuator arm 155 having a bobbin portion for holding a drive coil (not shown). Provided at the other end of the actuator arm 155 is a voice coil motor 156, a kind of linear motors. The voice coil motor 156 is made up of a drive coil (not shown) wound onto the bobbin portion of the actuator arm 155 and a magnetic circuit including a permanent magnet and an opposed yoke which are located at opposite sides of the coil to sandwich it therebetween.

The actuator arm 155 is supported by ball bearings (not shown) provided at upper and lower two positions of a fixed shaft 157 so as to be freely rotated and slide by the voice coil motor 156.

According to the invention, by employing any of the magnetoresistance effect element according to the above-explained embodiments as a central part of a magnetic head, a magnetic recording apparatus with a high recording density and remarkably stable in record/reproduce characteristics can be realized.

Furthermore, according to the invention, a large reproduce output signal and a good thermal stability can be obtained. As a result of it, changes in reproduce output with time can be overcome. Additionally, resistance to ESD (electrostatic discharge) possibly applied upon assembling can be improved, and the assembling yield is improved.

These and other effects enable realization of narrower tracks and lower element heights, and hence realization of a magnetic recording apparatus available for high-density magnetic recording.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No.H10-72822 filed on Mar. 20, 1998 and No.H10-185481 filed on Jun. 30, 1998 including specifications, claims, drawings and summarys is incorporated herein by reference in its entirety.

TABLE 1

| type | A | A | A | B | B | A | A | A | A | C | C |
|---|---|---|---|---|---|---|---|---|---|---|---|
| thickness of the Crystal growth controlling layer (nm) | 0.2 | 0.5 | 0.8 | 1.5 | 2.8 | 0.5 | 1.0 | 1.4 | 0.8 | 0.8 | 1.5 |
| boundary roughness between the functional layer and the crystal growth controlling layer (nm) | 2.4 | 1.0 | ~1.0 | ~1.0 | ~1.0 | 2.4 | 1.8 | 1.3 | ~1.0 | 1.6 | ~1.0 |
| boundary roughness between the base crystal layer and the crystal growth controlling layer (nm) | 2.6 | 1.8 | 1.7 | 1.0 | 1.0 | 3.0 | 2.8 | 2.8 | 1.8 | 1.3 | 1.4 |

TABLE 1-continued

| type | A | A | A | B | B | A | A | A | A | C | C |
|---|---|---|---|---|---|---|---|---|---|---|---|
| thickness of the base crystal layer (nm) | ~2 | ~2 | ~2 | ~1 | ~1 | ~2 | ~2 | ~2 | ~2 | ~10 | ~10 |
| grain size of the Functional layer (width of the columnar crystal) (nm) | 15–50 | 10–20 | 10–20 | 10–25 | 15–50 | 15–40 | 10–35 | 10–25 | 10–20 | 10–35 | 8–20 |
| buffer layer (a-CoZrNb) exists? | ○ | ○ | ○ | ○ | ○ | ○ | ○ | ○ | ○ | x | x |
| buffer layer (Ta) Exists? | x | x | x | ○ | ○ | x | x | x | ○ | ○ | ○ |
| rate of deterioration of MR ratio (MR ratio (270 degrees, 1 h)/MR ratio (as-depo.)) | 0.83 | 0.97 | 0.99 | 0.97 | 0.86 | 0.85 | 0.88 | 1.03 | 0.99 | 0.88 | 0.96 |
| Thermal stability | x | ○ | ○ | ○ | x | x | x | ○ | ○ | x | ○ |
| Cf. | Comparative Sample 5 | Example 4 | Example 8 | | Comparative Sample 6 | | | Example 9 | Example 10 | | Example 12 |

TABLE 2

| | MR ratio (%) | | After annealing | |
|---|---|---|---|---|
| | as-depo. | after annealing | induced magnetic anisotropy (Oe) | magnetic distortion (ppm) |
| Example 1 | | | | |
| Sample 1 | 7.77 | 7.50 | 8 | 0.8 |
| Sample 2 | 8.10 | 7.80 | — | — |
| Comparative Sample 1 | | | | |
| Sample 3 | 7.79 | 7.60 | 18 | 2.2 |
| Sample 4 | 7.60 | 5.36 | — | — |

TABLE 3

| base | MR ratio (%) | Hk (Oe) | Magnetic distortion (ppm) | MR ratio (after annealing) (%) |
|---|---|---|---|---|
| Example 3 | | | | |
| NiO | 10.1 | 50 | 2 | 11 |
| NiO + Cu | 9.7 | 8 | 0.7 | 9.5 |
| $Fe_2O_3$ | 10.5 | 4.5 | 4 | 10 |
| $Fe_3O_4$ + Cu | 9.5 | 9 | 0.8 | 9.5 |

TABLE 4 structure of spin valve films (nm)

| | |
|---|---|
| Example 20 | Ta5/$Ni_{80}Fe_{20}$10/O*/$Co_{90}Fe_{10}$3/Cu3/$Co_{90}Fe_{10}$2/IrMn7/Ta5 |
| Example 21 | Ta5/$Ni_{80}Fe_{20}$6/O*/$Ni_{80}Fe_{20}$2/$Co_{90}Fe_{10}$2/Cu3/$Co_{90}Fe_{10}$2/$IrMn_{10}$/Ta5 |
| Example 22 | Ta5/$Ni_{80}Fe_{20}$6/$O_3$/$Ni_{80}Fe_{20}$2/$Co_{90}Fe_{10}$3/Cu3/$Co_{90}Fe_{10}$2/$IrMn_{10}$/Ta5 |
| Example 23 | Ta5/NiO10 ($O_2$-depo.)/$Co_{90}Fe_{10}$2/Cu3/$C0_{90}Fe_{10}$3/$Ni_{80}Fe_{20}$5/O*/Ta5 |
| Comparative Example A | Ta5/$Ni_{80}Fe_{20}$10/$Co_{90}Fe_{10}$3/Cu3/$Co_{90}Fe_{10}$2/IrMn7/Ta5 |
| Comparative Example B | Ta5/$Ni_{80}Fe_{20}$10/$O_2$-flow/$Co_{90}Fe_{10}$3/Cu3/$Co_{90}Fe_{10}$2/IrMn7/Ta5 |
| Comparative Example C | Ta5/$Ni_{80}Fe_{20}$6/$O_2$-flow/$Ni_{80}Fe_{20}$2/$Co_{90}Fe_{10}$2/Cu3/$Co_{90}Fe_{10}$2/IrMn10/Ta5 |
| Comparative Example D | Ta5/$Ni_{80}Fe_{20}$10/$O_2$-plasma/$Co_{90}Fe_{10}$3/Cu3/$Co_{90}Fe_{10}$2/IrMn7/Ta5 |

O*—oxygen radical treatment
$O_2$-flow—oxygen introduction treatment
$O_3$—ozone treatment
$O_2$-plasma—oxygen plasma treatment
$O_2$-depo.—O* irradiating deposition

TABLE 5

| | MR ratio (%) | | | | | |
|---|---|---|---|---|---|---|
| annealing time | 0 (as-depo.) | 1 | 5 | 10 | 50 | 100 |
| Example 20 | 7.79 | 7.6 | 7.5 | 7.5 | 7.5 | 7.5 |
| Example 21 | 7.77 | 7.5 | 7.5 | 7.4 | 7.4 | 7.4 |
| Example 22 | 7.74 | 7.4 | 7.4 | 7.4 | 7.3 | 7.3 |
| Example 23 | 7.81 | 7.6 | 7.5 | 7.5 | 7.5 | 7.4 |
| Comparative Example A | 6.5 | 5.1 | 5.0 | 5.0 | 4.9 | 4.8 |
| Comparative Example B | 7.54 | 7.2 | 7.1 | 6.8 | 6.0 | 5.5 |
| Comparative Example C | 7.64 | 7.5 | 7.3 | 7.0 | 6.2 | 5.5 |
| Comparative Example D | 6.8 | 5.1 | 5.0 | 4.8 | 4.5 | 4.0 |

TABLE 6

| | MR ratio (%) | | | | | |
|---|---|---|---|---|---|---|
| annealing time | 0 (as-depo.) | 1 | 5 | 10 | 50 | 100 |
| Example 24 | 7.0 | 7.2 | 7.2 | 7.2 | 7.2 | 7.2 |
| Comparative Example E | 7.0 | 5.5 | 5.0 | 4.8 | 4.5 | 4.0 |
| Comparative Example F | 4.1 | 5.6 | 5.1 | 4.7 | 4.5 | 4.2 |

What is claimed is:

1. A magnetoresistance effect element comprising a first magnetic layer, a non-magnetic intermediate layer, a second magnetic layer, and a metal anti-ferromagnetic layer, laminated in that order, wherein the first magnetic layer is susceptible to magnetization by an external magnetic field and the second magnetic layer is substantially pinned in magnetization by the metal anti-ferromagnetic layer, and further wherein the second magnetic layer comprises a laminated structure comprising at least three layers wherein at least one of the layers is an electron reflecting layer made of $CrO_2$ or $Cr_2O_3$.

2. A magnetic head comprising a magnetoresistance effect element including a fourth layer, a metal barrier layer, a first magnetic layer, a non-magnetic intermediate layer, and a second magnetic layer, laminated in that order, wherein the first magnetic layer is susceptible to magnetization by an external magnetic field, the second magnetic layer is substantially pinned in magnetization, and the fourth layer comprises at least one selected from oxides, nitrides, carbides, fluorides, chlorides, sulfides and borides.

3. A magnetic head comprising a magnetoresistance effect element including a first magnetic layer, a non-magnetic intermediate layer, a second magnetic layer, and a metal anti-ferromagnetic layer, laminated in that order, wherein the first magnetic layer is susceptible to magnetization by an external magnetic field and the second magnetic layer is substantially pinned in magnetization by the metal anti-ferromagnetic layer, and further wherein the second magnetic layer is a laminated structure comprising at least three layers wherein at least one of the layers comprises at least one selected from oxides, nitrides, carbides, fluorides, chlorides, sulfides and borides.

4. A magnetic disk apparatus comprising a disk driver driving a magnetic disk, and a magnetic head comprising a magnetoresistance effect element sensing a signal magnetic field from the magnetic disk, the magnetoresistance effect element including a fourth layer, a metal barrier layer, a first magnetic layer, a non-magnetic intermediate layer, and a second magnetic layer, laminated in that order, wherein the first magnetic layer is susceptible to magnetization by an external magnetic field, the second magnetic layer is substantially pinned in magnetization, and the fourth layer comprises at least one selected from oxides, nitrides, carbides, fluorides, chlorides, sulfides and borides.

5. A magnetic disk apparatus comprising a disk driver driving a magnetic disk, and a magnetic head comprising a magnetoresistance effect element sensing a signal magnetic field from the magnetic disk, the magnetoresistance effect element including a first magnetic layer, a non-magnetic intermediate layer, a second magnetic layer, and a metal anti-ferromagnetic layer, laminated in that order, wherein the first magnetic layer is susceptible to magnetization by an external magnetic field and the second magnetic layer is substantially pinned in magnetization by the metal anti-ferromagnetic layer, and further wherein the second magnetic layer is a laminated structure comprising at least three layers wherein at least one of the layers comprises at least one selected from oxides, nitrides, carbides, fluorides, chlorides, sulfides and borides.

6. A method for manufacturing a magnetoresistance effect element including a laminated core structure comprising a first magnetic layer, a non-magnetic intermediate layer, and a second magnetic layer, laminated in that order, wherein the first magnetic layer is susceptible to magnetization by an external magnetic field, and the second magnetic layer is substantially pinned in magnetization; and further wherein an electron reflecting layer including a metal compound is formed on at least one surface of the core structure, the method comprising:

forming the other layers except the electron reflecting layer in a first chamber; and forming the electron reflecting layer while being irradiated with at least one of radicals, ozone and light in a second chamber different from the first chamber.

7. A fabricating apparatus for manufacturing a magnetoresistance effect element including a laminated core structure comprising a first magnetic layer, a non-magnetic intermediate layer, and a second magnetic layer, laminated in that order, wherein the first magnetic layer is susceptible to magnetization by an external magnetic field, and the second magnetic layer is substantially pinned in magnetization; and further wherein an electron reflecting layer including a metal compound is formed on at least one surface of the core structure, the fabricating apparatus comprising:

a first chamber in which the layers other than the electron reflecting layer are formed, and a second chamber in which the electron reflecting layer is formed while being irradiated with at least one of radicals, ozone and light.

8. A method for manufacturing a magnetoresistance effect element including a first magnetic layer, a non-magnetic intermediate layer, and a second magnetic layer, laminated in that order, wherein the first magnetic layer is susceptible to magnetization by an external magnetic field, and the second magnetic layer is substantially pinned in magnetization; and further wherein at least one of the first or second magnetic layer is a laminate structure comprising at least three layers wherein at least one layer is an electron reflecting layer including a metal compound, the method comprising:

forming the layers other than the electron reflecting layer in a first chamber, and forming the electron reflecting layer while being irradiated with at least one of radicals, ozone and light in a second chamber different from the first chamber.

9. A fabricating apparatus for manufacturing a magnetoresistance effect element including a first magnetic layer, a non-magnetic intermediate layer, and a second magnetic layer, laminated in that order, wherein the first magnetic layer is susceptible to magnetization by an external magnetic field, and the second magnetic layer is substantially pinned in magnetization; and further wherein at least one of the first or second magnetic layer is a laminate structure comprising at least three layers wherein at least one layer is an electron reflecting layer including a metal compound is formed on at least one core structure surface, the fabricating apparatus comprising:

a first chamber in which the layers other than the electron reflecting layer are formed, and a second chamber in which the electron reflecting layer is formed while being irradiated with at least one of radicals, ozone and light.

* * * * *